(12) United States Patent
Kidu et al.

(10) Patent No.: US 11,038,485 B2
(45) Date of Patent: Jun. 15, 2021

(54) CRYSTAL VIBRATION ELEMENT, AND CRYSTAL VIBRATOR EQUIPPED WITH CRYSTAL VIBRATION ELEMENT

(71) Applicant: Murata Manufacturing Co., Ltd., Nagaokakyo (JP)

(72) Inventors: Toru Kidu, Nagaokakyo (JP); Takashi Hase, Nagaokakyo (JP); Takeshi Kamada, Nagaokakyo (JP); Hiroaki Kaida, Nagaokakyo (JP); Shigeaki Sugimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 725 days.

(21) Appl. No.: 15/943,937

(22) Filed: Apr. 3, 2018

(65) Prior Publication Data

US 2018/0241372 A1 Aug. 23, 2018

Related U.S. Application Data

(63) Continuation of application No. PCT/JP2016/079920, filed on Oct. 7, 2016.

(30) Foreign Application Priority Data

Oct. 8, 2015 (JP) .............................. JP2015-200232
Apr. 27, 2016 (JP) .............................. JP2016-089765

(51) Int. Cl.
*H03H 9/19* (2006.01)
*H03H 9/05* (2006.01)
(Continued)

(52) U.S. Cl.
CPC ............... *H03H 9/19* (2013.01); *H01L 41/09* (2013.01); *H01L 41/18* (2013.01); *H01L 41/338* (2013.01);
(Continued)

(58) Field of Classification Search
CPC .... H03H 9/19; H03H 9/02062; H03H 9/0595; H03H 9/1021; H03H 9/1035;
(Continued)

(56) References Cited

U.S. PATENT DOCUMENTS 6,621,194 B1 * 9/2003 Sugimoto .......... H03H 9/02031
310/320
8,742,651 B2 6/2014 Mizusawa
(Continued)

FOREIGN PATENT DOCUMENTS

JP S51-86977 U 7/1976
JP S542092 A 1/1979
(Continued)

OTHER PUBLICATIONS

International Search Report issued for PCT/JP2016/079920, dated Dec. 27, 2016.
(Continued)

*Primary Examiner* — J. San Martin
(74) *Attorney, Agent, or Firm* — Arent Fox LLP

(57) ABSTRACT

A crystal vibration element that includes a crystal piece that has a prescribed crystal orientation, and a first direction and a second direction in a plan view thereof; and excitation electrodes that are respectively provided on front and rear surfaces of the crystal piece in order to excite a thickness shear vibration in the crystal piece upon application of an alternating electric field. A vibration distribution of the crystal piece has a vibration region that extends in a band-like shape in the second direction of the crystal piece and non-vibration regions that are adjacent to opposed sides of the vibration region in the first direction of the crystal piece.

11 Claims, 48 Drawing Sheets

(51) Int. Cl.
*H03H 9/10* (2006.01)
*H03H 9/02* (2006.01)
*H01L 41/18* (2006.01)
*H01L 41/338* (2013.01)
*H03H 9/13* (2006.01)
*H01L 41/09* (2006.01)

(52) U.S. Cl.
CPC ...... *H03H 9/02062* (2013.01); *H03H 9/0595* (2013.01); *H03H 9/1021* (2013.01); *H03H 9/1035* (2013.01); *H03H 9/131* (2013.01)

(58) Field of Classification Search
CPC .... H03H 9/131; H03H 9/02157; H01L 41/09; H01L 41/18; H01L 41/338
See application file for complete search history.

(56) References Cited

U.S. PATENT DOCUMENTS

| | | | |
|---|---|---|---|
| 9,948,275 B2 | 4/2018 | Il et al. | |
| 2004/0155305 A1* | 8/2004 | Okazaki | H03H 9/02157 257/414 |
| 2005/0200240 A1 | 9/2005 | Tanaka | |
| 2009/0108709 A1 | 4/2009 | Tsuchido | |
| 2010/0231094 A1 | 9/2010 | Kameda et al. | |
| 2011/0095657 A1 | 4/2011 | Yamashita et al. | |
| 2012/0126668 A1 | 5/2012 | Il et al. | |
| 2012/0169182 A1 | 7/2012 | Mizusawa et al. | |
| 2012/0280598 A1 | 11/2012 | Mizusawa | |
| 2013/0241358 A1 | 9/2013 | Mizusawa et al. | |
| 2013/0249353 A1* | 9/2013 | Naito | H03H 9/02023 310/367 |
| 2014/0042874 A1 | 2/2014 | Takahashi et al. | |
| 2014/0368089 A1 | 12/2014 | Omomo | |
| 2015/0180446 A1 | 6/2015 | Yamada et al. | |
| 2016/0211827 A1* | 7/2016 | Naito | H03B 5/32 |

FOREIGN PATENT DOCUMENTS

| | | |
|---|---|---|
| JP | S5494173 U | 7/1979 |
| JP | S56-77129 U | 6/1981 |
| JP | S56-36814 B2 | 8/1981 |
| JP | S60-160633 U | 10/1985 |
| JP | S61-147613 A | 7/1986 |
| JP | S63-221708 A | 9/1988 |
| JP | 2001-7677 A | 1/2001 |
| JP | 2009-44237 A | 2/2009 |
| JP | 4458203 B2 | 4/2010 |
| JP | 2011-151667 A | 8/2011 |
| JP | 2012235365 A | 11/2012 |
| JP | 2013031035 A | 2/2013 |
| JP | 2013-102472 A | 5/2013 |
| JP | 2013-192052 A | 9/2013 |
| JP | 2014036426 A | 2/2014 |

OTHER PUBLICATIONS

Written Opinion of the International Searching Authority issued for PCT/JP2016/079920, dated Dec. 27, 2016.

* cited by examiner

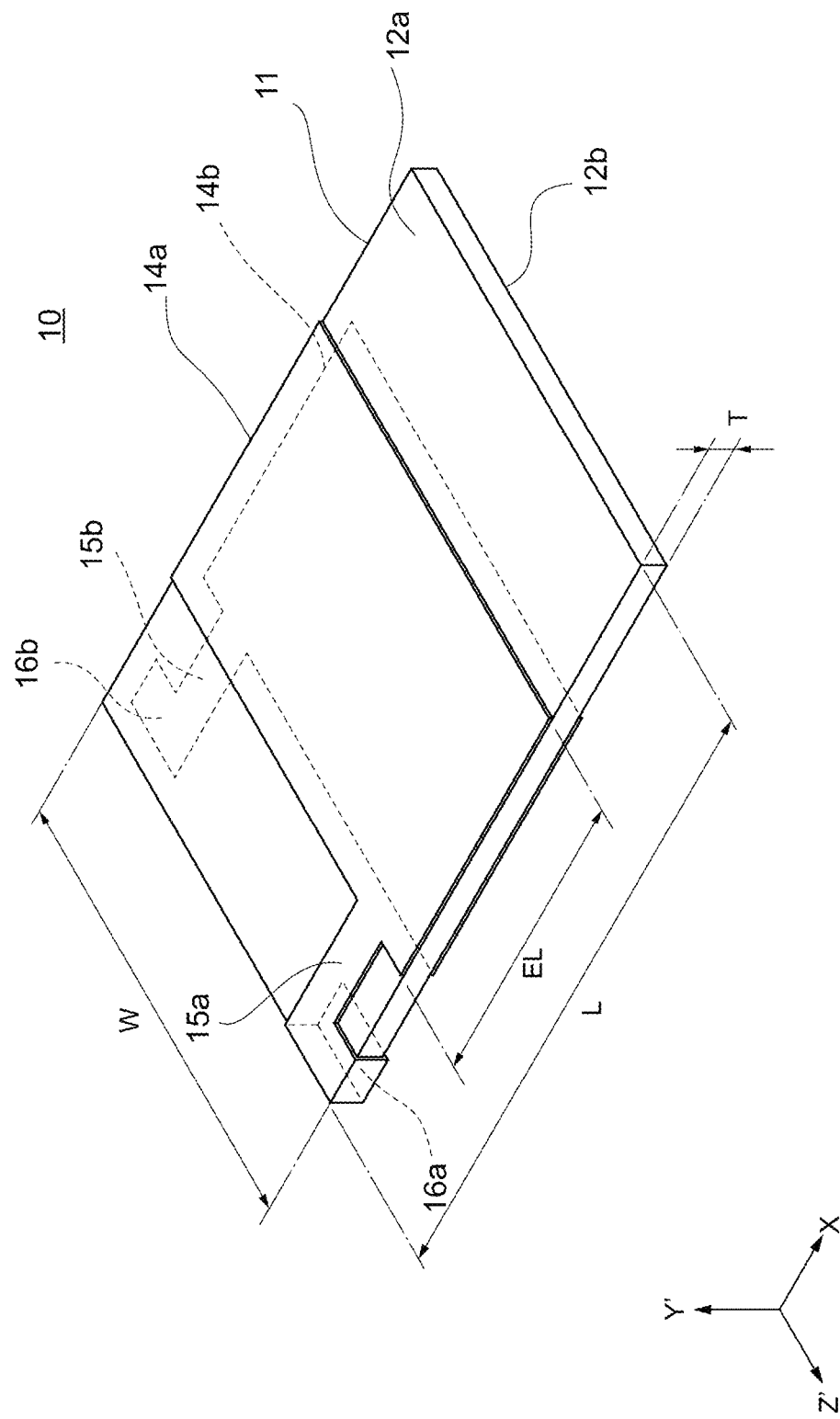

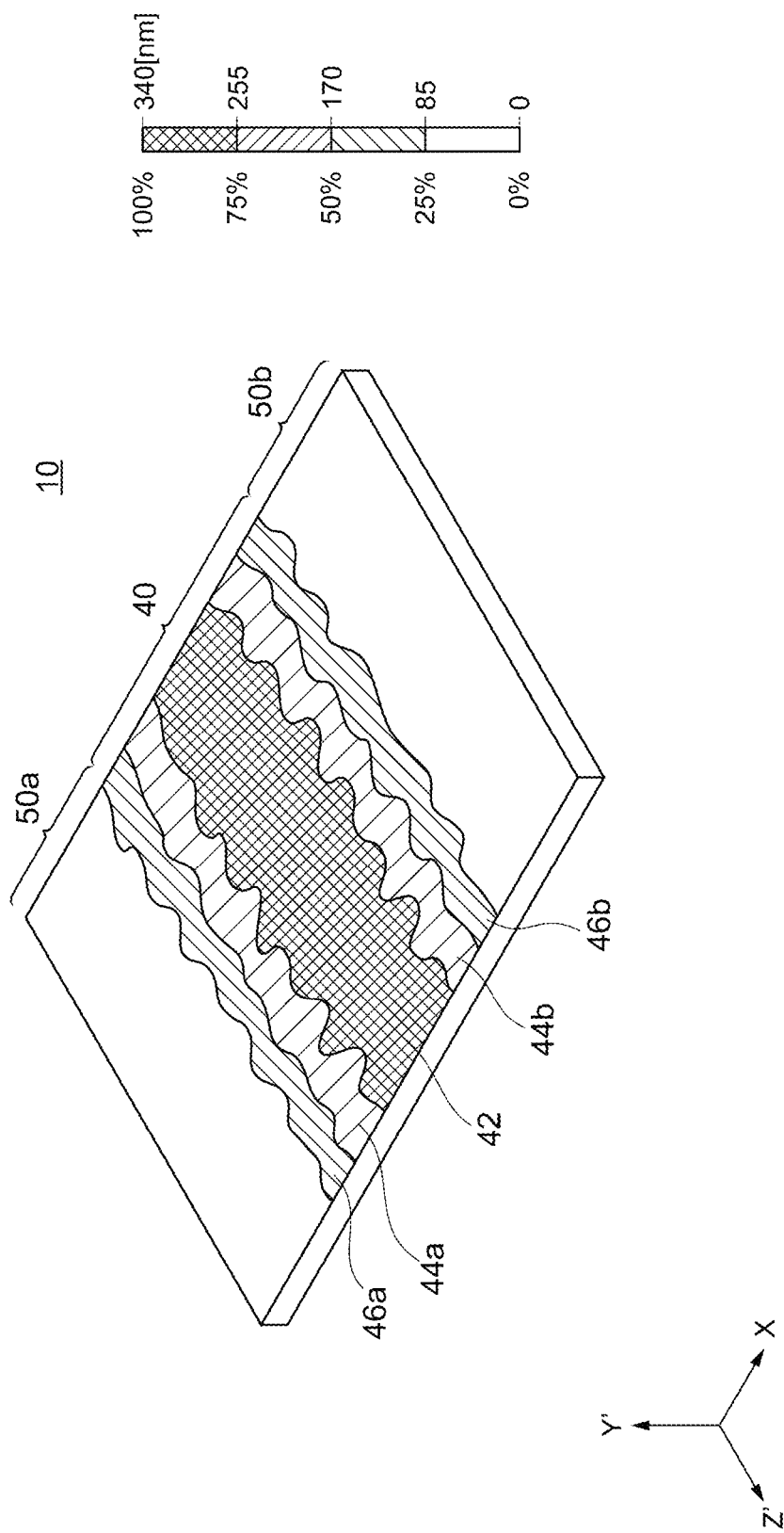

FIG. 4C
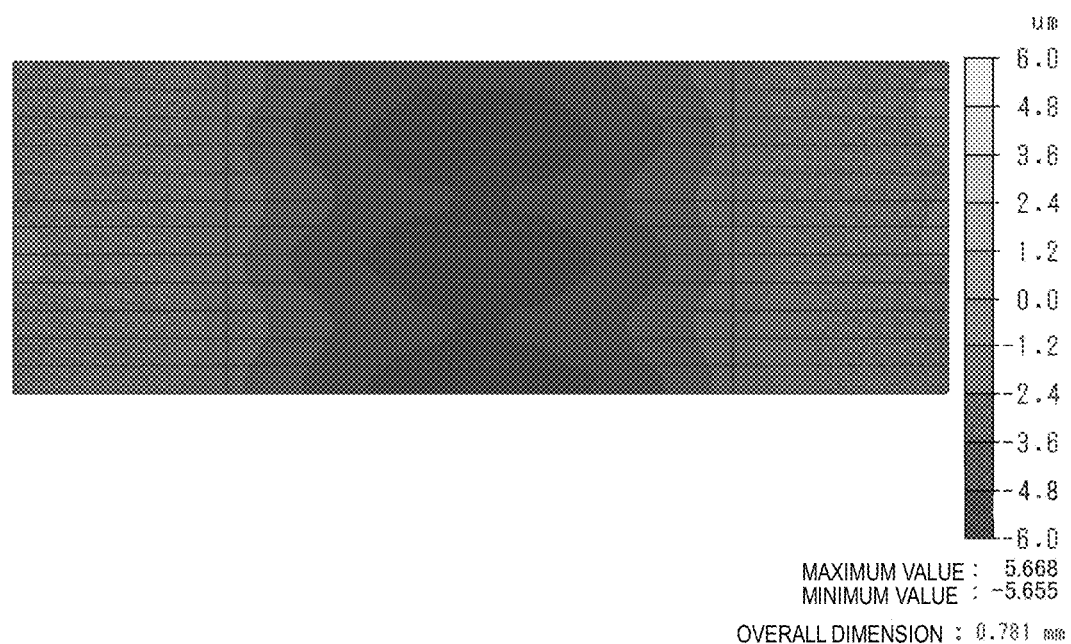
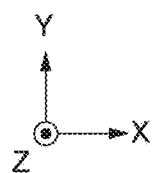

FIG. 11I
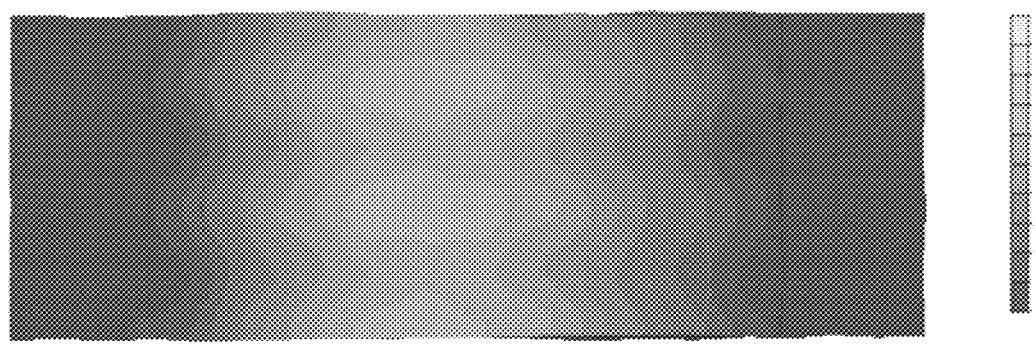
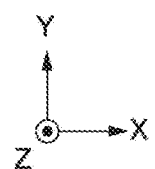

FIG. 11J
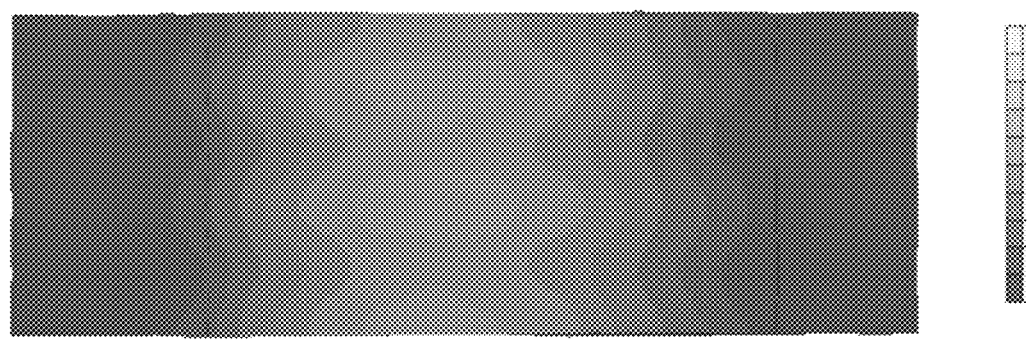
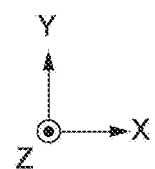

FIG. 11K
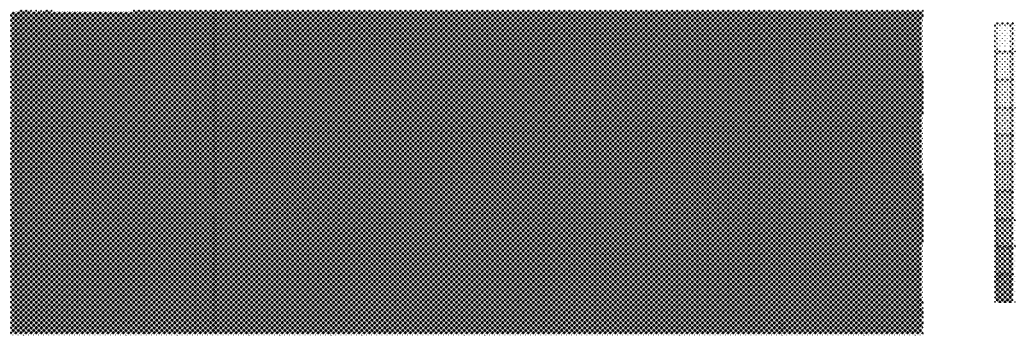
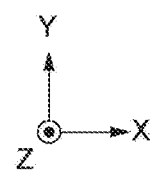

FIG. 11L
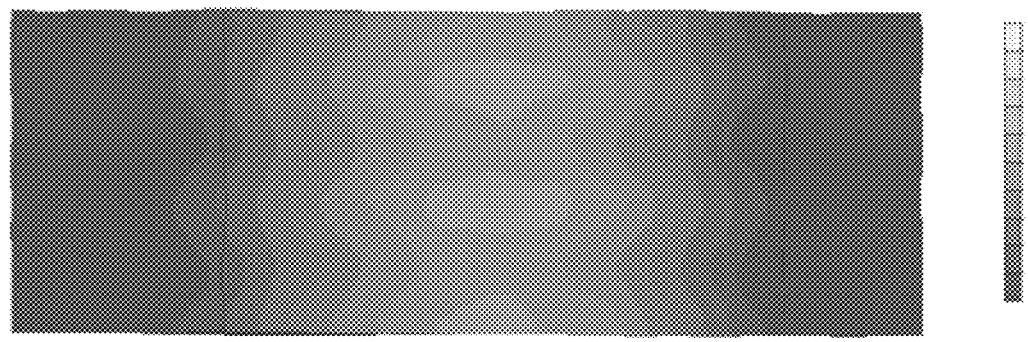
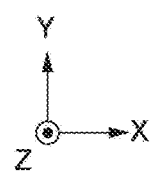

FIG. 11M
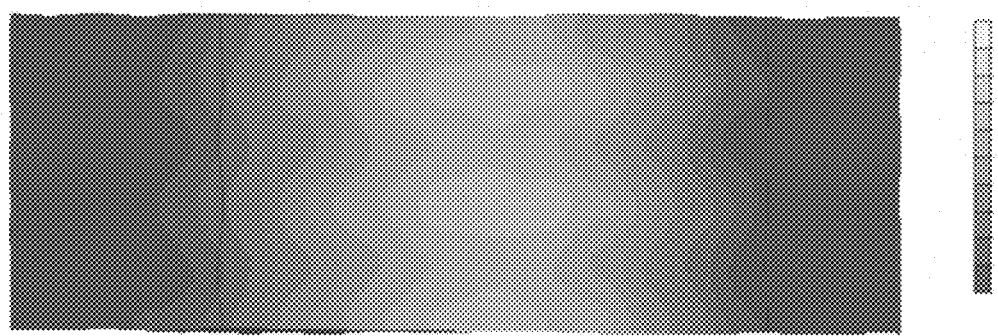
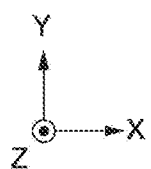

FIG. 11N
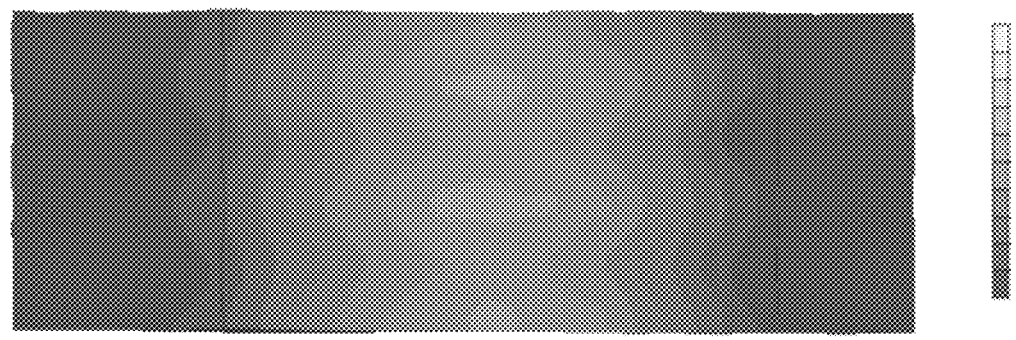
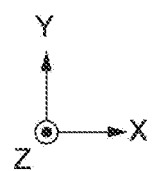

FIG. 11O
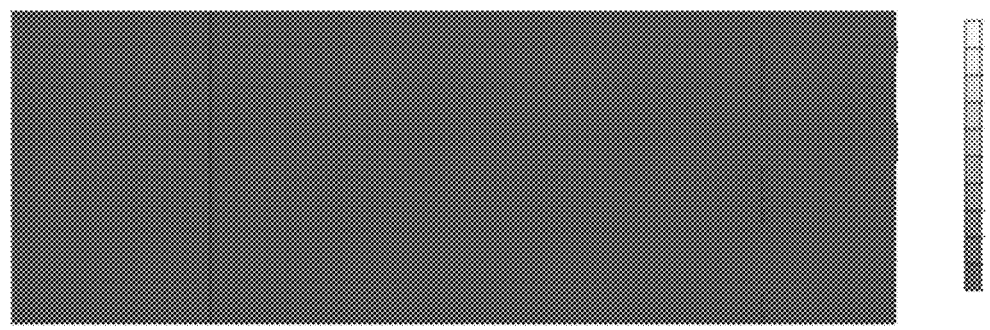
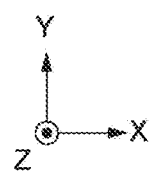

CRYSTAL VIBRATION ELEMENT, AND CRYSTAL VIBRATOR EQUIPPED WITH CRYSTAL VIBRATION ELEMENT

CROSS REFERENCE TO RELATED APPLICATIONS

The present application is a continuation of International application No. PCT/JP2016/079920, filed Oct. 7, 2016, which claims priority to Japanese Patent Application No. 2015-200232, filed Oct. 8, 2015, Japanese Patent Application No. 2016-059077, filed Mar. 23, 2016, and Japanese Patent Application No. 2016-089765, filed Apr. 27, 2016, the entire contents of each of which are incorporated herein by reference.

FIELD OF THE INVENTION

The present invention relates to a crystal vibration element and to a crystal vibrator.

BACKGROUND OF THE INVENTION

Crystal vibrators in which a thickness shear vibration is employed as a main vibration are widely used as the signal source of a reference signal used in oscillation devices, band pass filters and so on.

For example, Patent Document 1 discloses a piezoelectric vibration element that is held inside the sealed internal space of a holder and that is provided with excitation electrodes close to a central part of a piezoelectric plate. The vibration distribution of a thickness shear vibration in this piezoelectric vibration element spreads in the form of substantially concentric circles from a central part of the piezoelectric plate toward the outside of the piezoelectric plate, and the vibrational displacement of the piezoelectric plate becomes smaller, the closer the vibration is to the outside of the piezoelectric plate. Patent Document 2 discloses a configuration that suppresses degradation of characteristics such as a crystal impedance (hereafter, "CI") value that is caused by obstruction of the vibration of a vibration portion that occurs together with flowing out of a fixing member such as an adhesive by making the dimensions of a mesa-type piezoelectric vibration piece satisfy a prescribed relational formula. Furthermore, Patent Documents 3 and 4 disclose configurations in which excitation electrodes are formed on main surfaces of a crystal piece, which has a long thin shape, so as to extend up to long sides of the crystal piece.

Patent Document 1: Japanese Patent No. 4458203
Patent Document 2: Japanese Unexamined Patent Application Publication No. 2013-102472
Patent Document 3: Japanese Examined Patent Application Publication No. 56-36814
Patent Document 4: Japanese Unexamined Patent Application Publication No. 2001-7677

SUMMARY OF THE INVENTION

However, in the case of a piezoelectric vibration element having a substantially concentric circular vibration distribution as disclosed in Patent Document 1, a region where the displacement caused by the vibration is small or non-existent is adjacent to the outside of the substantially concentric circles in the piezoelectric plate. Therefore, it may not be possible to obtain good vibration characteristics in that, for example, a drive level dependence (hereafter "DLD") characteristic is degraded, and the CI value is high and the value of the capacitance ratio $\gamma$ is large due to the width of the vibration region being small compared with the width of the crystal piece.

Furthermore, prevention of vibration leakage to the main vibration may not be sufficient in the configurations disclosed in Patent Documents 3 and 4.

The present invention was made in light of the above-described circumstances, and it is an object thereof to provide a crystal vibrator that can realize good vibration characteristics.

A crystal vibration element according to an embodiment of the present invention includes: a crystal piece that has a prescribed crystal orientation, and a first direction and a second direction in a plan view thereof; and excitation electrodes that are respectively provided on a front surface and a rear surface of the crystal piece in order to excite a thickness shear vibration having a main vibration in the first direction in the crystal piece upon applying an alternating electric field. A vibration distribution of the crystal piece in which a thickness shear vibration is a main vibration has a vibration region that extends in a band-like shape in the second direction of the crystal piece and non-vibration regions that are adjacent to opposed sides of the vibration region in the first direction of the crystal piece.

A crystal vibration element according to another embodiment of the present invention includes: an AT-cut crystal piece having a first direction and a second direction in a plan view thereof; and excitation electrodes that are provided on a front surface and a rear surface of the crystal piece so as to face each other. A vibration distribution of a thickness shear vibration having a main vibration in the first direction has two amplitude nodes that extend so as to cross two sides of the crystal piece that face each other in the second direction and that are provided so as face each other with a distance therebetween in the first direction, and an amplitude antinode of a vibration region that is provided at a position interposed between the two nodes.

A crystal vibration element according to another embodiment of the present invention includes: a crystal piece that has a prescribed crystal orientation, and a first direction and a second direction in a plan view thereof; and excitation electrodes that are respectively provided on a front surface and a rear surface of the crystal piece so that the crystal piece has a vibration region that is located in a central portion in the first direction and that vibrates with at least a thickness shear vibration, and non-vibration regions that interposed therebetween both sides of the vibration region in the first direction. Boundaries between the vibration region and the non-vibration regions connect two sides of the crystal piece, which extend in the first direction and face each other in the second direction, to each other, and extend in a wave-like shape in the second direction.

A crystal vibration element according to another embodiment of the present invention is a crystal vibration element in which a thickness shear vibration is a main vibration. The crystal vibration element includes: a crystal piece that has rectangular front and rear main surfaces; and rectangular excitation electrodes that are respectively formed on the main surfaces of the crystal piece. Long sides of the excitation electrodes are parallel to opposing long sides of the crystal piece, and the crystal vibration element has a relation of $0<G/T\leq0.5$, where G is a distance between the long sides of the excitation electrodes and the opposing long sides of the crystal piece, and T is a thickness of the crystal piece between the excitation electrodes.

According to the present invention, a crystal vibration element and a crystal vibrator can be provided that can realize excellent vibration characteristics.

BRIEF DESCRIPTION OF THE DRAWINGS

FIG. 3 is a perspective view of a crystal vibration element of the crystal vibrator in FIG. 1.

FIG. 4A illustrates the vibration distribution of a thickness shear vibration of the crystal vibration element in FIG. 3.

FIG. 4C illustrates simulation results of an X direction component of the vibration distribution (corresponding to X direction component of crystal orientation) of a crystal vibration element according to a first modification.

FIG. 11I illustrates simulation results of a front-surface side in the thickness direction of the vibration distribution of the crystal vibration element according to the fourth modification in the case where the phase is 0°.

FIG. 11J illustrates simulation results of a front-surface side in the thickness direction of the vibration distribution of the crystal vibration element according to the fourth modification in the case where the phase is substantially 45°.

FIG. 11K illustrates simulation results of a front-surface side in the thickness direction of the vibration distribution of the crystal vibration element according to the fourth modification in the case where the phase is substantially 90°.

FIG. 11L illustrates simulation results of a front-surface side in the thickness direction of the vibration distribution of the crystal vibration element according to the fourth modification in the case where the phase is substantially 135°.

FIG. 11M illustrates simulation results of a front-surface side in the thickness direction of the vibration distribution of the crystal vibration element according to the fourth modification in the case where the phase is substantially 180°.

FIG. 11N illustrates simulation results of a front-surface side in the thickness direction of the vibration distribution of the crystal vibration element according to the fourth modification in the case where the phase is substantially 225°.

FIG. 11O illustrates simulation results of a front-surface side in the thickness direction of the vibration distribution of the crystal vibration element according to the fourth modification in the case where the phase is substantially 270°.

DETAILED DESCRIPTION OF THE PREFERRED EMBODIMENTS

Hereafter, embodiments of the present invention will be described. In the following descriptions of the drawings, identical or similar constituent elements will be denoted by identical or similar symbols. The drawings are exemplary, the dimensions and shapes of the individual parts are schematic, and the technical scope of the invention of the present application should not be interpreted as being limited to that of the embodiments.

First Embodiment

Figure 1:
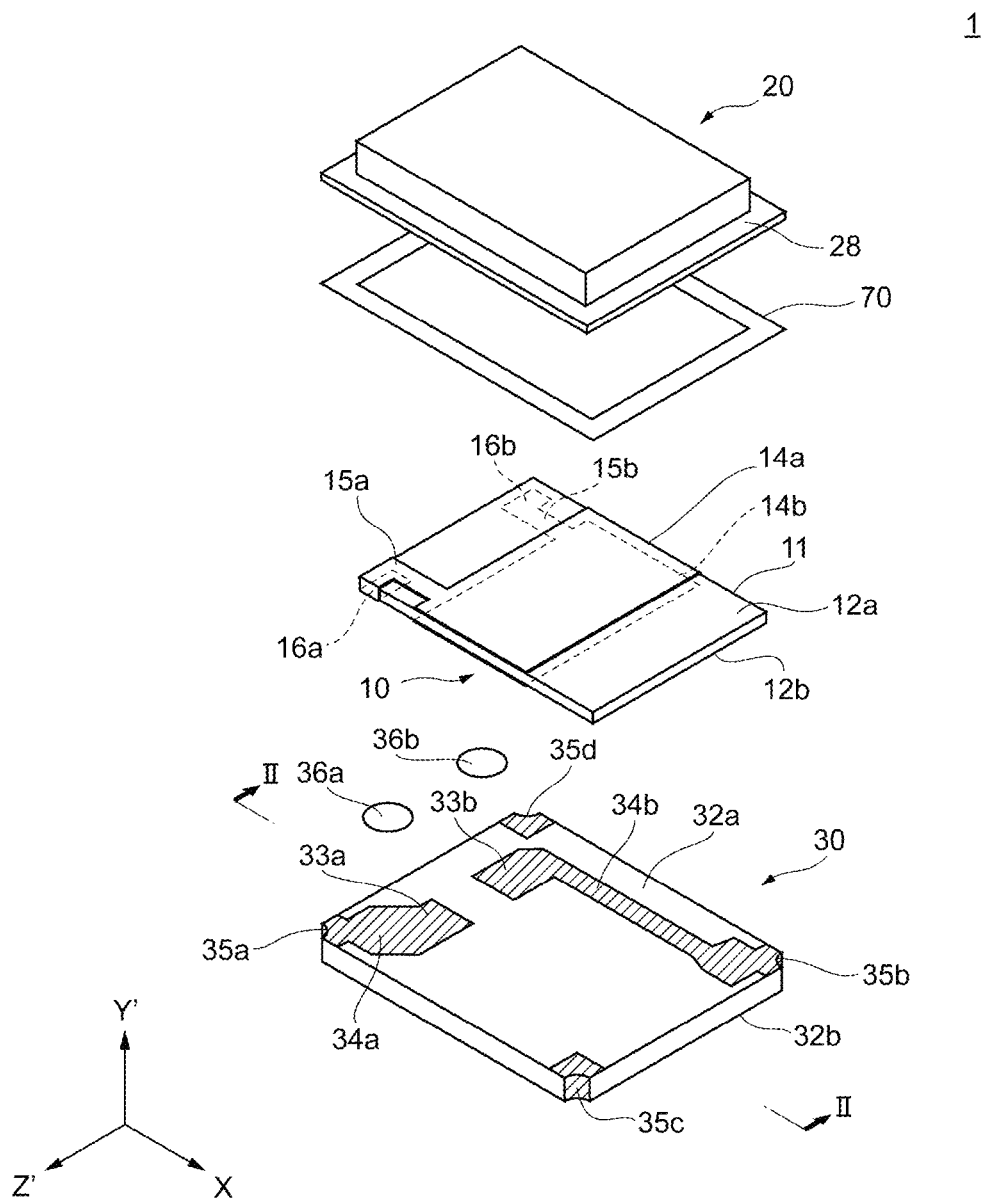
FIG. 1 is an exploded perspective view of a crystal vibrator according to a first embodiment of the present invention.
Figure 2:
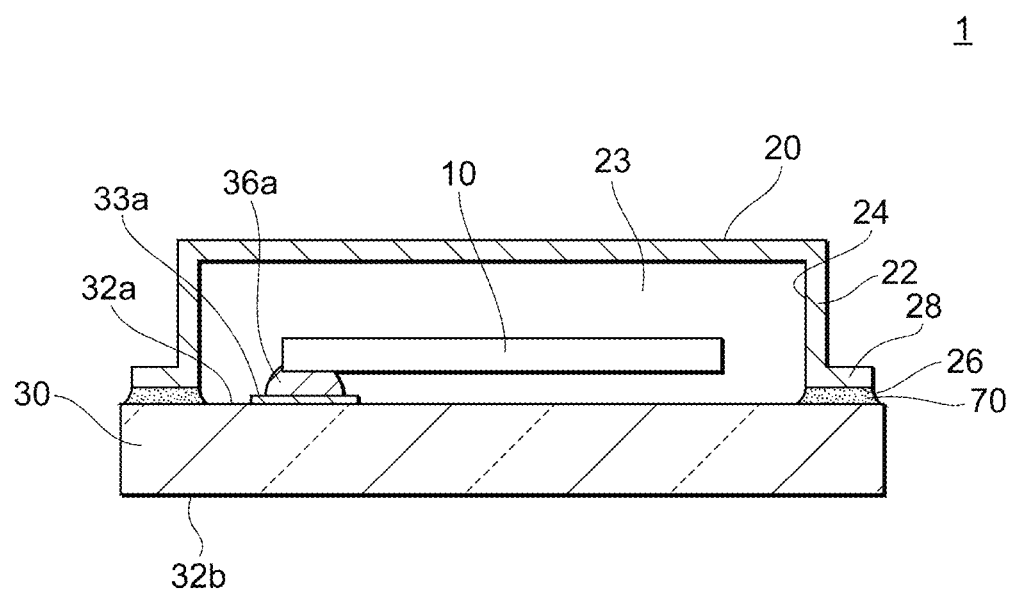
FIG. 2 is a sectional view taken along line II-II in FIG. 1.

A crystal vibrator 1 according to a first embodiment of the present invention will be described while referring to FIGS. 1 and 2. Here, FIG. 1 is an exploded perspective view of the crystal vibrator, and FIG. 2 is a sectional view taken along line II-II in FIG. 1. In FIG. 2, illustration of various electrodes of a crystal vibration element 10 is omitted.

As illustrated in FIG. 1, the crystal vibrator 1 according to this embodiment includes the crystal vibration element 10, a cap 20, which is an example of a lid member, and a substrate 30, which is an example of a support body that supports the crystal vibration element 10. The cap 20 and the substrate 30 form a holder (case or package) that is for accommodating the crystal vibration element 10.

The crystal vibration element 10 includes a crystal piece 11, and excitation electrodes 14a and 14b (hereafter, also referred to as "first excitation electrode 14a and second excitation electrode 14b") that are respectively provided on a front surface and a rear surface of the crystal piece 11. The first excitation electrode 14a is provided on a first surface 12a (front surface), which is a main surface, of the crystal piece 11, and the second excitation electrode 14b is provided on a second surface 12b (rear surface), which is a main surface, of the crystal piece 11 that opposes the first surface 12a of the crystal piece 11.

The crystal piece 11 has a trigonal-system crystal structure, which is different from the cubic system of a piezoelectric ceramic, for example, and is formed of a crystal material having a prescribed crystal orientation. The crystal vibration element 10 includes an AT-cut crystal piece 11, for example. The AT-cut crystal piece 11 is obtained by cutting a crystal such that surfaces parallel to a plane specified by an X axis and a Z' axis (hereafter "XZ' plane," and which similarly applies to planes specified using other axes) become main surfaces of the crystal in the case where a Y' axis and a Z' axis are axes that are obtained by respectively rotating a Y axis and a Z axis, among an X axis, a Y axis and a Z axis that are crystal axes of an artificial crystal, around the X axis by 35° 15'±1'30" in a direction from the Y axis toward the Z axis. In the example illustrated in FIG. 1, the crystal piece 11, which is an AT-cut crystal piece, has long sides that are parallel to the X axis serving as a first direction, and short sides that are parallel to the Z' axis serving as a second direction that is orthogonal to the first direction. In addition, the crystal piece 11 has a thickness that is parallel to the Y' axis serving as a third direction that is orthogonal to the first direction and the second direction. Hereafter, a direction along the long sides, a direction along the short sides and the thickness may be respectively referred to as a longitudinal direction, a lateral direction and a thickness direction. The crystal piece 11 is formed in a rectangular shape when the XZ' plane is viewed in plan. A crystal vibration element that uses an AT-cut crystal piece has a property of having very high frequency stability over a wide range of temperatures, and is also excellent in terms of deterioration over time. Furthermore, a main vibration of an AT-cut crystal vibration element is a thickness shear mode vibration. Hereafter, the individual constituent elements of the crystal vibrator 1 will be described while referring to the AT-cut axis directions.

The crystal piece 11 according to this embodiment is not limited to the above-described configuration, and for example an AT-cut crystal piece having long sides that are parallel to the Z' axis and short sides that are parallel to the X axis may be used instead. Alternatively, so long as the main vibration is the thickness shear mode, the crystal piece 11 may be a crystal piece having a different kind of cut than an AT cut such as a BT cut, for example. However, an AT-cut crystal piece, which has very high frequency stability over a wide range of temperatures, is most preferable.

The first excitation electrode 14a is formed on the first surface 12a of the crystal piece 11, and the second excitation electrode 14b is formed on the second surface 12b of the crystal piece 11. The first and second excitation electrodes 14a and 14b are arranged as a pair of electrodes having the crystal piece 11 interposed therebetween so as to be substantially entirely superposed with each other when the XZ' plane is viewed in plan. The first and second excitation electrodes 14a and 14b each have a rectangular shape when the XZ' surface is viewed in plan. For example, as illustrated in FIG. 1, the excitation electrodes are provided such that the long sides of the excitation electrodes are parallel to the short sides of the crystal piece 11, and the short sides of the excitation electrodes are parallel to the long sides of the crystal piece 11.

Figure 4B:
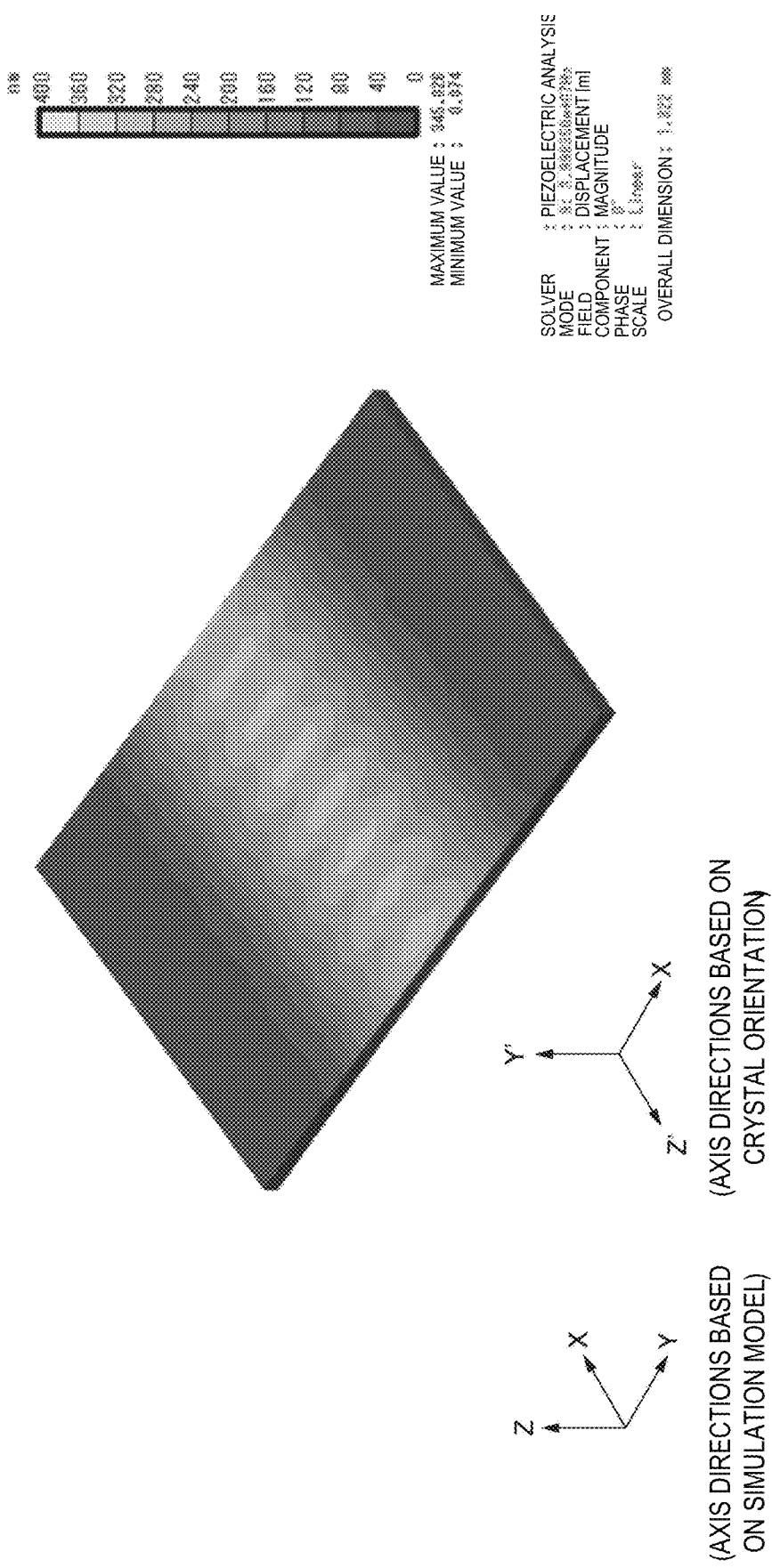
FIG. 4B illustrates simulation results of the vibration distribution of the crystal vibration element in FIG. 3.
Figure 4D:
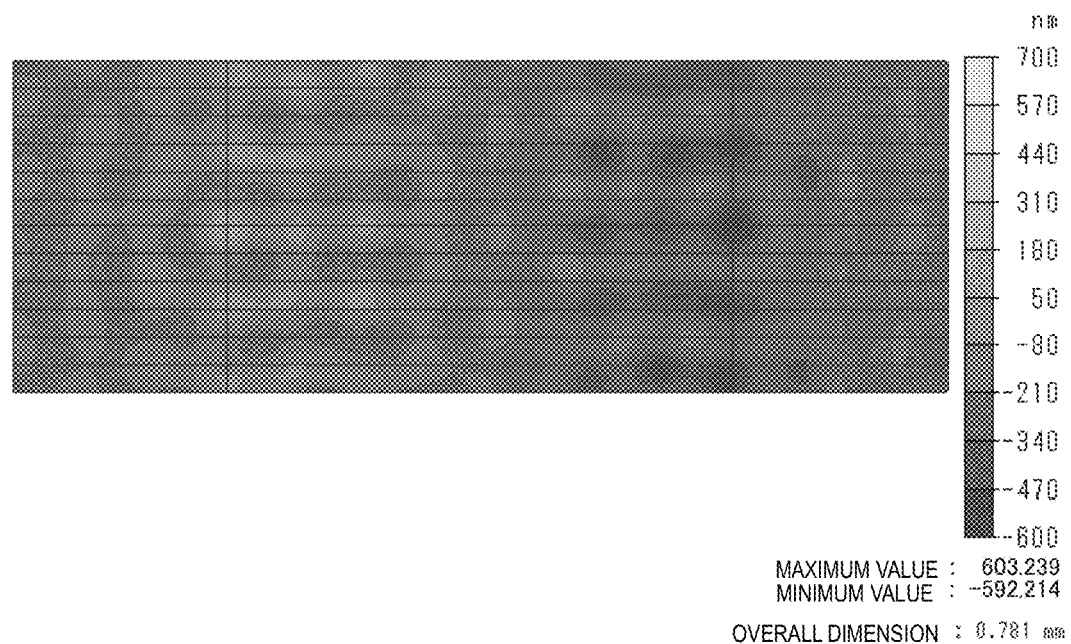
FIG. 4D illustrates simulation results of a Z direction component of the vibration distribution (corresponding to Y' direction component of crystal orientation) of the crystal vibration element according to the first modification.
Figure 4E:
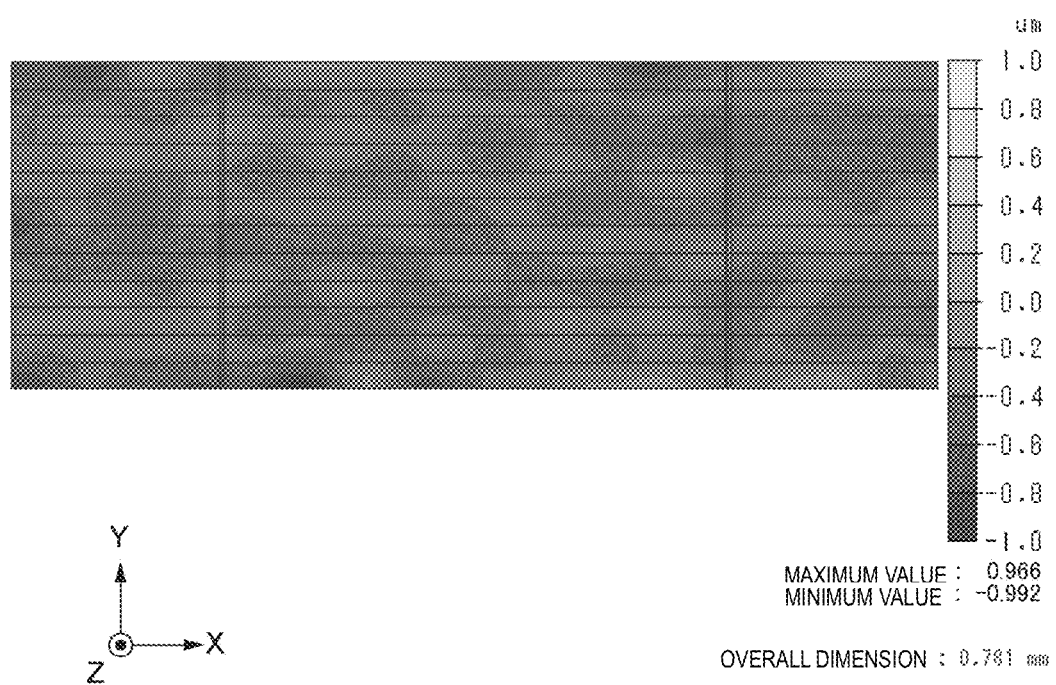
FIG. 4E illustrates simulation results of a Y direction component of the vibration distribution (corresponding to Z' direction component of crystal orientation) of the crystal vibration element according to the first modification.

The crystal vibration element is not limited to this configuration, and can instead be implemented as a crystal element vibration element having a long thin plate shape in the X direction of the crystal orientation as illustrated in FIGS. 4C to 4E as a first modification that is described later. In other words, the excitation electrodes may also be provided such that the long sides of the excitation electrodes are parallel to the long sides of the crystal piece 11, and the short sides of the excitation electrodes are parallel to the short sides of the crystal piece 11.

A connection electrode 16a that is electrically connected to the first excitation electrode 14a via an extension electrode 15a and a connection electrode 16b that is electrically connected to the second excitation electrode 14b via an extension electrode 15b are formed on the crystal piece 11. Specifically, the extension electrode 15a extends from the first excitation electrode 14a toward the short side of the crystal piece 11 on the negative X axis direction side on the first surface 12a, passes over a side surface of the crystal piece 11 on the negative Z' axis direction side and is connected to the connection electrode 16a formed on the second surface 12b. On the other hand, the extension electrode 15b extends from the second excitation electrode 14b toward the short side of the crystal piece on the negative X axis direction side on the second surface 12b, and is connected to the connection electrode 16b formed on the second surface 12b. The connection electrodes 16a and 16b are arranged along the short side of the crystal piece 11 on the negative X axis direction side, and the connection electrodes 16a and 16b are electrically connected to and mechanically held by the substrate 30 via conductive holding members 36a and 36b, which are formed by applying and curing a conductive adhesive. The connection electrodes 16a and 16b and the extension electrodes 15a and 15b are not limited to these arrangements and pattern shapes, and can be changed as appropriate by considering the electrical connections between these electrodes and other members. An electrode superposition region in which the first excitation electrode 14a and the second excitation electrode 14b are superposed with each other in plan view is provided so as to be a prescribed distance from the short sides of the crystal piece 11. The distance from the short sides of the crystal piece 11 to the electrode superposition region is larger than a distance from the long sides of the crystal piece 11 to the electrode superposition region.

The first and second excitation electrodes 14a and 14b, the extension electrodes 15a and 15b, and the connection electrodes 16a and 16b are formed by forming a chromium (Cr) layer, which is for increasing the adhesive force to the front surface of the crystal piece 11, and forming a gold (Au) layer on the underlying surface of the chromium layer. The electrodes are not limited to these materials.

As illustrated in FIG. 2, the cap 20 has a recess 24 that opens toward a first surface 32a of the substrate 30. The recess 24 is provided with a side wall portion 22 that is formed so as to stand upright from a bottom surface of the recess 24 along the entire periphery of the opening of the recess 24. In addition, the cap 20 also has a flange portion 28 that protrudes from the side wall portion 22 in a direction away from the opening. In this case, the flange portion 28 has a facing surface 26 that faces the first surface 32a of the substrate 30. The width of the facing surface 26 is larger than the thickness of the side wall portion 22 of the cap 20. Thus, since the area of the bond between the cap 20 and the substrate 30 can be increased by bonding the flange portion 28 and the substrate 30 to each other, it is possible to improve the strength of the bond between the cap 20 and the substrate 30.

The shape of the cap 20 is not particularly limited in this embodiment, and for example, a leading end of the side wall portion 22 formed so as to stand upright at substantially right angles to the bottom surface of the recess 24 may be bonded to the substrate 30 without the cap 20 having the flange portion 28.

The material of the cap 20 is not particularly limited, and the cap 20 may be formed of a conductive material such as a metal. In this way, a shielding function can be added by electrically connecting the cap 20 to the ground potential. Alternatively, the cap 20 may be formed of an insulating material or may have a composite structure constituted by a conductive material and an insulating material.

The substrate 30 supports the crystal vibration element 10 in such a manner that the crystal vibration element 10 can be excited. In the example illustrated in FIG. 1, the crystal vibration element 10 is supported so as to be able to be excited on the first surface 32a of the substrate 30 via the conductive holding members 36a and 36b.

In the example illustrated in FIG. 1, the substrate 30 has long sides that are parallel to the X axis direction, short sides that are parallel to the Z' axis direction, and a thickness that is parallel to the Y' axis direction, and has a rectangular shape in the XZ' plane. The substrate 30 may be formed of an insulating ceramic for example, and may be formed by stacking a plurality of insulating ceramic sheets on top of one another and then firing the insulating ceramic sheets. Alternatively, the substrate 30 may be formed of a glass material (for example, a material having silicate glass as a main component or a material having a main component other than silicate, and exhibiting a glass transition phenomenon with an increase in temperature), a crystal material (for example, AT cut crystal), or a glass epoxy resin, for example. The substrate 30 is preferably formed a heat-resistant material. The substrate 30 may be formed of a single layer or a plurality of layers, and in the case where the substrate 30 is formed of a plurality of layers, an insulating layer may be formed as the uppermost layer that forms the first surface 32a. Furthermore, the substrate 30 may have a flat plate-like shape, or may have a concave shape that opens in a direction so as to face the cap 20. As illustrated in FIG. 2, the cap 20 and the substrate 30 are bonded to each other via a bonding material 70, and as a result, the crystal vibration element 10 is hermetically sealed in an internal space (cavity) 23 enclosed by the recess 24 of the cap 20 and the substrate 30. In this case, it is preferable that the pressure of the internal space be that of a vacuum state having a pressure lower than atmospheric pressure in order to make it possible to reduce deterioration of the first and second excitation electrodes 14a and 14b that occurs over time due to oxidation.

The bonding material 70 is provided along the entire peripheries of the cap 20 and the substrate 30, and is interposed between the facing surface 26 of the side wall portion 22 of the cap 20 and the first surface 32a of the substrate 30. The bonding material 70 is composed of an insulating material. As the insulating material, a glass adhesive material such as a low-melting-point glass (for example, a lead boric acid based or tin phosphoric acid based glass), or a resin adhesive may be used. With these insulating materials, the cost is low compared with metal bonding, and a heating temperature can be suppressed and the manufacturing process can be simplified. If metal bonding is used, a higher bonding strength can be obtained compared with bonding using a resin adhesive.

In the example illustrated in FIG. 2, one end of the crystal vibration element 10 is fixed in place by the conductive holding members 36a and 36b, and the other end of the crystal vibration element 10 is free. In addition, both ends of the crystal vibration element 10 in the direction of the long sides or the short sides may be fixed to the substrate 30, as a modification.

As illustrated in FIG. 1, the substrate 30 includes connection electrodes 33a and 33b that are formed on the first surface 32a, and extension electrodes 34a and 34b that extend from the connection electrodes 33a and 33b to the outer edge of the first surface 32a.

The connection electrode 16a of the crystal vibration element 10 is connected to the connection electrode 33a via the conductive holding member 36a, and the connection electrode 16b of the crystal vibration element 10 is connected to the connection electrode 33b via the conductive holding member 36b.

The extension electrode 34a extends from the connection electrode 33a to any corner of the substrate 30, and the extension electrode 34b extends from the connection electrode 33b to another corner of the substrate 30. In addition, a plurality of outer electrodes 35a, 35b, 35c and 35d are formed at the corners of the substrate 30. In the example illustrated in FIG. 1, the extension electrode 34a is connected to the outer electrode 35a formed at the corner on the positive Z' axis direction and negative X axis direction side, and the extension electrode 34b is connected to the outer electrode 35b formed at the corner on the negative Z' axis direction and positive X axis direction side. In addition, as illustrated in FIG. 1, the outer electrodes 35c and 35d may be formed at the remaining corners, and these outer electrodes may be dummy electrodes that are not electrically connected to the crystal vibration element 10. In other words, the dummy electrodes need not be electrically connected to the first and second excitation electrodes 14a and 14b. In addition, the dummy electrodes may be connected to terminals (terminals that are not connected to another electronic element) provided on a mounting substrate (not illustrated) on which the crystal vibrator 1 is mounted. By forming such dummy electrodes, adding the conductive material for forming the outer electrodes becomes easier, and since the outer electrodes can be formed at all the corners, a processing step of electrically connecting the crystal vibrator to other members is simplified. In addition, rather than being dummy electrodes, the outer electrodes 35c and 35d may instead serve as ground electrodes to which a ground potential is supplied. In the case where the cap 20 is composed of a conductive material, the cap 20 can be given a shielding function by connecting the cap 20 to the outer electrodes 35c and 35d serving as ground electrodes.

In the example illustrated in FIG. 1, the corners of the substrate 30 each have a notched side surface that is formed by cutting away part of the corner to form a cylindrical curved surface shape (also referred to as a castellation shape), and the outer electrodes 35a to 35d are each formed so as to extend across the first surface 32a, the notched side surface and a second surface 32b of the substrate 30 in a continuous manner. The shape of the corners of the substrate 30 is not limited to this shape, and the notched shape may instead be a planar shape, or the four corners may each have a right-angle rectangular shape in plan view without having a notch.

The configurations of the connection electrodes 33a and 33b, the extension electrodes 34a and 34b and the outer electrodes 35a to 35d of the substrate 30 are not limited to the configurations described above, and may be modified and used in various ways. For example, the connection electrodes 33a and 33b may be arranged on different sides of the first surface 32a of the substrate 30 such as one being formed on the positive X axis direction side and the other being formed on the negative X axis direction side. In this configuration, the crystal vibration element 10 would be supported by the substrate 30 at both one end and the other end thereof in the long side direction. Furthermore, the number of outer electrodes is not limited to being four, and for example, there may be two outer electrodes arranged at opposite corners. In addition, the outer electrodes are not limited to being arranged at the corners, and may be formed on parts of the side surfaces of the substrate 30 excluding the corners. In this case, as already described above, notched side surfaces may be formed by cutting away parts of side surfaces to form cylindrical curved surfaces, and outer electrodes may be formed on those parts of the side surfaces excluding the corners. In addition, the other outer electrodes 35c and 35d that serve as dummy electrodes need not be formed. Furthermore, through holes that penetrate from the first surface 32a to the second surface 32b may be formed in the substrate 30, and electrical connections from connection electrodes formed on the first surface 32a to the second surface 32b may be realized by via conductors provided inside the through holes.

In the crystal vibrator 1 illustrated in FIG. 1, an alternating electric field is applied between the pair of first and second excitation electrodes 14a and 14b of the crystal vibration element 10 via the outer electrodes 35a and 35b of the substrate 30. Thus, the crystal piece 11 vibrates with a thickness shear vibration being a main vibration mode, and resonance characteristics are obtained along with this vibration.

Next, the crystal vibration element will be described in more detail while referring to FIGS. 3 to 14. FIG. 3 is a perspective view of the crystal vibration element 10, and FIGS. 4A and 4B illustrates a vibration distribution of the thickness shear vibration of the crystal vibration element 10. More specifically, FIG. 4A is a schematic diagram and FIG. 4B illustrates simulation results. Here, for convenience of explanation, only the vibration distribution corresponding to the first excitation electrode 14a and the second excitation electrode 14b is illustrated in FIGS. 4A and 4B. In addition, FIGS. 4C to 14 are for describing crystal vibration elements according to modifications of this embodiment and a comparative example.

FIG. 3 illustrates an example of the crystal piece 11, the first excitation electrode 14a and the second excitation electrode 14b of the crystal vibration element 10 according to this embodiment. In this example, when the XZ' plane is viewed in plan, the short side of the excitation electrode 14a on the positive Z' axis direction side is superposed with the long side of the crystal piece 11 on the positive Z' axis direction side, and the short side of the excitation electrode 14a on the negative Z' axis direction side is superposed with the long side of the crystal piece 11 on the negative Z' axis direction side. In addition, similarly for the excitation electrode 14b, when the XZ' plane is viewed in plan, the short side of the excitation electrode 14b on the positive Z' axis direction side is superposed with the long side of the crystal piece 11 on the positive Z' axis direction side, and the short side of the excitation electrode 14b on the negative Z' axis direction side is superposed with the long side of the crystal piece 11 on the negative Z' axis direction side. In other words, the excitation electrode 14a is provided on the first surface 12a of the crystal piece 11 so as to extend to both sides of the main surface the crystal piece 11 in the Z' axis direction, and the excitation electrode 14b is provided on the second surface 12b of the crystal piece 11 so as to extend to both sides of the main surface of the crystal piece 11 in the Z' axis direction.

In addition, the crystal vibration element 10 is configured to have dimensions of L=1.322 mm, W=0.895 mm, T=0.0426 mm, EL=0.640 mm and G=0, for example, where L is the length of the long sides of the crystal piece 11, W is the length of the short sides of the crystal piece 11, T is the thickness of the crystal piece 11 in the Y' axis direction, and EL is the length of the short sides of the excitation electrode 14a in the X axis direction. G/T=0, W/T=21.0 and L/T=31.0. Here, G is the distance between the short sides of the excitation electrodes and the long sides of the crystal piece, and since the short sides of the excitation electrodes and the long sides of the crystal piece are aligned with each other in FIG. 3, G=0. The above-listed dimensions are merely examples, and the crystal vibration element according to this embodiment includes configurations having the vibration distributions described below (includes shapes and dimensions of the crystal piece and the excitation electrodes and the positional relationships therebetween).

FIG. 4B illustrates the results of a simulation of a thickness shear vibration generated in the crystal vibration element 10 in FIG. 3 when an alternating electric field of a prescribed oscillation frequency, for example, the AT-cut fundamental oscillation frequency, is applied, the simulation being performed using a software package called Femtet (registered trademark) manufactured by Murata Manufacturing Co., Ltd. and using a piezoelectric analysis solver under the condition of a mesh size of 0.02 mm. FIG. 4A is a schematic diagram of the same. The material constants are quoted from Kagaku Binran Kisohen II Revised 4th Edition, The Chemical Society of Japan, Maruzen (1993); Chronological Scientific Tables 1996, National Astronomical Observatory of Japan, Maruzen (1996); Danseihasoshigijutsu Handbook, Japan Society for the Promotion of Science Danseihasoshigijutsu 150th Committee, Ohmsha; and Hyomendanseihasoshizairyo Databook, Japan Electronics and Information Technology Industries Association. The above description also similarly applies to the drawings illustrating other simulation results.

As illustrated in FIG. 4B, an X direction among vibration directions of the vibration distribution corresponds to an X direction of the crystal orientation, a Y direction among the vibration directions of the vibration distribution corresponds to a Z' direction of the crystal orientation, and a Z direction among the vibration directions of the vibration distribution corresponds to a Y' direction of the crystal orientation. The same relationships between the vibration directions and the crystal orientation similarly apply to the drawings illustrating other simulation results. Hereafter, description will be given on the basis of the crystal orientation directions unless stated otherwise.

As illustrated in FIGS. 4A and 4B, a vibration distribution, in which the main vibration is a thickness shear vibration in which the crystal vibration element 10 mainly vibrates in the X direction, includes a vibration region 40 that extends in a band-like shape in the Z' axis direction (lateral direction) of the crystal piece 11 and non-vibration regions 50a and 50b that are adjacent to the two sides of the vibration region 40 in the X axis direction (longitudinal direction) of the crystal piece 11. In other words, the non-vibration regions 50a and 50b are not adjacent to each other. Here, in the present invention, the term "vibration region" refers to a region in which the largest displacement is generated in the crystal piece by the main vibration, which is thickness shear vibration, when an alternating electric field of a prescribed oscillation frequency (for example, the AT-cut fundamental oscillation frequency) is applied. In addition, in the present invention, the term "non-vibration region" refers to a region in which the largest displacement is not generated in the crystal piece when the vibration region of the crystal piece vibrates due to the main vibration, and this term is not limited to a region where there is absolutely no displacement due to vibration and may be a region where the displacement due to vibration is smaller than in the vibration region. It is preferable that a non-vibration region be a region in which the amount of displacement is less than 20-25% the maximum amount of displacement. In addition, when the XZ' plane is viewed in plan, the vibration region 40 has a band-like shape that extends in a continuous manner from one long side of the crystal piece 11 that is parallel to the X axis to the other side of the crystal piece 11 that is similarly parallel to the X axis. The vibration region 40 does not reach either of the two short sides of the crystal piece 11 that are parallel to the Z' axis. When the XZ' plane is viewed in plan, the boundaries where the vibration region 40 and the non-vibration regions 50a and 50b are adjacent to each other are not straight lines, but rather have a wave-like shape made up of alternating peaks and troughs. These wave-shaped boundaries have a substantially sinusoidal shape in which the heights of the peaks and the depths of the troughs are substantially the same as each other and that has a substantially constant period. At this time, it is preferable that the difference between the height of peak and the depth of a trough be within ±25% using a central portion between a peak and a trough as a reference. Regarding the phrase "the vibration region 40 extends in a band-like shape", it is sufficient that the vibration region 40 have a certain width and extend in a certain direction and the vibration region 40 is not limited to having a long thin shape in the extension direction. For example, the phrase may also refer to a configuration in which the length of the vibration region 40 in the extension direction is smaller than the width of the vibration region 40.

Here, when the XZ' plane is viewed in plan, the region occupied by the vibration region 40 may substantially coincide with the region occupied by the excitation electrodes 14a and 14b in FIG. 3. In this case, the vibration region 40 has a band-like shape that continuously extends from one short side of each of the excitation electrodes 14a and 14b that is parallel to the X axis to the other short side of each of the excitation electrodes 14a and 14b that is similarly parallel to the X axis. Furthermore, although the boundaries where the vibration region 40 and the non-vibration regions 50a and 50b are adjacent to each other have a wave-like shape as described above, the boundaries are roughly aligned with the long sides of the excitation electrodes 14a and 14b that are parallel to the Z' axis.

FIG. 4A illustrates the displacement distribution for the instant when the vibration of the main surfaces exhibits the maximum displacement in the configuration in FIG. 3. The displacement distribution is equally divided into four types of regions on the basis of the value of the maximum displacement of the vibration region 40, namely, three vibration regions and one non-vibration region, and the vibration region is illustrated using different types of hatching. That is, the vibration region 40 includes a first vibration strength region 42, second vibration strength regions 44a and 44b in which the amount of displacement due to the vibration is smaller than in the first vibration strength region 42, and third vibration strength regions 46a and 46b in which the amount of displacement due to the vibration is smaller than in the second vibration strength regions 44a and 44b. When the XZ' plane is viewed in plan, the second vibration strength regions 44a and 44b are adjacent to the two sides of the first vibration strength region 42 in the X axis direction (longitudinal direction) of the crystal piece 11. Furthermore, the third vibration strength regions 46a and 46b are respectively adjacent to the sides of the second vibration strength regions 44a and 44b that are not adjacent to the first vibration strength region 42 in the X axis direction (longitudinal direction) of the crystal piece 11. In other words, when a center line that is parallel to the Z' axis is drawn in the center of the first vibration strength region 42, the vibration region 40 has a vibration distribution that is symmetrical about the center line. The non-vibration regions 50, in which the amount of displacement is 0-25% the maximum amount of displacement, that is, 0-85 nm, illustrated in FIG. 4A, are adjacent to the sides of the third vibration strength regions 46a and 46b that are not adjacent to the second vibration strength regions 44a and 44b in the X axis direction (longitudinal direction) of the crystal piece 11. In the example illustrated in FIG. 4, the amount of displacement of the first vibration strength region 42 is 75-100% the maximum amount of displacement, that is, around 255-340 nm, the amount of displacement of the second vibration strength regions 44a and 44b is around 50-75% the maximum amount of displacement, that is, 170-255 nm, and the amount of displacement of the third vibration strength regions 46a and 46b is 25-50% the maximum amount of displacement, that is, 85-170 nm. When the XZ' plane is viewed in plan, each of these vibration strength regions has a band-like shape that extends in a continuous manner from one long side of the crystal piece 11 that is parallel to the X axis to the other long side of the crystal piece 11 that is similarly parallel to the X axis. The vibration strength regions do not reach either of the two short sides of the crystal piece 11 that are parallel to the Z' axis. In addition, the boundaries where these vibration strength regions are adjacent to each other are not straight lines, but rather meander in a wave-like shape. The wave-shaped boundaries have a substantially sinusoidal shape, for example.

In addition, the vibration region 40 has a strong vibration region (includes apex of vibration) that represents an amount of displacement of 90% or more of the maximum amount of displacement. For example, as illustrated in FIGS. 4A and 4B, the first vibration strength region 42 of the vibration region 40 includes a strong vibration region. As illustrated in FIG. 4B, the strong vibration region has first distributions having opposite phases from each other that are located at one long side of the front surface (first main surface 12a) of the crystal piece 11 that extends along the X axis direction, and another long side of the rear surface (second main surface 12b) of the crystal piece 11 that extends along the X axis direction and is separated from and faces the one long side in the Z' axis direction. The first distributions are semi-elliptical distributions having a shape obtained by vertically halving an ellipse having a long axis that extends in the X axis direction (longitudinal direction) of the crystal piece 11. In addition, the strong vibration region has second distributions that are arranged next to each other in the Z' axis direction and are located at the front surface (first main surface 12a) and the rear surface (second main surface 12b) of the crystal piece 11. The second distributions are substantially elliptical distributions having a long axis that extends in the X axis direction of the crystal piece 11 as illustrated in FIG. 4B. Thus, the first vibration strength region 42 in FIG. 4A has a plurality of strong vibration regions in the Z' axis direction (lateral direction). In FIG. 4A, the outer edge of the first vibration strength region 42, which includes a plurality of strong vibration regions, is illustrated.

In addition, as illustrated in FIG. 4D, the strong vibration region of a displacement component in the Z axis direction (Y' axis direction of crystal orientation) based on the simulation model has a third distribution in which one half thereof and the other half thereof in the X axis direction of the crystal orientation have opposite phases. More specifically, with reference to a center line that extends in the Z' axis direction of the crystal orientation at a center point in the X axis direction of the crystal orientation of the crystal piece, this strong vibration region further has a third distribution that includes a plurality of one distributions that are on one side of the center line in the X axis direction and are arrayed in the X axis direction, and a plurality of other distributions that are on the other side of the center line in the X axis direction, are arrayed in the X axis direction, and have the opposite phase to the one distributions.

Here, in this embodiment, in the crystal piece obtained by AT cutting a crystal material that is a trigonal piezoelectric crystal having a prescribed crystal orientation, a novel thickness shear mode is generated in which a thickness shear mode is a main vibration mode and that is distributed in a band-like shape in the second direction where boundaries with non-vibration regions have a wave-like shape, as obtained in the present invention as illustrated in FIGS. 4A and 4B, and the thickness shear mode has a strong vibration region (includes a vibration apex or antinode) in which the vibration has opposite phases at diagonally opposite sides of the front and rear surfaces. Hereafter, such a thickness shear mode included in the present invention is referred to as a full-width thickness shear mode. In the full-width thickness shear mode, the strong vibration region, in which the vibration has opposite phases at diagonally opposite sides of the front and rear surface, preferably has a semi-elliptical distribution having a shape obtained by vertically halving an ellipse that is elongated in the X direction (refer to FIGS. 4A to 4E).

Figure 27:
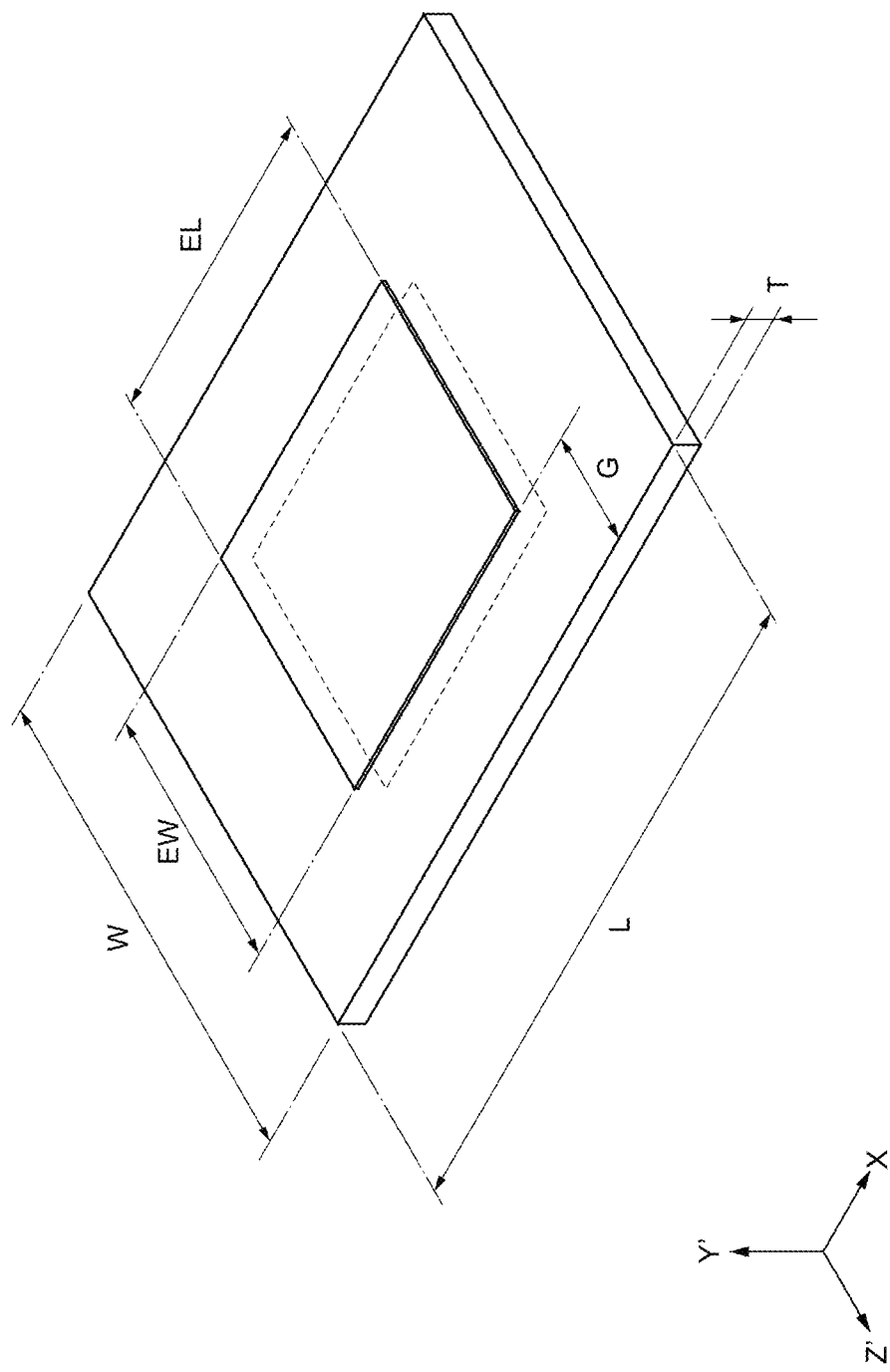
FIG. 27 is a perspective view of crystal vibration element of a crystal vibrator of the related art.
Figure 28:
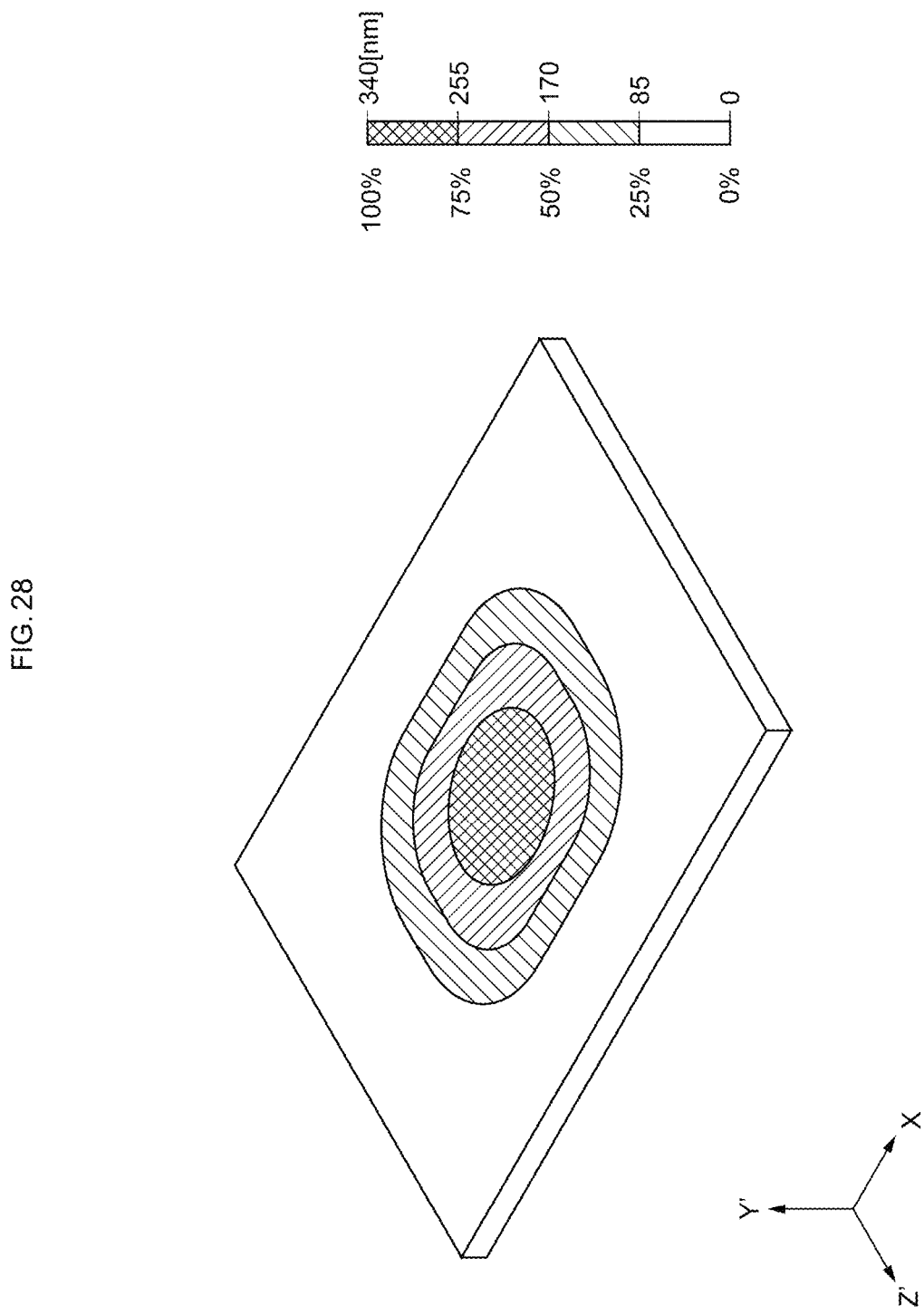
FIG. 28 illustrates the vibration distribution of a thickness shear vibration of the crystal vibration element of the related art in FIG. 27.

Next, the embodiment will be compared and contrasted with an example of the related art while referring to FIGS. 27 and 28. FIG. 27 illustrates a crystal vibration element of the related art in which a thickness shear vibration is confined to a central portion of a crystal piece. This example of the related art differs from the configuration in FIG. 4A in that a length EW of an excitation electrode in the lateral direction is 0.554 mm, in that the length EW is set so as to be smaller than in FIG. 4A, and in that a gap of G/T=4 is provided from an end surface of the crystal piece. In other words, the crystal vibration element illustrated in FIG. 27 includes an excitation electrode non-formation region that is provided in an annular shape around an outer periphery of the crystal piece, and an excitation electrode formation region that is provided in a central portion of the crystal piece inside the excitation electrode non-formation region that is provided in an annular shape. FIG. 28 schematically illustrates the vibration distribution of the thickness shear mode of the crystal vibration element of the related art illustrated in FIG. 27. FIG. 28 illustrates a vibration distribution having an amplitude antinode in the central portion of the crystal piece, and an amplitude node that extends in a continuous manner around the entire periphery of the amplitude antinode. In addition, when the front surface of the crystal piece is viewed in plan, amplitude antinodes that exist on the front and rear surfaces are at overlapping positions. As illustrated in FIG. 28, when the XZ' plane is viewed in plan, the crystal vibration element of the example of the related art includes, in the form of substantially concentric circles arrayed from a central portion of the crystal piece toward the outside of the crystal piece, a first vibration strength region in which the displacement due to the vibration is largest, a second vibration strength region that is located in a region surrounding the first vibration strength region and in which the displacement due to the vibration is smaller than in the first vibration strength region, and a third vibration strength region that is located in the region surrounding the second vibration strength region and in which the displacement due to the vibration is smaller than in the second vibration strength region.

In contrast, a thickness shear amplitude node or a non-vibration region that surrounds the central portion of the crystal piece in an annular manner such as in the thickness shear mode of the related art illustrated in FIG. 27 does not exist in the full-width thickness shear mode according to this embodiment. Furthermore, as illustrated in FIG. 4A, at least one amplitude antinode exists inside a vibration region that is distributed in a band-like shape laterally extending between the two opposite ends of the crystal piece in the second direction. In addition, when the front surface of the crystal piece is viewed in plan, amplitude antinodes that exist on the front and rear surfaces are at non-overlapping positions. Consequently, in contrast to the thickness shear mode in which there is one antinode at overlapping positions on the front and rear surfaces of the central portion of the crystal piece in the example of the related art illustrated in FIG. 28, this embodiment has the vibration distribution illustrated in FIG. 4A and therefore a larger vibration region can be secured along the Z' axis direction of the crystal piece. In addition, in a thickness shear vibration that depends on a thickness T of a crystal piece sandwiched between excitation electrodes, by making the length L of the crystal piece in the X axis direction larger than the length EL of the excitation electrodes in the X axis direction by a prescribed ratio, not only can a full-width thickness shear mode that exists in the first direction illustrated in FIG. 4A be excited, but also a full-width thickness shear mode that includes a vibration state in which vibrations of a plurality of wavenumbers in which the crystal piece is displaced in the third direction inside the vibration region are distributed in the first direction. Furthermore, provided that the ratio of the length L of the crystal piece in the first direction with respect to the length EL is set to fall within a prescribed range, amplitude nodes of the full-width thickness shear mode that extend in a continuous manner in the Z' axis direction can be arranged at the ends of the crystal piece in the first direction. Therefore, provided that the crystal piece is supported by holding members at the positions of the amplitude nodes of the full-width thickness shear mode, the effect of such support on the full width shear mode such as leakage or obstruction of the vibration can be made small.

As described above, in this embodiment, a specific vibration that is called a full-width thickness shear vibration in the present invention can be selectively generated in the vibration distribution of a thickness shear vibration so as to extend across the Z' axis direction (lateral direction) of the crystal vibration element 10, and therefore a uniform vibration can be obtained. Therefore, a DLD characteristic can be improved, and since a CI value can be made low and the value of a capacitance ratio γ can be made small by securing a wide vibration region 40, excellent vibration characteristics can be obtained.

Next, a first modification will be described while referring to FIGS. 4C to 4E. In the following description, points that are different from the above-described content will be described. In this modification, the crystal vibration element has the same configuration as in FIG. 3 in that the crystal vibration element has a long thin plate shape in the X direction, but differs from the configuration in FIG. 3 in that the longitudinal direction of excitation electrodes matches the longitudinal direction of the crystal piece 11, and in that the lateral direction of the excitation electrodes matches the lateral direction of the crystal piece 11. Specifically, in this modification, W=0.277 mm, T=0.033 mm, L=0.77 mm, EL=0.44 mm and Tex=0.267 µm, and G/T=0, W/T=8.39, L/T=23.7 and EL/T=12.8. FIG. 4C illustrates the displacement distribution of an X direction component of a vibration distribution (corresponding to an X direction component of the crystal orientation) obtained by a simulation, FIG. 4D illustrates the displacement distribution of a Z direction component of the vibration distribution (corresponding to a Y' direction component of the crystal orientation) obtained by a simulation, and FIG. 4E illustrates the displacement distribution of a Y direction component of the vibration distribution (corresponding to a Z' direction component of the crystal orientation) obtained by a simulation. It is clear from FIG. 4C that the displacement distribution of the X direction component, which represents the main vibration of the vibration, shows the displacement distribution of a full-width thickness shear vibration that has a vibration region that is sandwiched between non-vibration regions located at both ends of the crystal vibration element in the X direction and that connects the opposite long sides to each other. In addition, when the displacement is divided into ten gradations of displacement between the largest positive value and the smallest negative value, in the distribution state of a strong vibration region on the negative displacement side representing at least 80% of the largest absolute value of negative displacement, which represents the maximum displacement, two elliptical distributions that extend in the X direction and a semi-elliptical distribution having a shape obtained by vertically halving an ellipse are arrayed in the width direction. The semi-elliptical distribution is distributed so as to extend along a long side with the center thereof located on the long side. At this time, the largest value of the displacement of the X direction component is 5.668 µm, the largest value of the Z (thickness) direction component of the vibration distribution is 0.603 µm, and the largest value of the displacement of the Y direction (width) component of the vibration distribution is 0.966 µm.

Figure 5:
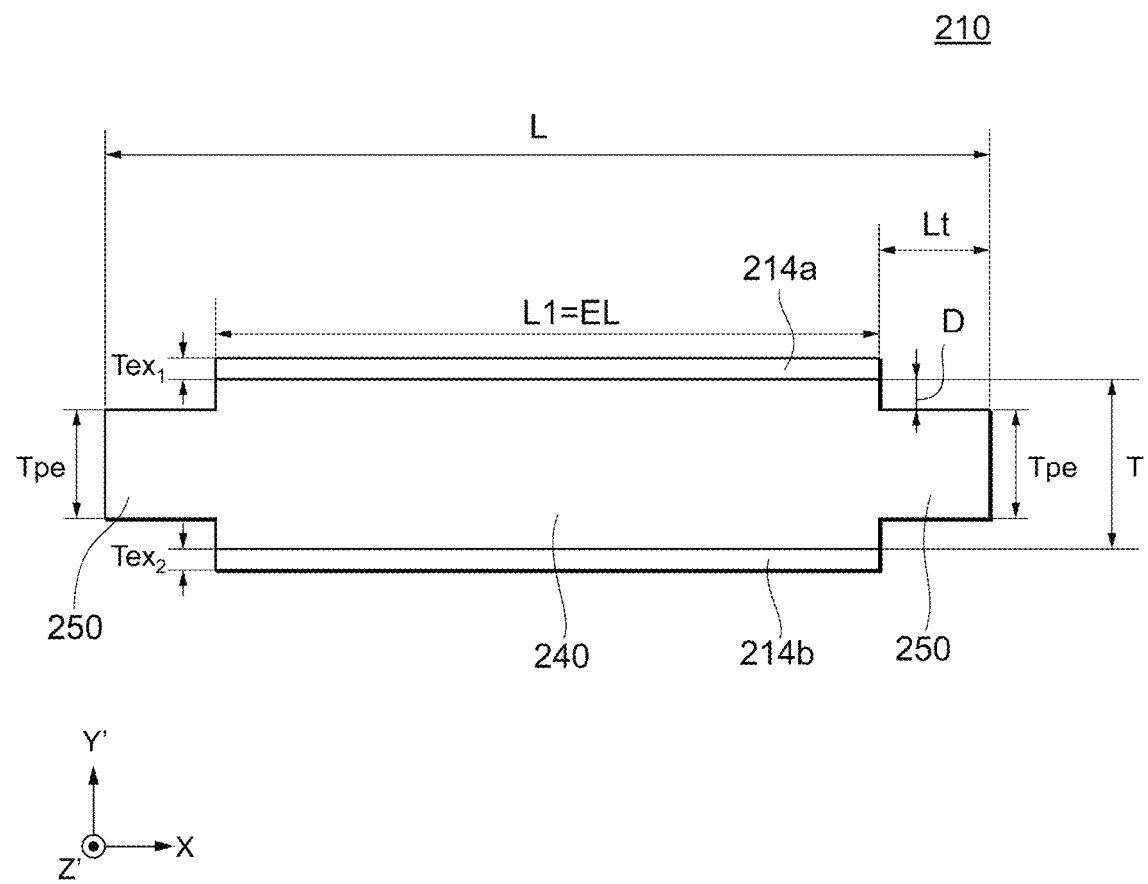
FIG. 5 is a side view of a crystal vibration element according to a second modification.

Next, a second modification will be described while referring to FIGS. 5 to 8,

A crystal vibration element 210 includes a mesa-shaped crystal piece having a first part 240 and second parts 250. The first part 240 has a vibration region that extends in a band-like shape in the Z' axis direction similarly to the vibration regions described in FIGS. 3 to 4B. When the XZ' plane is viewed in plan, the second parts 250 are provided at a position that contacts one side, which is parallel to the Z' axis, of the first part 240, which is the vibration region, and at a position that contacts the other side, which is similarly parallel to the Z' axis, of the first part 240. A side view of the crystal vibration element 210 in which the crystal vibration element is viewed from the XY' plane includes the crystal piece first part 240 that is sandwiched between a first excitation electrode 214a, which has a thickness Tex1, and a second excitation electrode 214b, which has a thickness Tex2. The first part 240 has a vibration region having a thickness T when the XY' plane is viewed in plan. In addition, a thickness Tpe of the second parts 250 is smaller than a thickness T of the first part 240. As illustrated in FIG. 5, the pair of excitation electrodes 214a and 214b are provided so as to have the length EL in the X axis direction so as to entirely cover the X axis direction length L1 of the vibration region of the first part 240 that is located in the center of the crystal piece in the X axis direction, and therefore L1=EL.

Figure 6:
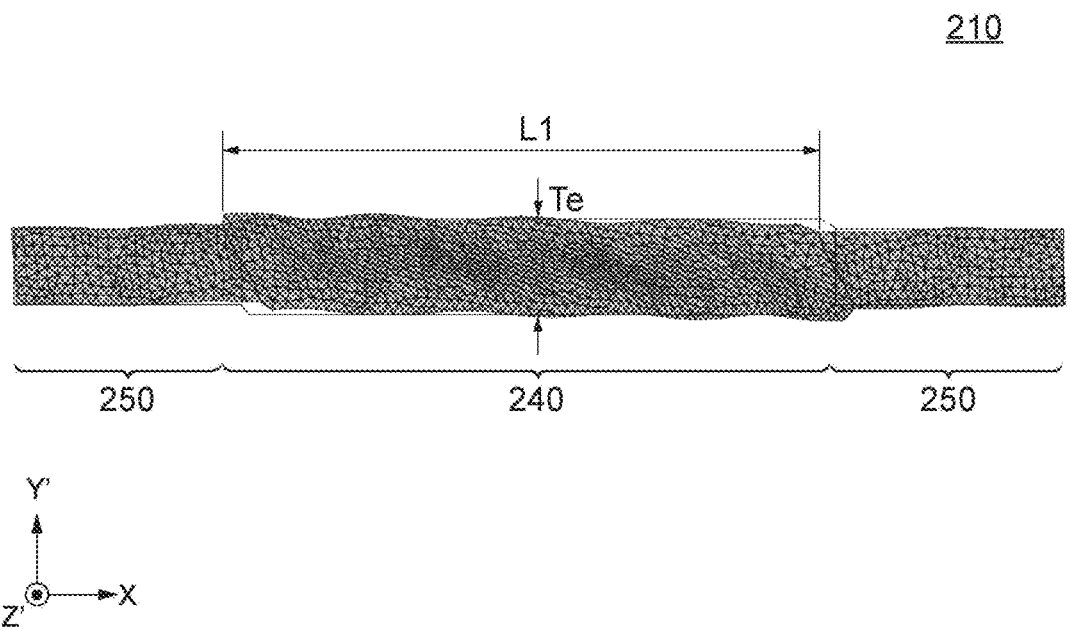
FIG. 6 is a side view that illustrates a vibration state of a crystal vibration element according to an embodiment of the present invention in which the wavenumber n=4 in the case where the crystal vibration element illustrated in FIG. 5 vibrates with a thickness shear vibration having a main vibration in a first direction.

FIG. 6 illustrates the displacement distribution of vibration for the crystal vibration element 210 illustrated in FIG. 5, in which a thickness shear vibration is the main vibration, in the case where a vibration mode having a wavenumber n=4 is excited in a vibration region that satisfies the following formulas 1 and 2 and has an X axis direction length L1.

T is the thickness of the crystal piece in the vibration region, L1 is the length of the first part in the X axis direction, Tex is the total thickness of the thickness Tex1 of the first excitation electrode and the thickness Tex2 of the second excitation electrode, γex is the specific gravity of the material of the excitation electrodes, and γxt is the specific gravity of the material of the crystal piece. Formula 1 below gives the effective thickness Te of the vibration region of the crystal vibration element, which is calculated by adding to the value of the thickness T of the crystal piece, a value obtained by multiplying a ratio of the specific gravity γex of the material of the excitation electrodes to the specific gravity γxt of the material of the crystal piece by the thickness Tex of the excitation electrodes. n (n is a natural number) is the wavenumber in the vibration region in the X axis direction. In the following formulas 1 and 2, it is assumed that the excitation electrode 214a and the excitation electrode 214b are provided so as to be formed of the same material and have the same thickness.

$$Te = T + Tex \cdot \gamma ex / \gamma xt \quad \text{Formula 1}$$

$$L1/Te = 1.603 \cdot n - 0.292 \quad \text{Formula 2}$$

From the vibrational displacement distribution in FIG. 6, it is clear that, in the crystal vibration element 210, vibrational displacement is confined to inside the vibration region of the first part 240 and that the vibrational displacements of the second parts 250 are sufficiently small compared with that of the first part 240.

Figure 7:
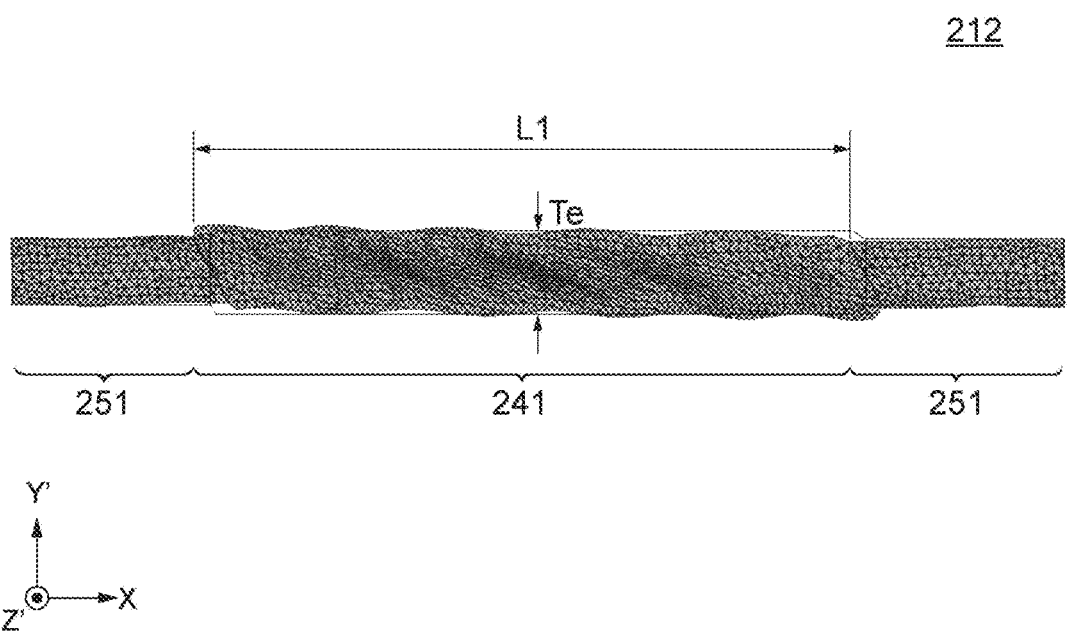
FIG. 7 is a side view that illustrates a vibration state of a crystal vibration element according to an embodiment of the present invention in which the wavenumber n=5 in the case where the crystal vibration element illustrated in FIG. 5 vibrates with a thickness shear vibration having a main vibration in a first direction.

FIG. 7 illustrates the displacement distribution of vibration in a crystal vibration element 212 that is formed so as to satisfy formulas 1 and 2 when n=5. From the vibrational displacement distribution in FIG. 7, it is clear that vibrational displacement is confined to inside the vibration region of a first part 241 and that the vibrational displacements of second parts 251 are sufficiently small compared with that of the first part 241 also in the case where n=5.

Figure 8:
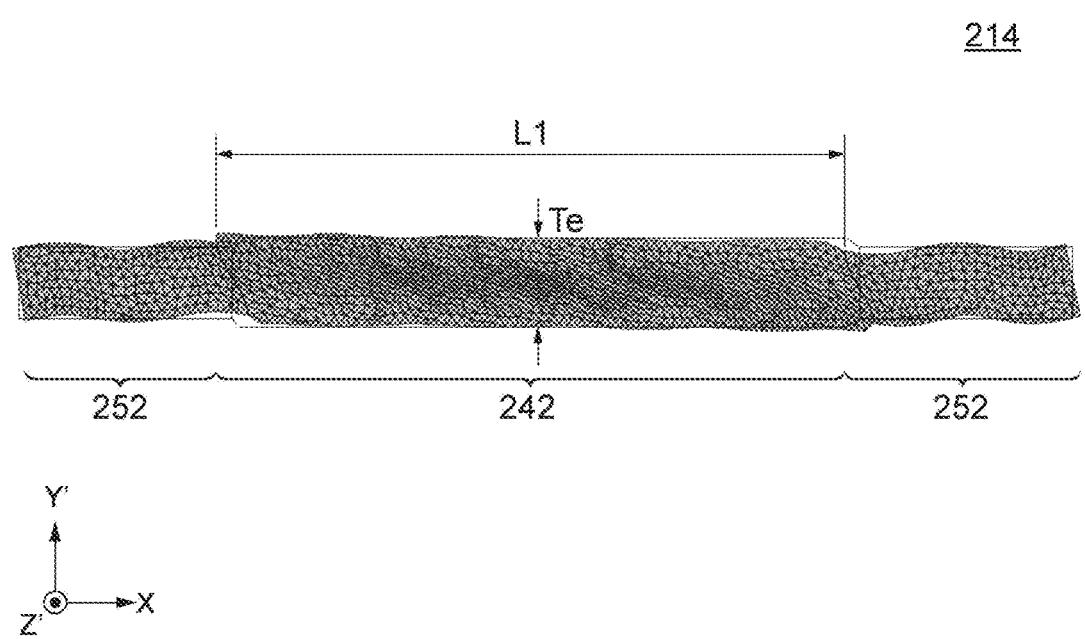
FIG. 8 is a side view that illustrates a vibration state of a crystal vibration element according to a comparative mode to be compared with the present invention in which the wavenumber n=4.5 in the case where the crystal vibration element illustrated in FIG. 5 vibrates with a thickness shear vibration having a main vibration in a first direction.

As a comparative example, FIG. 8 illustrates the displacement distribution of vibration in a crystal vibration element 214 that is formed so as to satisfy formulas 1 and 2 when n=4.5 (in other words, when n is not a natural number). From the vibrational displacement distribution in FIG. 8, it is clear that, in the crystal vibration element, the vibrational displacement is not confined to inside a vibration region of a first part 242, and therefore the vibrational displacements of second parts 252 are large compared with those of the second parts 250 in FIG. 6 or the second parts 251 in FIG. 7.

Here, the crystal vibration element is used by being held inside a sealed space of a holder (for example, refer to FIG. 2). Generally, the crystal vibration element is held by conductive holding members that are provided on a substrate, which is a constituent element of the holder. Therefore, it is likely that vibration leakage will occur in which vibration energy of the crystal vibration element leaks to the substrate via the conductive holding members. Consequently, if it is possible to support the crystal vibration element using conductive holding members at a part of the crystal vibration element where the vibrational displacement is substantially small, vibration leakage to the substrate can be reduced. Furthermore, if the area of the part where the vibrational displacement is substantially small is small, it is not possible to secure this area within the holding areas of the conductive holding members and the strength with which the crystal vibration element is held is reduced. As a result, stress is generated between the crystal vibration element and the conductive holding members due to falling impacts or deterioration that occurs over time, and cracking or peeling off are likely to occur. Regarding this point, in contrast to the comparative example illustrated in FIG. 8, the non-vibration regions can be arranged over substantially the entirety of the second parts in the embodiment of the present invention illustrated in FIGS. 6 and 7. Therefore, the embodiment of the present invention illustrated in FIGS. 6 and 7 has effects of reducing vibration leakage, and reducing cracking or peeling off generated between the crystal vibration element and the conductive holding members.

FIG. 5 illustrates an example in which the thickness of the entirety of each second part 250 is smaller than the thickness of the first part 240 of the vibration region.

Figure 10:
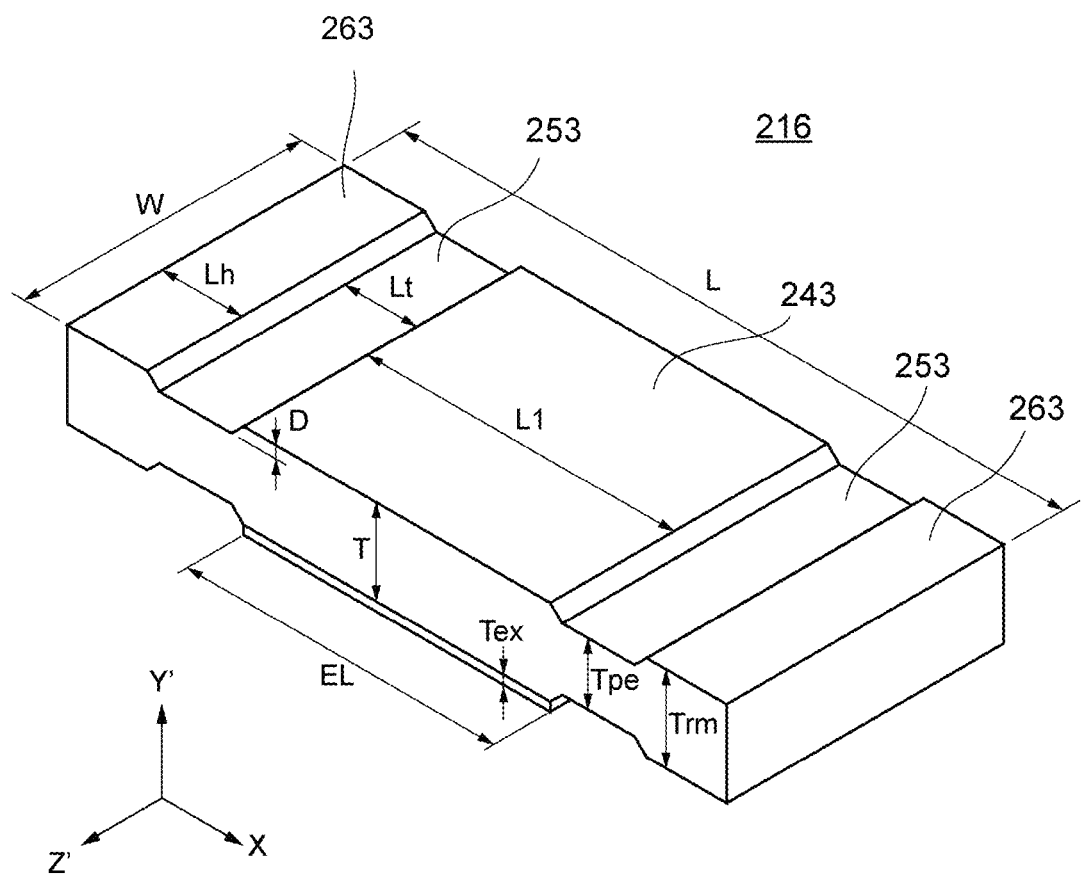
FIG. 10 illustrates a crystal vibration element according to a fourth modification.
Figure 11A:
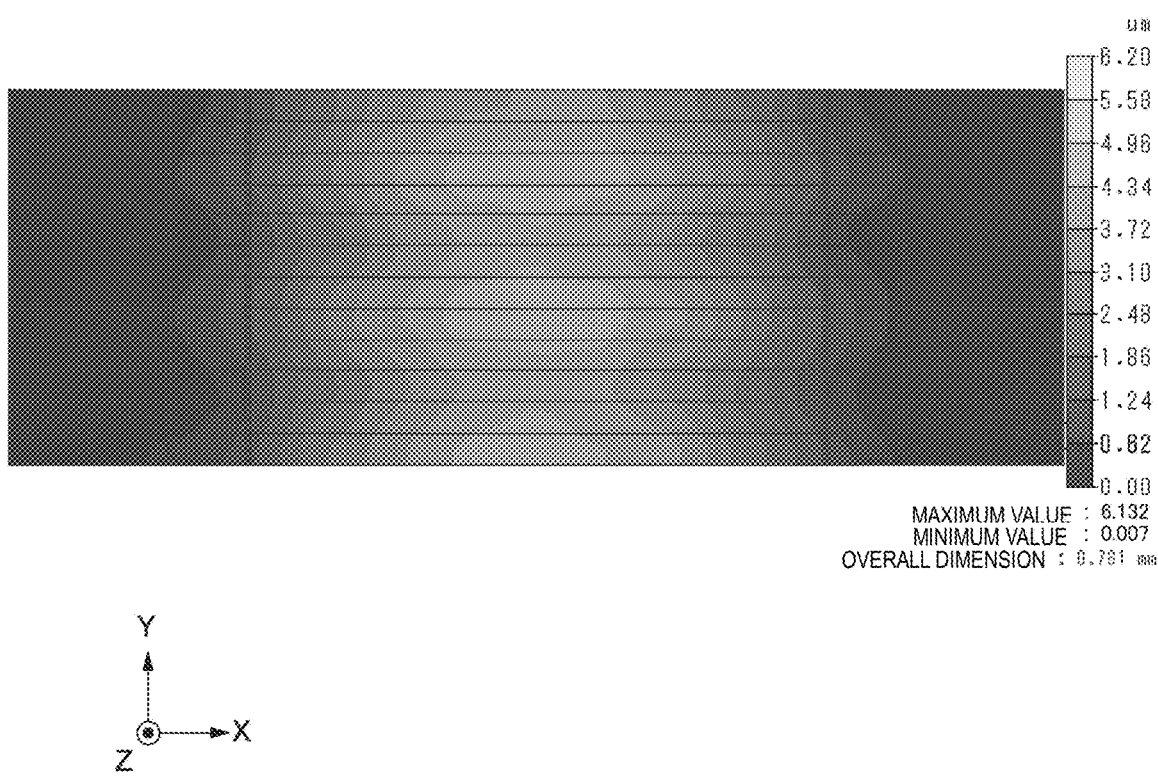
FIG. 11A illustrates simulation results for a front-surface side in the thickness direction of the vibration distribution of the crystal vibration element according to the fourth modification.
Figure 11B:
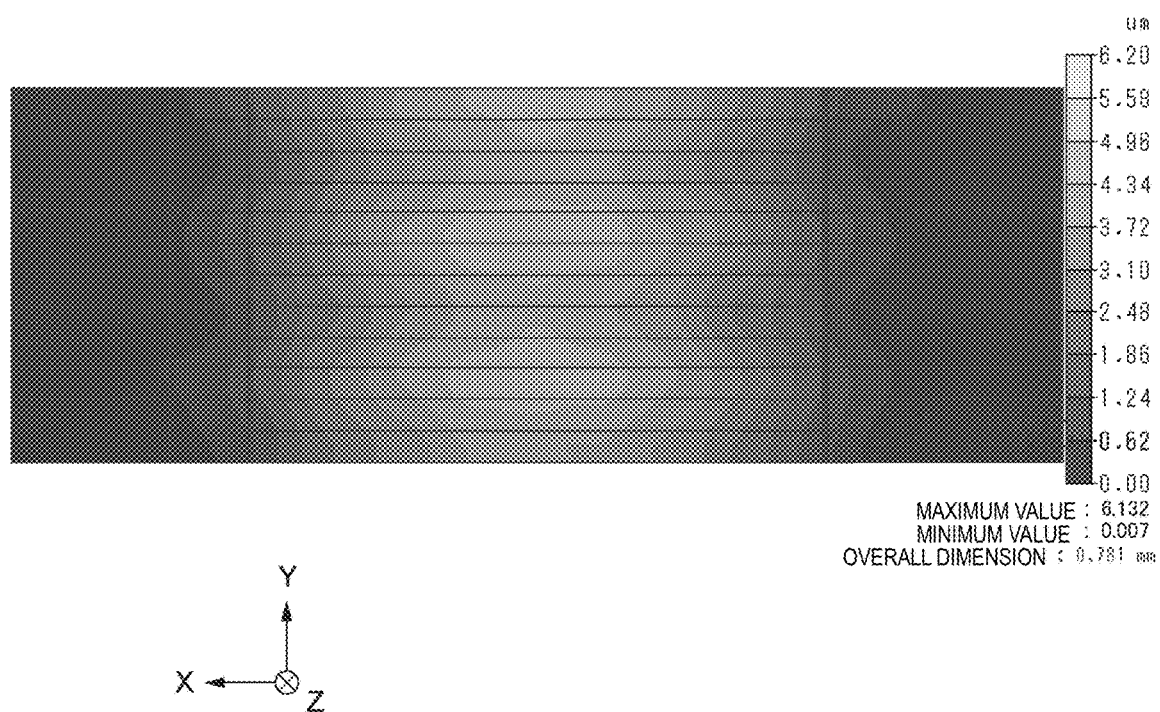
FIG. 11B illustrates simulation results for a rear-surface side in the thickness direction of the vibration distribution of the crystal vibration element according to the fourth modification.
Figure 11C:
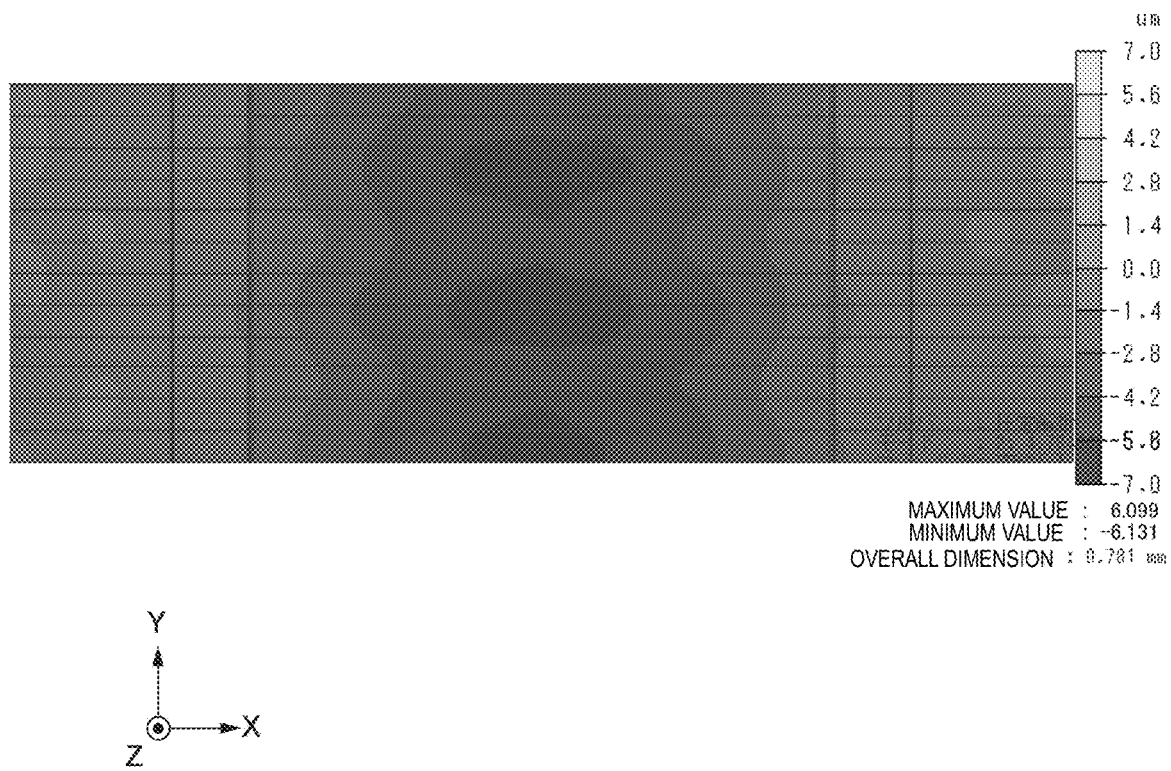
FIG. 11C illustrates simulation results of an X direction component at a front-surface side in the thickness direction of the vibration distribution (corresponding to X direction component of crystal orientation) of the crystal vibration element according to the fourth modification.
Figure 11D:
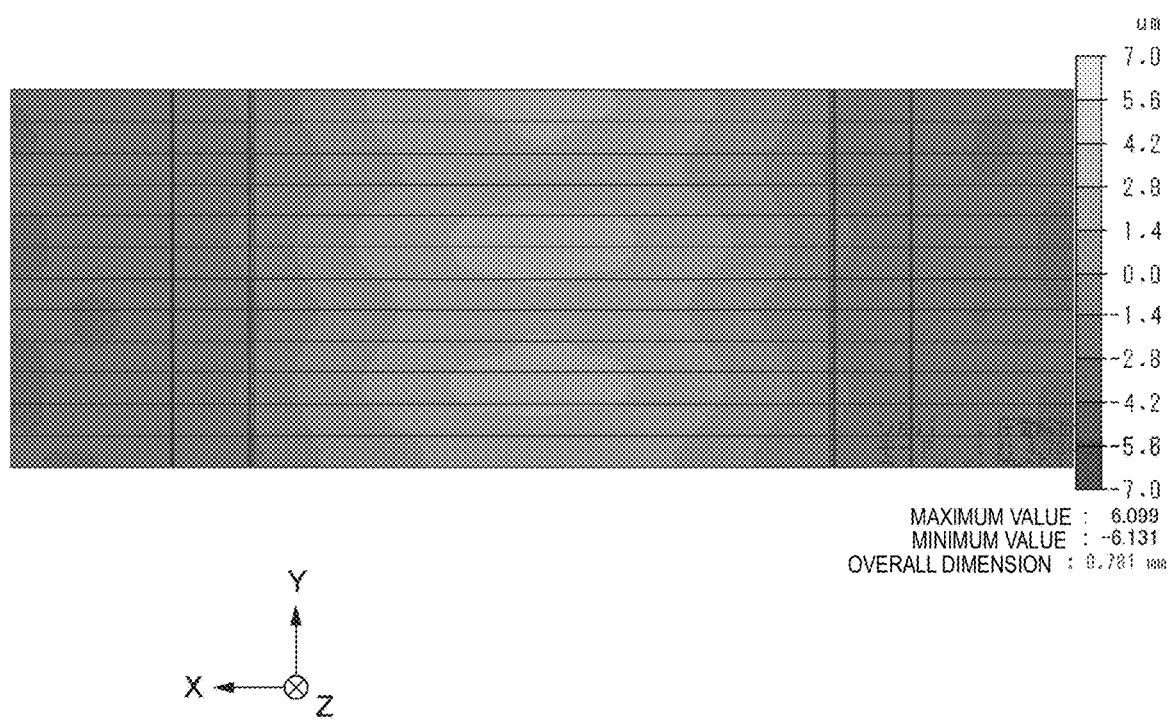
FIG. 11D illustrates simulation results of an X direction component at a rear-surface side in the thickness direction of the vibration distribution (corresponding to X direction component of crystal orientation) of the crystal vibration element according to the fourth modification.
Figure 11E:
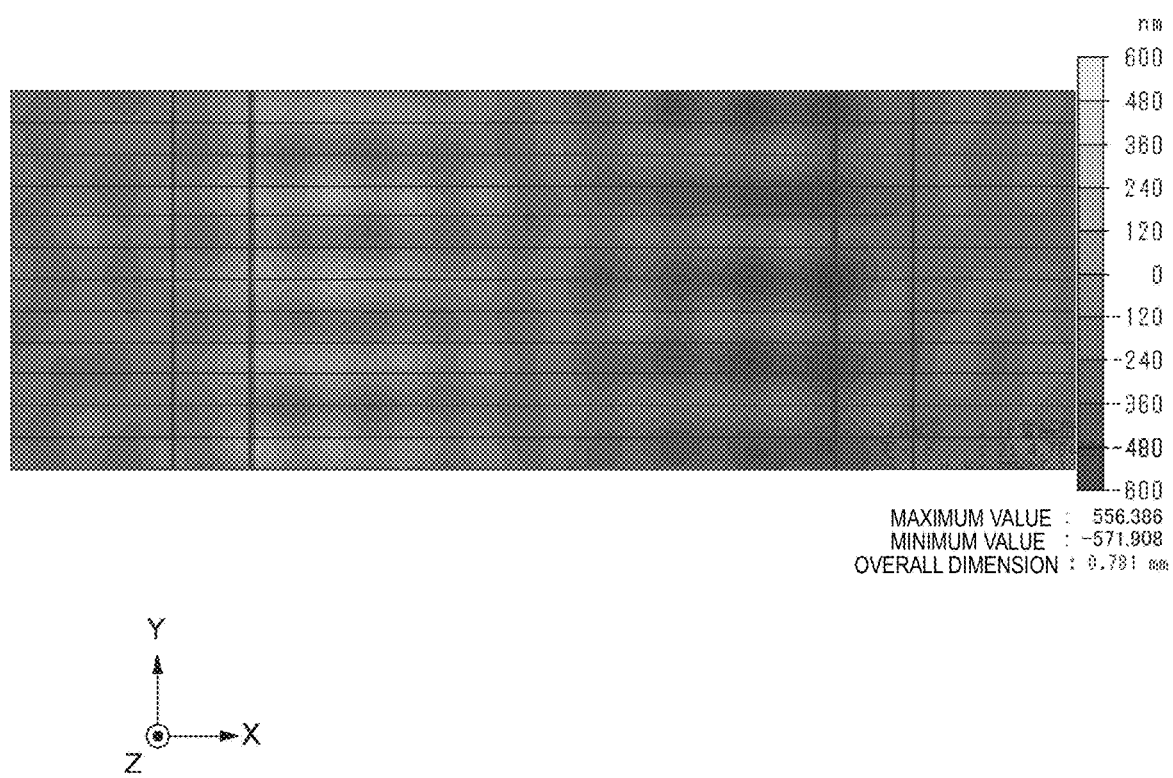
FIG. 11E illustrates simulation results of a Z direction component at a front-surface side in the thickness direction of the vibration distribution (corresponding to Y' direction component of crystal orientation) of the crystal vibration element according to the fourth modification.
Figure 11F:
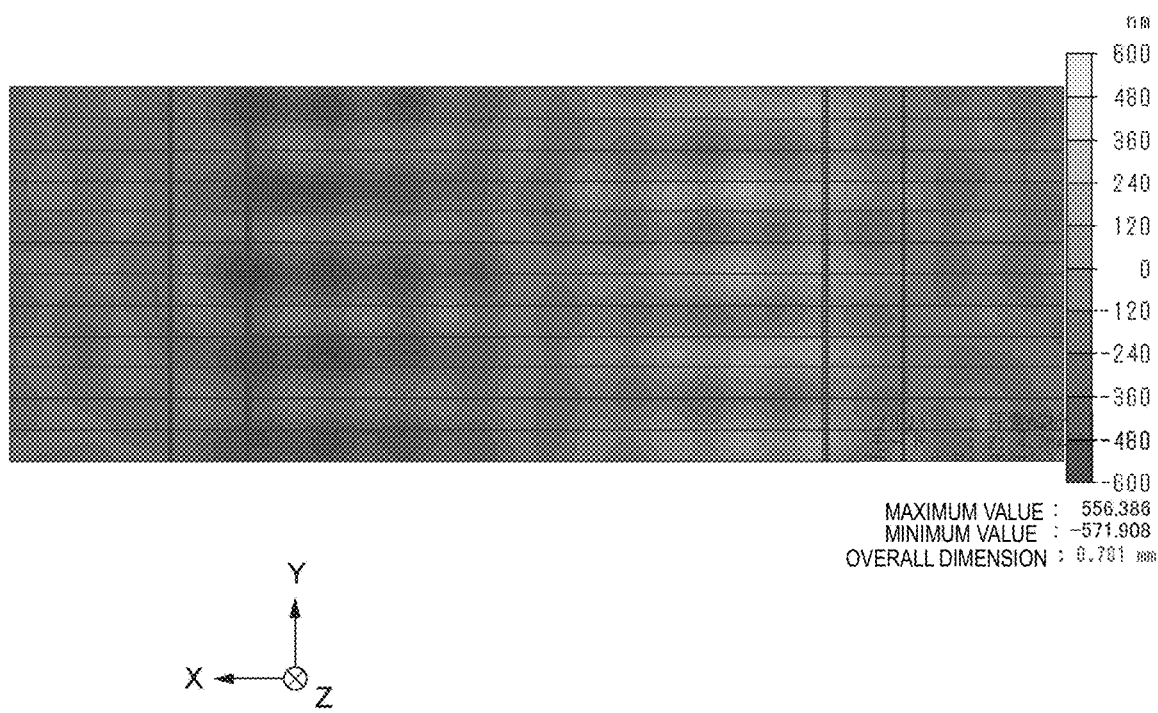
FIG. 11F illustrates simulation results of a Z direction component at a rear-surface side in the thickness direction of the vibration distribution (corresponding to Y' direction component of crystal orientation) of the crystal vibration element according to the fourth modification.
Figure 11G:
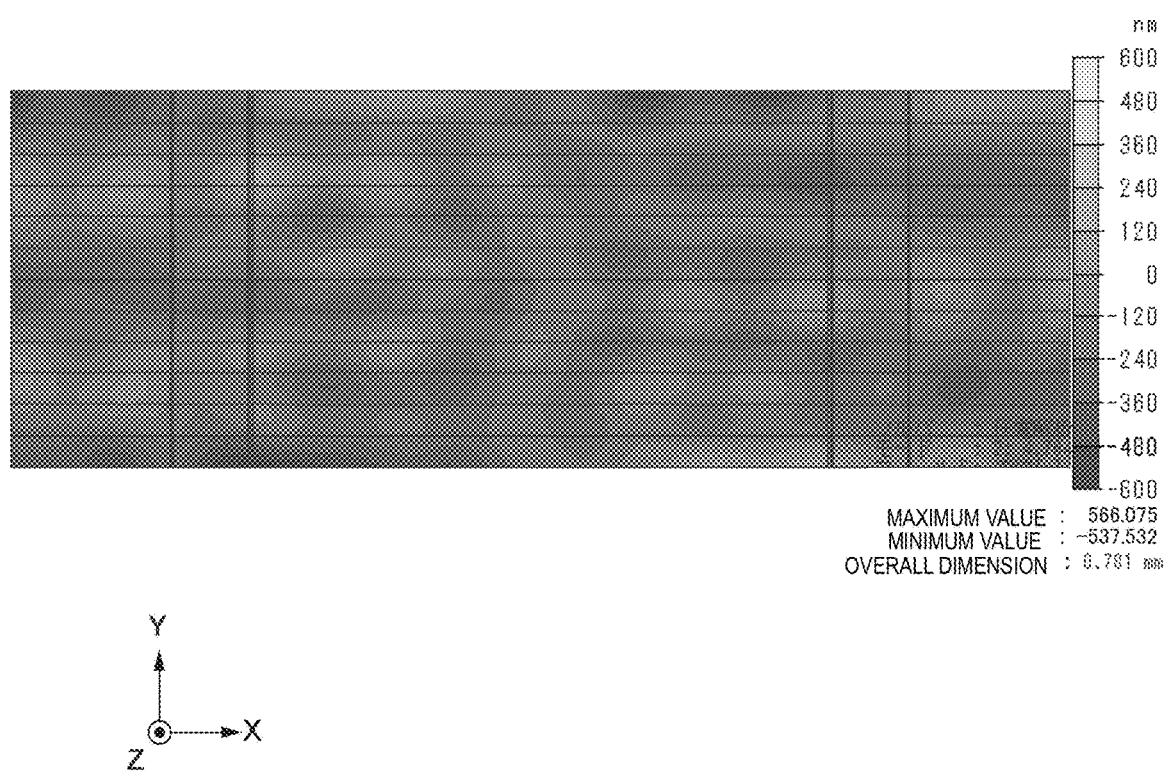
FIG. 11G illustrates simulation results of a Y direction component at a front-surface side in the thickness direction of the vibration distribution (corresponding to Z' direction component of crystal orientation) of the crystal vibration element according to the fourth modification.
Figure 11H:
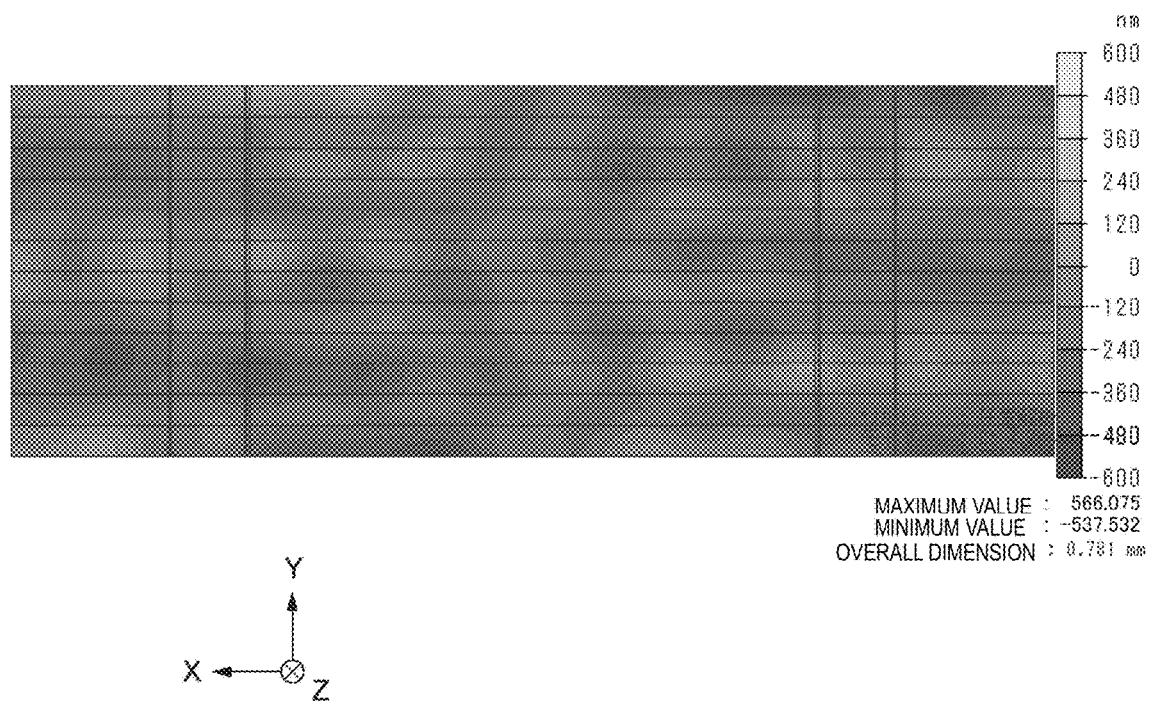
FIG. 11H illustrates simulation results of a Y direction component at a rear-surface side in the thickness direction of the vibration distribution (corresponding to Z' direction component of crystal orientation) of the crystal vibration element according to the fourth modification.
Figure 12A:
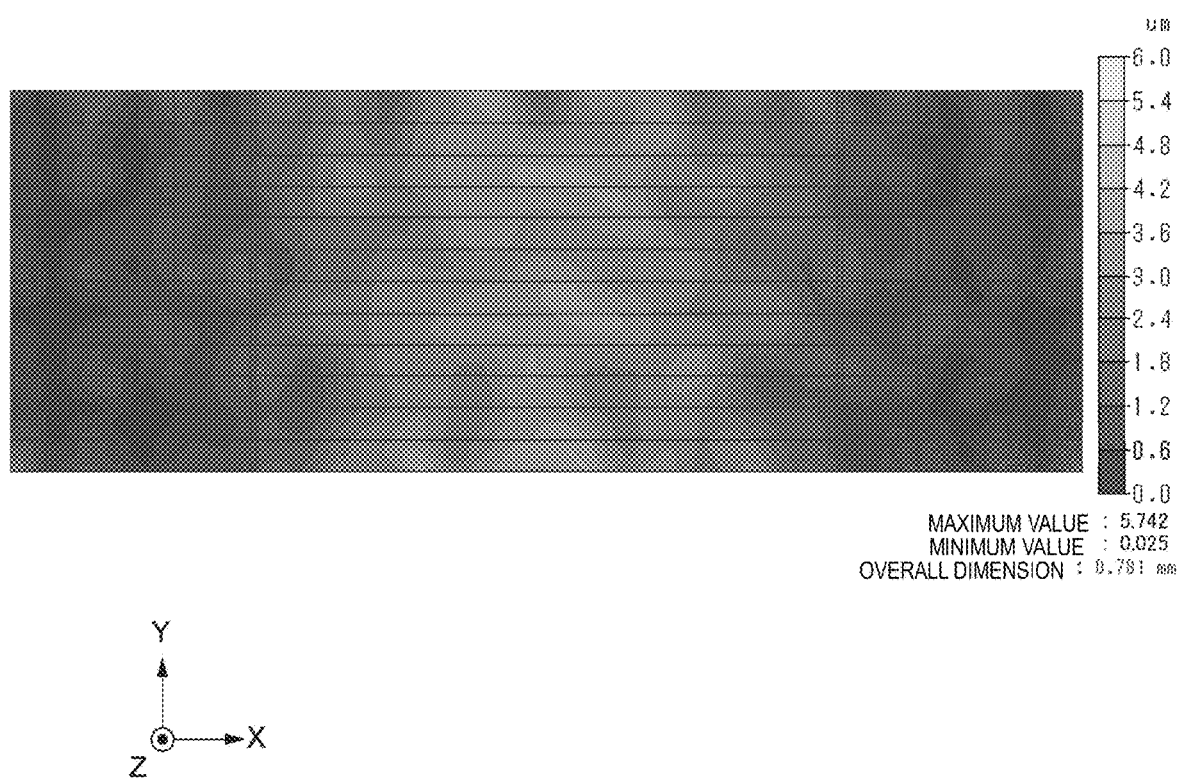
FIG. 12A illustrates simulation results of a front-surface side in the thickness direction of the vibration distribution of a crystal vibration element according to a comparative example.
Figure 12B:
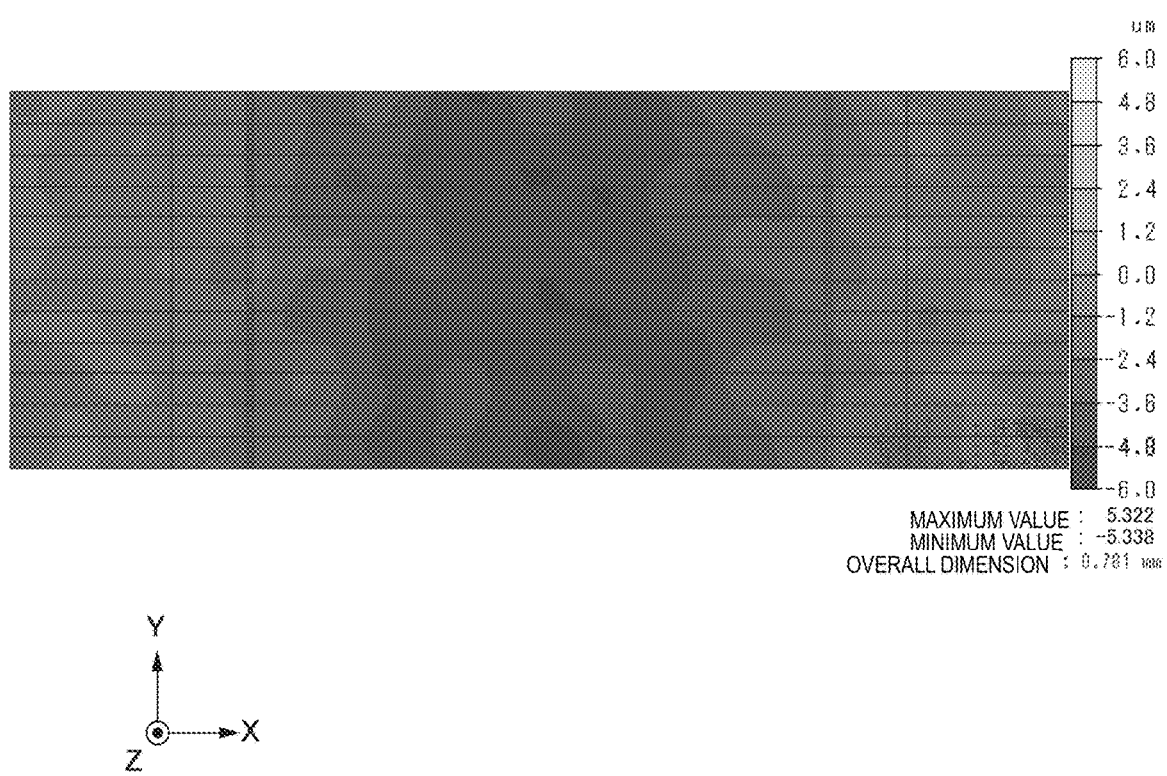
FIG. 12B illustrates simulation results of a rear-surface side in the thickness direction of the vibration distribution of the crystal vibration element according to the comparative example.
Figure 12C:
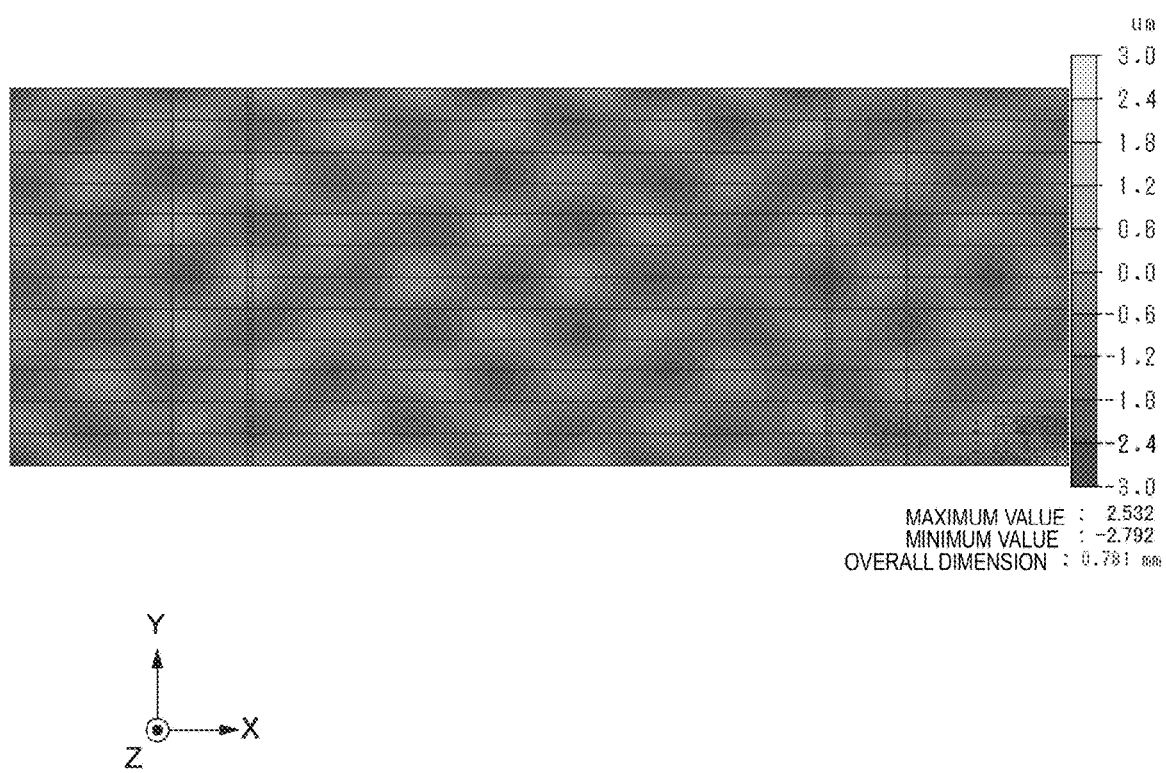
FIG. 12C illustrates simulation results of a Z direction component at a front-surface side in the thickness direction of the vibration distribution (corresponding to Y' direction component of crystal orientation) of the crystal vibration element according to the comparative example.
Figure 12D:
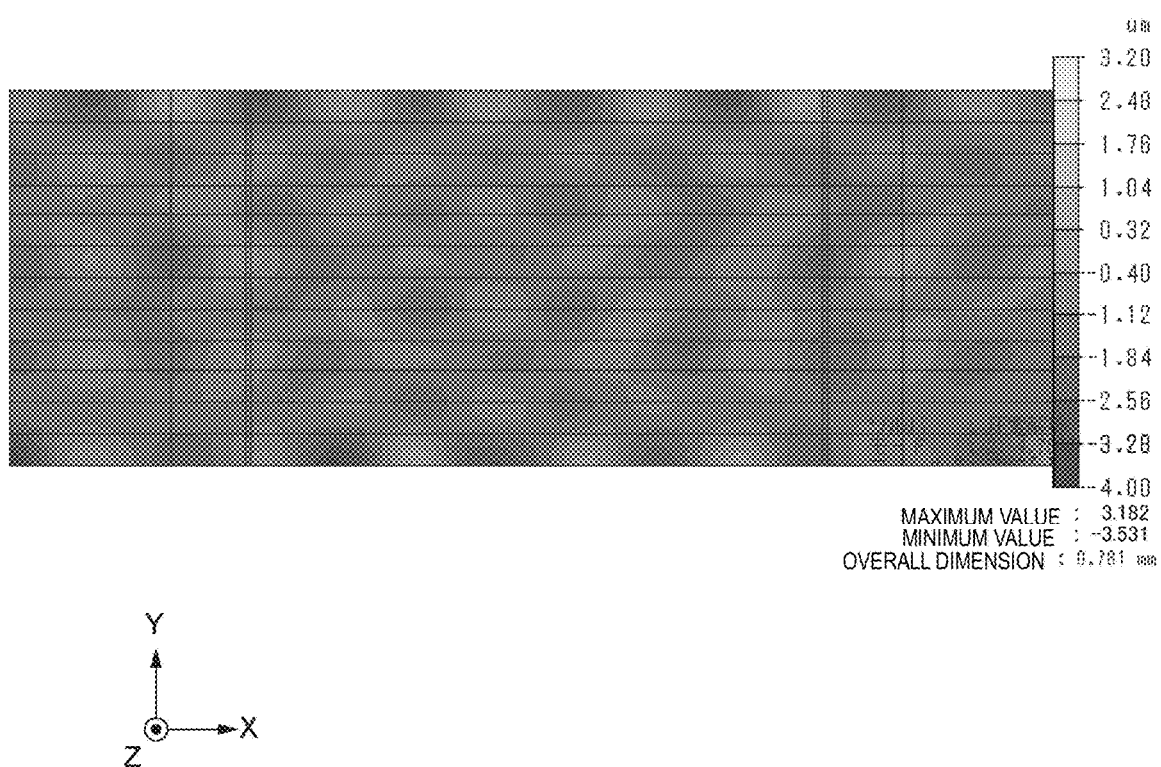
FIG. 12D illustrates simulation results of a Y direction component at a front-surface side in the thickness direction of the vibration distribution (corresponding to Z' direction component of crystal orientation) of the crystal vibration element according to the comparative example.

The crystal vibration element is not limited to the above-described configuration, and as a fourth modification described hereafter and illustrated in FIG. 10, a configuration may be used that includes a first part 243 having a thickness T, second parts 253 that are adjacent to the first part 243 at the two ends of the first part 243 in the X axis direction, and third parts 263 that are adjacent to the second parts 253 on the opposite sides from the first part 243, and in which a thickness Tpe of the second parts 253 is smaller than the thickness T of the first part 243. In this case, the thickness T of the first part 243 and a thickness Trm of the third parts 263 may be the same as each other. In other words, a configuration may be used that has, in a side view, groove portions (second parts 253) in parts that contact both ends of the vibration region in the X axis direction, the groove portions being thinner than the other parts and extending in the second direction. In this case as well, the second parts 253 may serve as non-vibration regions. In order to make it easier to grasp the dimensions of the crystal piece, illustration of the excitation electrode provided on the main surface on the positive Y' axis side, which is one of the pair of excitation electrodes provided with the thickness Tex in the vibration region of the crystal piece, is omitted from FIG. 10.

Patent Document 2 discloses a problem that if the thickness of a peripheral portion of a mesa shape is made small with respect to the thickness of a vibration region, a bending vibration is likely to be excited in addition to a thickness shear vibration, and as a result, the effect of energy confinement is reduced and size reduction is difficult. Specifically, in the case where the ratio between a thickness Tpe of the peripheral portion and a thickness T of the vibration region is 0.9, vibration energy leaks from the vibration region to the second parts, as in the comparative example in FIG. 8. However, by using the configuration according to the modification of the embodiment of the present invention, the energy confinement effect can be prevented from being degraded even when the ratio Tpe/T between the thicknesses of the peripheral portion and vibration region is 0.9 or higher.

As yet another modification, although a configuration is illustrated in FIG. 5 in which the crystal piece has a mesa shape, a configuration may instead be adopted that includes a first part having a vibration region, and second parts that are adjacent to the two ends of the first part in the X axis direction and that have substantially the same thickness as the first part. In other words, as illustrated in FIG. 3, a configuration in which the crystal piece has a rectangular parallelepiped shape may also be implemented. In the case of this configuration, once formula 1 above is satisfied, it is sufficient that the X axis direction length EL of the excitation electrodes that generate the vibration region and the effective thickness Te be determined so as satisfy the following formula 3.

$$EL/Te=1.603 \cdot n-0.292 \quad \text{Formula 3}$$

With this configuration as well, it is considered that an effect equivalent to that of the configuration illustrated in FIG. 5 can be obtained.

Figure 9A:
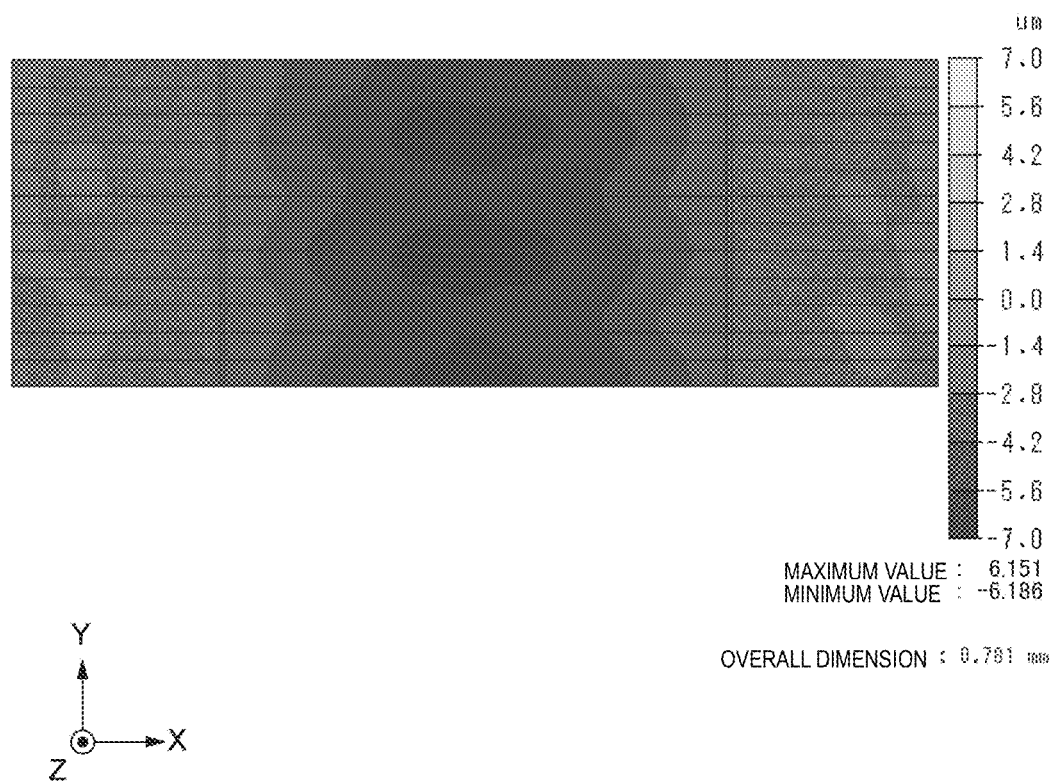
FIG. 9A illustrates simulation results of an X direction component of the vibration distribution (corresponding to X direction component of crystal orientation) of a crystal vibration element according to a third modification.
Figure 9B:
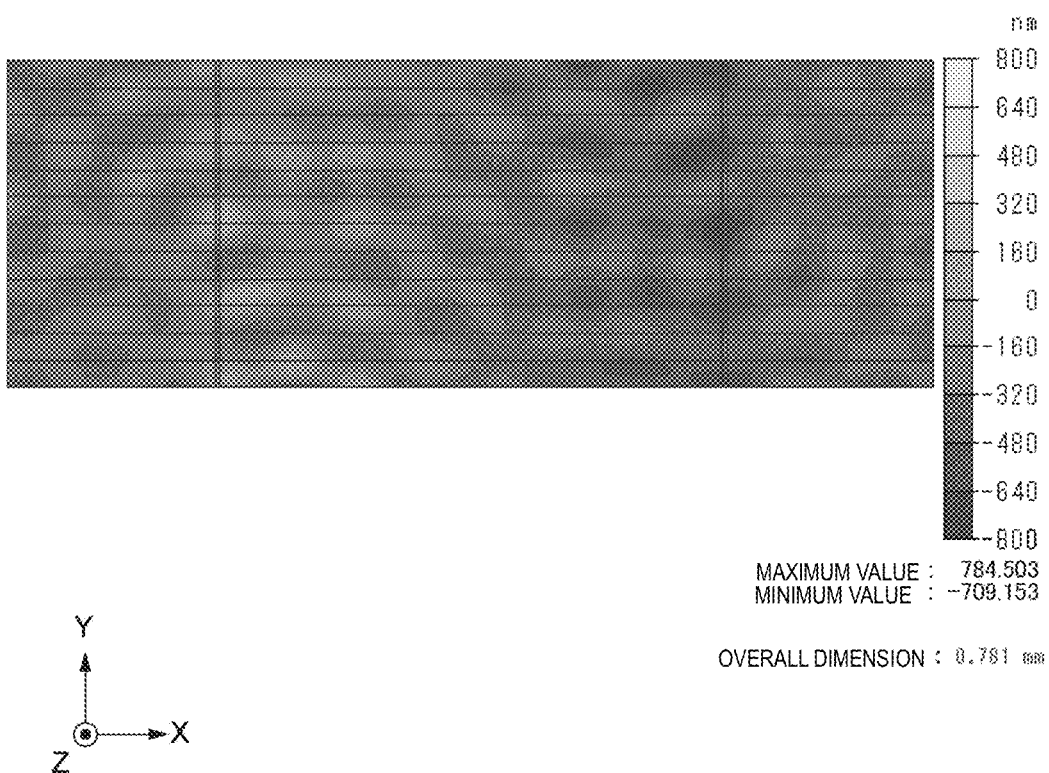
FIG. 9B illustrates simulation results of a Z direction component of the vibration distribution (corresponding to Y' direction component of crystal orientation) of the crystal vibration element according to the third modification.

FIGS. 9A and 9B illustrate a third modification, and illustrate simulation results for a mesa shape similar to that in FIG. 5. The conditions in the third modification are W=0.277 mm, T=0.033 mm, L=0.77 mm, EL=0.44 mm, D=0.0012 mm, Lt=0.165 mm, Tex=0.267 μm, and G/T=0, W/T=8.39, L/T=23.7, EL/T=12.8, Tpe/T=0.927.

FIGS. 10 to 11O illustrate a fourth modification. A crystal vibration element 216 illustrated in FIG. 10 includes a first part 243 having a thickness T, second parts 253 that are adjacent to the first part 243 at the two ends of the first part 243 in the X axis direction, and third parts 263 that are adjacent to the second parts 253 at the opposite sides from the first part 243, and the second parts 253 are thinner than the first part 243. Furthermore, the thicknesses of the first part 243 and the third parts 263 are the same as each other. The thus-structured crystal vibration element 216 is held on the substrate by conductive holding members at one of the third parts 263, for example. The conditions in the fourth modification are W=0.277 mm, T=0.033 mm, L=0.77 mm, EL=0.44 mm, D=0.0012 mm, Lt=0.11 mm, Lh=around 0.055 mm and Tex=0.267 μm, and G/T=0, W/T=8.39, L/T=23.7 and EL/T=12.8. Lh is calculated from the relational formula Lh≈(L−EL−2Lt)/2.

Next, vibration states of the crystal vibration element according to the fourth modification will be described while referring to FIGS. 11I to 11O. FIGS. 11I to 11O illustrate simulation results of the vibration distribution for the front-surface side in the thickness direction, and illustrates vibration states that exist when the phase is shifted in units of around 45° from a phase of 0° to around 225°. In each of the figures, similarly to FIG. 11A, the magnitude of displacement is represented by being divided into ten gradations, and the lighter the shade of greyscale, the larger the amount of displacement. The phases in each figure are approximate values. The positions of the points in the models are displaced in proportion to the displacements in the vibration distribution.

FIG. 11I illustrates simulation results for a vibration state of a phase of 0° in the case where the displacement is largest on the negative side in the X direction of the simulation results (left side of screen). As illustrated in FIG. 11I, there are three largest-displacement regions (regions having the brightest grayscale shade in FIG. 11I), specifically, there are a first region, a second region and a third region located in a substantially central portion in the X direction. The first region is at the position of the long side on the negative side in the Y direction, the second region is at a position shifted toward the positive side in the Y direction from the first region, and the third region is at a position shifted toward the positive side in the Y direction from the second region. The first region has a semi-elliptical shape obtained by vertically halving an ellipse having a longitudinal axe in the X axis direction. In addition, the second and third regions have elliptical shapes having longitudinal axes that extend in the X axis direction. The largest-displacement regions illustrated in FIG. 11I are strong vibration regions that represent amounts of displacement of 90% or more of the maximum amount of displacement.

FIG. 11J illustrates simulation results for a phase of around 45°. In FIG. 11J, the largest value of displacement is reduced, and the positions of the largest-displacement regions are shifted toward the positive side in the X direction in response to this reduction, but the model points (mesh) are the same as for a phase of 0°. The vibration distribution inclination is similar to that for a phase of 0°. In addition, the positions of the boundaries between the vibration region and the non-vibration regions are substantially the same as those in the case of a phase of 0°.

FIG. 11K illustrates simulation results for a phase of around 90°. As the phase advances, the largest values of displacement decrease further, and the positions of the largest-displacement regions are shifted further toward the positive side in the X direction. In addition, the length of the vibration region in the X direction gradually decreases as the phase advances from a phase of 0°, and displacement does not appear over the entire front surface in the case where the phase is around 90°.

FIG. 11L illustrates simulation results for a phase of around 135°. When the phase advances from a phase of around 90°, a vibration region appears once again, and as the phase advances, the X direction length of the vibration region increases. At a phase of around 135°, the positions of the largest-displacement regions are the inverse of those in the case where the phase is 45° with respect to the X direction.

FIG. 11M illustrates simulation results for a phase of around 180°. As the phase advances from around 135°, the largest values of displacement increase, and at a phase of around 180°, the positions of the largest-displacement regions are the inverse of those for a phase of 0° with respect to the X direction. The largest-displacement regions illustrated in FIG. 11M are strong vibration regions that represent amounts of displacement of 90% or more of the maximum amount of displacement.

FIG. 11N illustrates simulation results for a phase of around 225°. As the phase advances from a phase of around 180°, the largest values of displacement decrease, and the positions of the largest-displacement regions are shifted toward the negative side in the X direction. In addition, the positions of the largest-displacement regions are substantially the same for a phase of 0°, a phase of around 45°, a phase of around 135°, a phase of around 180° and a phase of around 225°.

FIG. 11O illustrates simulation results for a phase of around 270°. As the phase advances, the largest values of displacement decrease further, and the positions of the largest-displacement regions are shifted further toward the negative side in the X direction. In addition, the length of the vibration region in the X direction gradually decreases as the phase advances from a phase of 180°, and displacement does not appear over the entire front surface in the case where the phase is around 270°.

As described above, it is clear from the transitions in the vibrational displacement distribution that the vibration of this example has antinodes, the specific positions of which are always points of maximum displacement, a vibration distribution in which displacement in the vicinity of the antinodes has a semi-elliptical or elliptical shape, and nodes at both ends in the X direction that are always points of smallest displacement, and it is clear that the crystal vibration element vibrates with a stationary wave. In addition, the fact that the positions of the points of maximum displacement appear to be different from the positions of the antinodes at a phase of 0° and a phase of about 180° is because the positions of the individual parts of the model are displaced positively and negatively in the various directions in accordance with whether the generated displacements are positive or negative in the various directions.

FIGS. 12A to 12D illustrate a comparative example. This comparative example is obtained by changing the numerical value of the length W of the short sides of the crystal piece of the fourth modification. That is, the conditions in the comparative example are W=0.260 mm, T=0.033 mm, L=0.77 mm, EL=0.44 mm, D=0.0012 mm, Lt=0.11 mm, Lh=around 0.055 mm and Tex=0.267 μm, and G/T=0, W/T=7.88, L/T=23.7 and EL/T=12.8.

<Evaluation>

Figure 13:
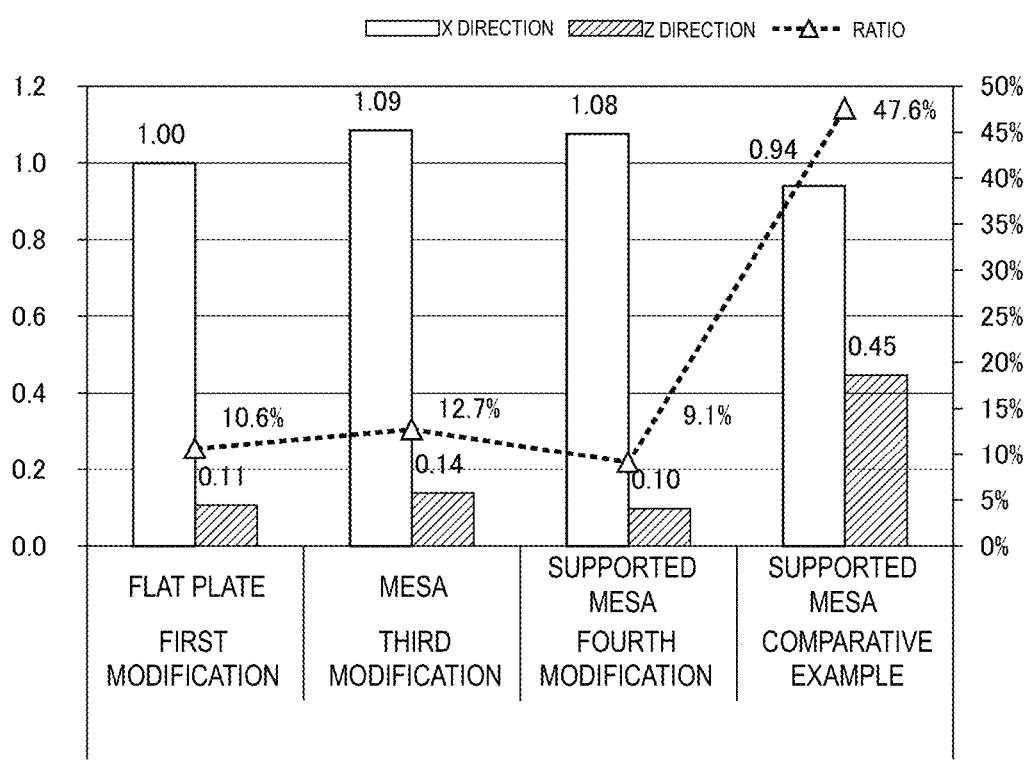
FIG. 13 illustrates a graph in which the vibration states in the first modification, the third modification, the fourth modification and the comparative example are compared with each other.

Next, the first modification, the third modification, the fourth modification and the comparative example will be evaluated. FIG. 13 illustrates a graph in which the vibration states in the first modification, the third modification, the fourth modification and the comparative example are compared with each other. The XYZ axes of the simulation model (corresponding to XZ'Y' axes of crystal orientation) are referred to in the following description of the evaluation.

In FIG. 13, using the largest amplitude strength of the X direction component (main vibration direction of thickness shear vibration) of a flat plate (without mesa shape) according to the first modification as a reference, Z direction components are expressed as ratios with respect to this reference and ratios of the Z components with respect to the corresponding X components are illustrated as percentages. FIG. 13 illustrates the vibration distribution of a full-width thickness shear mode in a flat plate (first modification), the vibration distribution of a full-width thickness shear mode in a mesa (third modification), the vibration distribution of a full-width thickness shear mode in a supported mesa (fourth modification) and the vibration distribution of a non-full-width thickness shear mode in a supported mesa. In the crystal vibration elements according to the first modification, the third modification and the fourth modification, strong vibration regions that represent a strength of 80% or more of the absolute value of the maximum strength of the amplitude component of the X direction component are arrayed in the Y direction (Z' direction of crystal orientation) and are distributed in elliptical shapes that are elongated in the X direction, and when a main surface of the crystal piece is viewed in plan, the strong vibration regions are not superposed with each other at the front and rear main surfaces of the crystal piece and have opposite phases from each other.

According to FIG. 13, the confinement state of the vibration region (mesa protruding portion) is improved and the amplitude strength of the X direction component is increased by 9% compared with the flat plate due to the mesa shape of the third modification. On the other hand, the Z (thickness) direction component increases from 0.11 to 0.14. It is thought that the cause of this is that the simulation model assumes that the crystal piece is subjected to etching processing, and rather than giving the step portion a right angle shape, in order to take the anisotropy of etching due to the crystal orientation into consideration, the step portion is given a non-symmetrical shape in the X direction so as to have an inclination of 55° on the positive side of the step portion in the X direction on the front main surface and an inclination of 33° on the negative side of the step portion in the X direction, and therefore a Z (thickness) direction vibration is excited as a sub vibration of the X direction thickness shear vibration due to the asymmetry of the vibration.

Furthermore, with the supported mesa according to the fourth modification, the confinement state of the vibration region (mesa protruding portion) is improved and the amplitude strength of the X direction component is increased by 8% compared with the flat plate. In addition, it is thought that the vibration strength of the Z direction component is reduced due to the symmetry of the shape of the step portion being improved by increasing the thickness of the support portions (non-vibration portions), which are the third parts 263 (refer to FIG. 10). On the other hand, although the mass is increased due to the increased thickness of the support portions, the vibration strength of the X direction component is increased by 8% to 1.08 compared to the flat plate, and a decrease in the vibration strength of the X direction component of the mesa having a small mass is limited to just 0.01 from 1.09.

Furthermore, in the case of the supported mesa according to the comparative example, the confinement state of the vibration region (mesa protruding portion) is reduced and the amplitude strength of the X direction component is reduced by 6% compared with the flat plate. In addition, a vibration of a Z (thickness) direction component is excited as a sub-vibration of the X direction thickness shear vibration, and the vibration strength of the Z (thickness) direction component greatly increases to 0.45 and the ratio of the Z (thickness) direction component to the X direction component increases to 47.6%. This is thought to be because the X direction bending vibration is not confined to the thickness shear vibration region, and in addition to the thickness shear vibration having a main vibration in the X direction component, a bending vibration having a main vibration in a Z direction (thickness) component is not confined to a mesa protruding portion, and the concentration of energy in the thickness shear vibration is reduced.

In addition, in order to evaluate vibration leakage into the support portions in the case of a supported mesa, the ratio of the maximum displacement of thick support portions (flanges) provided at the two ends of the crystal piece in the first direction with respect to the maximum displacement inside the vibration region was obtained (not illustrated). This ratio was 0.03 in the case of the fourth modification, and 0.17 in the case of simple thickness shear vibration, that is, non-full-width thickness shear vibration, in the comparative example (W/T=7.88). Thus, compared with the simple thickness shear vibration, an effect can be obtained in that non-vibration regions are not provided on both sides of the excitation electrodes of the crystal piece in the width direction vibration and vibration leakage from the vibration region can be reduced by implementing full-width thickness shear vibration.

Figure 14:
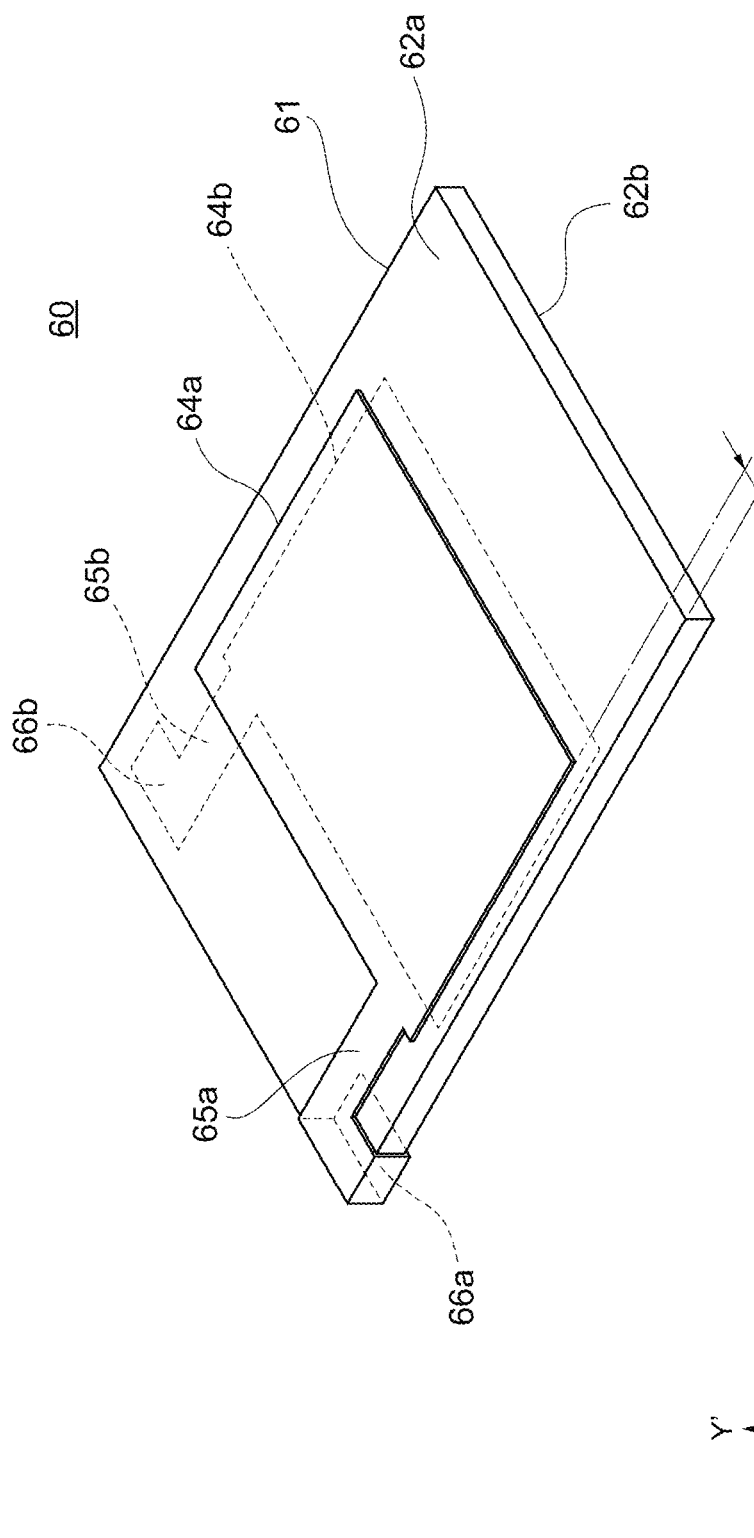
FIG. 14 illustrates a crystal vibration element according to a fifth modification of the present invention.

Next, a fifth modification of a crystal vibration element 60 will be described while referring to FIG. 14. Hereafter, points that are different from the above-described content will be described.

The crystal vibration element 60 includes a crystal piece 61, a first excitation electrode 64a that is provided on a first surface 62a (front surface), which a main surface, of the crystal piece 61, and a second excitation electrode 64b that is provided on a second surface 62b (rear surface), which is a main surface, of the crystal piece 61 that opposes the first surface 62a.

In this example, when the XZ' plane is viewed in plan, the short side of the first excitation electrode 64a on the positive Z' axis direction side is provided so that there is a gap between the short side of the first excitation electrode 64a and the long side of the crystal piece 61 on the positive Z' axis direction side. In addition, the short side of the first excitation electrode 64a on the negative Z' axis direction side is provided so that there is a gap between the short side of the first excitation electrode 64a and the long side of the crystal piece 61 on the negative Z' axis direction side.

In addition, similarly for the second excitation electrode 64b, when the XZ' plane is viewed in plan, the short side of the second excitation electrode 64b on the positive Z' axis direction side is provided so that there is a gap between the short side of the second excitation electrode 64b and the long side of the crystal piece 61 on the positive Z' axis direction side. In addition, the short side of the second excitation electrode 64b on the negative Z' axis direction side is provided so that there is a gap between the short side of the second excitation electrode 64b and the long side of the crystal piece 61 on the negative Z' axis direction side.

In other words, the two short sides of the first excitation electrode 64a are provided on the first surface 62a of the crystal piece 61 so that there are gaps between the short sides of the first excitation electrode 64a and the two long sides of the crystal piece 61. In addition, the two short sides of the second excitation electrode 64b are provided on the second surface 62b of the crystal piece 61 so that there are gaps between the short sides of the second excitation electrode 64b and the two long sides of the crystal piece 61. A size G of these gaps is 0<G≤20 μm, for example. The size G of the gaps from the ridgelines of the side surfaces in the X direction preferably falls within a range in which an electric field is applied to the Z' axis direction side surfaces of the crystal piece 61 by an alternating electric field applied between the first excitation electrode 64a and the second excitation electrode 64b.

The size G of the gaps is preferably substantially uniform along the sides of the excitation electrodes. Furthermore, the sizes G of the gaps are preferably substantially the same at one side and the other side of the first excitation electrode 64a, and the sizes G of the gaps are preferably substantially the same at one side and the other side of the second excitation electrode 64b. As a modification, the size G of the gaps may be different along parts of the sides of the excitation electrodes. In addition, the sizes of the gaps G may be different along the one side and the other side of either of the first excitation electrode 64a and the second excitation electrode 64b.

In this modification as well, a vibration mode is generated in which the main vibration is a thickness shear vibration generated when an alternating electric field of a prescribed oscillation frequency, for example, the AT-cut fundamental oscillation frequency, is applied, and the vibration distribution of this vibration mode is substantially the same as in the content described above on the basis of FIG. 4A. In addition, in this modification as well, when the XZ' plane is viewed in plan, the vibration region extends in a band-like shape in the Z' axis direction of the crystal piece 61 similarly to the vibration region 40 illustrated in FIG. 4A, and extends beyond the two short sides of the first excitation electrode 64a and the second excitation electrode 64b illustrated in FIG. 14 toward the outside. In other words, the vibration region formed by the first excitation electrode 64a and the second excitation electrode 64b in FIG. 14 has a band-like shape that extends in a continuous manner from one long side of the crystal piece 61 that is parallel to the X axis direction to the other long side of the crystal piece 61 that is similarly parallel to the X axis direction. In this modification as well, the non-vibration regions 50a and 50b illustrated in FIG. 4A are adjacent to the two sides of the vibration region in the X axis direction of the crystal piece 61.

In addition, a connection electrode 66a that is electrically connected to the first excitation electrode 64a via an extension electrode 65a and a connection electrode 66b that is electrically connected to the second excitation electrode 64b via an extension electrode 65b are formed on the crystal piece 61.

As described above, in the modification of this embodiment as well, excellent vibration characteristics can be obtained as a result of a full-width thickness shear mode being generated along the Z' axis direction of the crystal piece 61.

Second Embodiment

Figure 15:
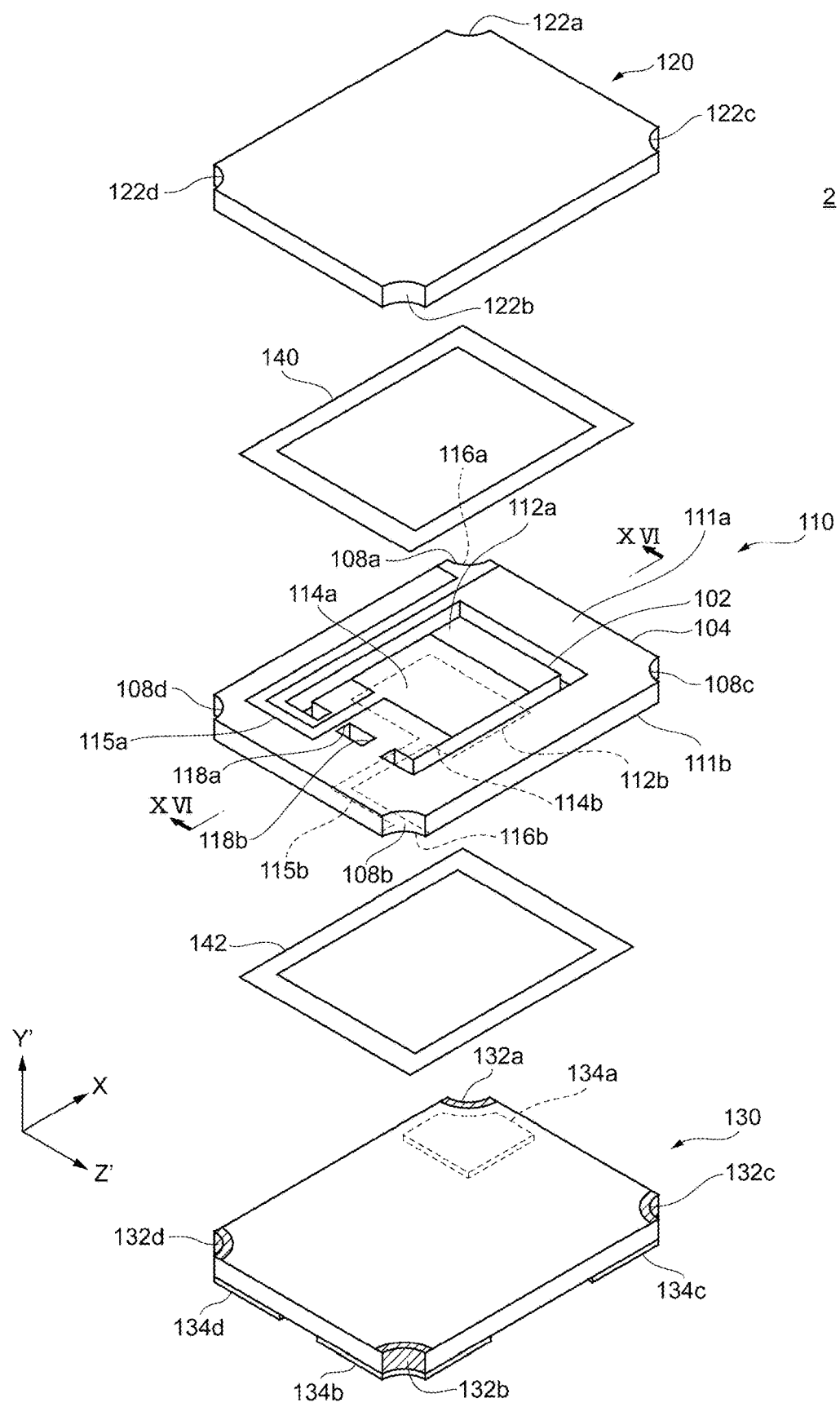
FIG. 15 is an exploded perspective view of a crystal vibrator according to a second embodiment of the present invention.
Figure 16:
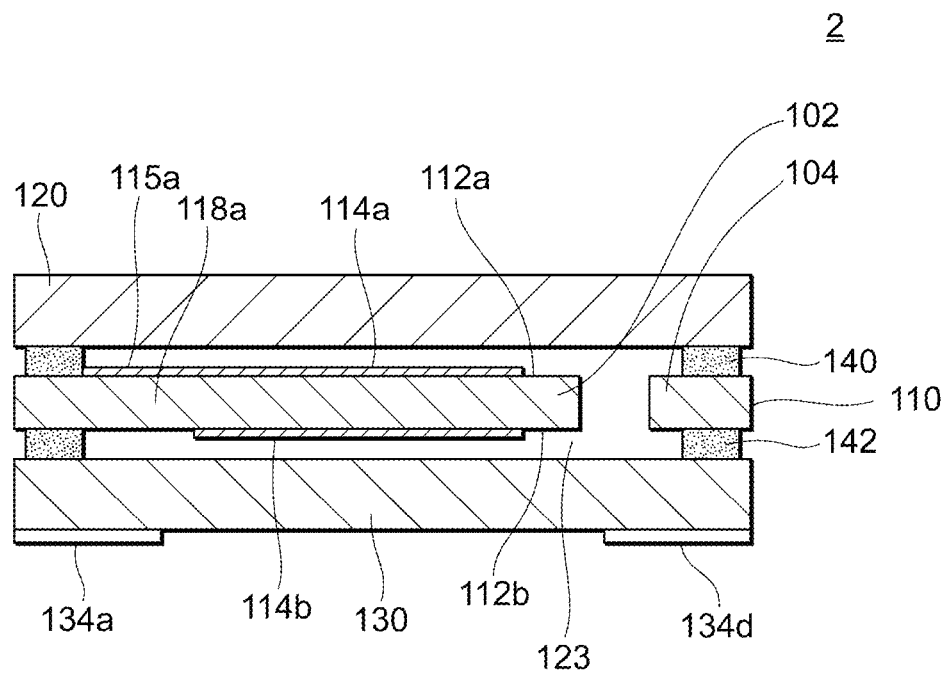
FIG. 16 is a sectional view taken along line XVI-XVI in FIG. 15.

Next, a crystal vibrator 2 according to a second embodiment of the present invention will be described while referring to FIGS. 15 and 16. Here, FIG. 15 is an exploded perspective view of the crystal vibrator 2, and FIG. 16 is a sectional view taken along line XVI-XVI in FIG. 15. This embodiment differs from the first embodiment in terms of the form of the packaging of the crystal vibrator 2, and the same configurations as in the first embodiment can be used for a crystal piece 102 of a crystal vibration element 110 and for the shapes, dimensions and positional relationship of a first excitation electrode 114a and a second excitation electrode 114b of the crystal vibration element 110. Hereafter, the points that are different from the content of the first embodiment will be described.

As illustrated in FIG. 15, the crystal vibrator 2 according to this embodiment includes the crystal vibration element 110, a first substrate 120 and a second substrate 130.

In this modification, the first and second substrates 120 and 130 form a case or package for accommodating the crystal piece 102 of the crystal vibration element 110. The crystal vibration element 110, the first substrate 120 and the second substrate 130 have substantially the same dimensions and shape (rectangular shape) as each other in the XZ' plane. In the case where a manufacturing method is adopted in which manufacturing is performed up to step of packaging the crystal pieces with the elements still in a wafer state such as wafer level chip size packaging "WLCSP", a three-layer structure made up of a wafer corresponding to the first substrate 120, a wafer corresponding to the crystal vibration element 110 and a wafer corresponding to the second substrate 130 are processed together in one batch, and then the structure is divided into individual crystal vibrators 2 using a dicing saw. Therefore, the crystal vibration element 110, the first substrate 120 and the second substrate 130 have substantially the same dimensions and shape.

The crystal vibration element 110 includes the crystal piece 102, a frame body 104 that surrounds the periphery of the crystal piece 102, and connection members 118a and 118b that connect the crystal piece 102 and the frame body 104 to each other. The frame body 104 is an example of a support body that is for supporting the crystal piece 102. The crystal piece 102, the frame body 104 and the connection members 118a and 118b are formed of a crystal material having a prescribed crystal orientation, for example, are formed of an AT-cut crystal material.

The thickness of the crystal vibration element 110 in the Y' axis direction is not particularly limited, and, for example, as illustrated in FIG. 16, the crystal piece 102, the frame body 104 and the connection members 118a and 118b may all have the same thickness. Alternatively, a structure that is similar to a mesa structure may be adopted by making the thicknesses of the connection members 118a and 118b smaller than that of the crystal piece 102 in order to improve the confinement of vibration energy.

The crystal vibration element 110 has long sides that extend in the X axis direction, short sides that extend in the Z' axis direction and a thickness in the Y' axis direction. In the example illustrated in FIG. 15, the connection members 118a and 118b are each arranged at one end of the long sides of the crystal piece 102 in the X axis direction. The crystal piece 102 is provided so as to be separated from the frame body 104, and the crystal piece 102 and the frame body 104 are connected to each other by the connection members 118a and 118b. In the example illustrated in FIG. 15, two connection members that are arranged at one end of the long sides are illustrated, but the number of connection members, the arrangement of the connection members and so forth are not particularly limited. For example, one connection member that is arranged at one end of the long sides may be used as a connection member, or one of two connection members may be arranged at one end of the long sides and the other of the two connection members may be arranged at the other end of the long sides.

The crystal vibration element 110 has notched side surfaces 108a, 108b, 108c and 108d that are formed by cutting away part of each corner to form a cylindrical curved surface shape. In addition, similarly, notched side surfaces 122a, 122b, 122c and 122d are formed in the first substrate 120, and notched side surfaces 132a, 132b, 132c and 132d are formed in the second substrate 130. These notched side surfaces are formed when a manufacturing method is adopted in which manufacturing is performed up to the packaging stage with the elements still in a wafer state such as WLCSP. In this case, for example, the notched side surfaces 108a, 122a and 132a among the notched side surfaces of the crystal vibration element 110, the first substrate 120 and the second substrate 130 are formed in one go in the Y' axis direction. In addition, the shape of the notched side surfaces may be a shape other than a cylindrical curved surface shape, or alternatively such notches do not necessarily have to be formed.

The first and second excitation electrodes 114a and 114b are respectively formed on the front and rear surfaces of the crystal piece 102. The first excitation electrode 114a is provided on a first surface 112a (front surface) of the crystal piece 102, and the second excitation electrode 114b is provided on a second surface 112b (rear surface), which opposes the first surface 112a, of the crystal piece 102. The first and second excitation electrodes 114a and 114b are arranged as a pair of electrodes so as to be substantially entirely superposed with each other with the crystal piece 102 interposed therebetween when the XZ' plane is viewed in plan. The excitation electrodes 114a and 114b have a rectangular shape in the XZ' plane, and for example, are provided such that the long sides of the excitation electrodes are parallel to the short sides of the crystal piece 102 and such that the short sides of the excitation electrodes are parallel to the long sides of the crystal piece 102, as illustrated in FIG. 15.

An extension electrode 115a, which is electrically connected to the first excitation electrode 114a, is formed on a first surface 111a of the frame body 104. The extension electrode 115a extends from the first excitation electrode 114a along one connection member 118a, then extends toward the notched side surface 108a along the first surface 111a of the frame body 104, and is electrically connected to a connection electrode 116a that is formed on a second surface 111b of the frame body 104. On the other hand, an extension electrode 115b, which is electrically connected to the second excitation electrode 114b, is formed on the second surface 111b of the frame body 104. The extension electrode 115b extends from the second excitation electrode 114b along the other connection member 118b, and then extends toward the notched side surface 108b in the corner along the second surface 111b of the frame body 104, and is electrically connected to a connection electrode 116b that is formed on the second surface 111b of the frame body 104. Thus, the connection electrodes 116a and 116b, which are electrically connected to the first and second excitation electrodes 114a and 114b, are arranged at opposite corners of the frame body 104 in the example illustrated in FIG. 15.

The arrangement of the connection electrodes 116a and 116b, which are electrically connected to the first and second excitation electrodes 114a and 114b, is not particularly limited, and for example, the connection electrodes 116a and 116b may be arranged at two corners of the frame body 104 on the negative X axis direction side, that is, at the notched side surfaces 108d and 108b.

The first and second excitation electrodes 114a and 114b, the extension electrodes 115a and 115b, and the connection electrodes 116a and 116b, for example, may be formed by forming a chromium (Cr) layer as a base layer and forming a gold (Au) layer on the surface of the chromium layer, but the electrodes are not limited to these materials.

The first substrate 120 is arranged on the first surface 112a side of the crystal piece 102. The second substrate 130 is arranged on the second surface 112b side of the crystal piece 102. In other words, the first substrate 120, the crystal vibration element 110 and the second substrate 130 are stacked on top of one another in this order and form a three-layer structure. The second substrate 130 has an installation surface on which the crystal vibration element 110 is installed, and a mounting surface that opposes the installation surface and is electrically connected to the outside.

Outer electrodes 134a, 134b, 134c and 134d are formed at the corners of the mounting surface of the second substrate 130. When the crystal vibration element 110 is mounted on the second substrate 130, the outer electrode 134a is electrically connected to the first excitation electrode 114a via the connection electrode 116a and the extension electrode 115a. In this way, the outer electrode 134b is electrically connected to the second excitation electrode 114b via the connection electrode 116b and the extension electrode 115b. The remaining outer electrodes 134c and 134d are dummy electrodes that are not electrically connected to either of the first and second excitation electrodes 114a and 114b. The details of the dummy electrodes are the same as already described.

Although the outer electrodes 134a and 134b, which are electrically connected to the first and second excitation electrodes 114a and 114b, are arranged at opposite corners of the second substrate 130 in the example illustrated in FIG. 15, the outer electrodes 134a and 134b are not limited to this arrangement and may instead be arranged at other corners. In addition, in the case where cylindrical-curved-surface-shaped notched side surfaces are formed at the corners of the second substrate 130, the outer electrodes may extend from the mounting surface of the second substrate 130 so as to reach the notched side surfaces in the corresponding corners.

The outer electrodes 134a to 134d are formed of chromium (Cr) and gold (Au), for example. A sputtering method or a plating method may be used as a method to form the electrodes. Although a four-terminal structure made up of four outer electrodes is described in this embodiment, the number of outer electrodes is not particularly limited, and a two-terminal structure made up of two outer electrodes may be used, for example.

The first and second substrates 120 and 130 are planar substrates. In addition, the first and second substrates 120 and 130 may be formed of a glass material (for example, a material having silicate glass as a main component or a material having a main component other than silicate, and exhibiting a glass transition phenomenon with an increase in temperature), or may be formed of the same crystal material as the crystal vibration element 110 (for example, AT-cut crystal).

As illustrated in FIGS. 15 and 16, the first substrate 120 is bonded to the entire periphery of the first surface 111a of the frame body 104 via a first bonding material 140, and the second substrate 130 is bonded to the entire periphery of the second surface 111b of the frame body 104 via a second bonding material 142. The crystal piece 102 is hermetically sealed in an internal space (cavity) 123 as a result of the first and second bonding materials 140 and 142 being provided along the entire peripheries of the surfaces of the frame body 104. It is sufficient that the first and second bonding materials 140 and 142 be able to bond bonding surfaces of the respective members and form an internal space, and the materials of the first and second bonding materials 140 and 142 are not limited. The first and second bonding materials 140 and 142 may be formed of a glass adhesive material such as a low-melting-point glass (for example, a lead boric acid based or phosphoric acid based glass), or an resin adhesive may be used.

The content described in the first embodiment above (refer to FIGS. 1 to 14) may be applied to the configurations of the crystal piece 102, the first excitation electrode 114a and the second excitation electrode 114b of the crystal vibration element 110 according to this embodiment. With the crystal vibrator 2 according to this embodiment, excellent vibration characteristics can be obtained as a result of a full-width thickness shear mode being generated along the Z' axis direction of the crystal piece 102.

Third Embodiment

Figure 17:
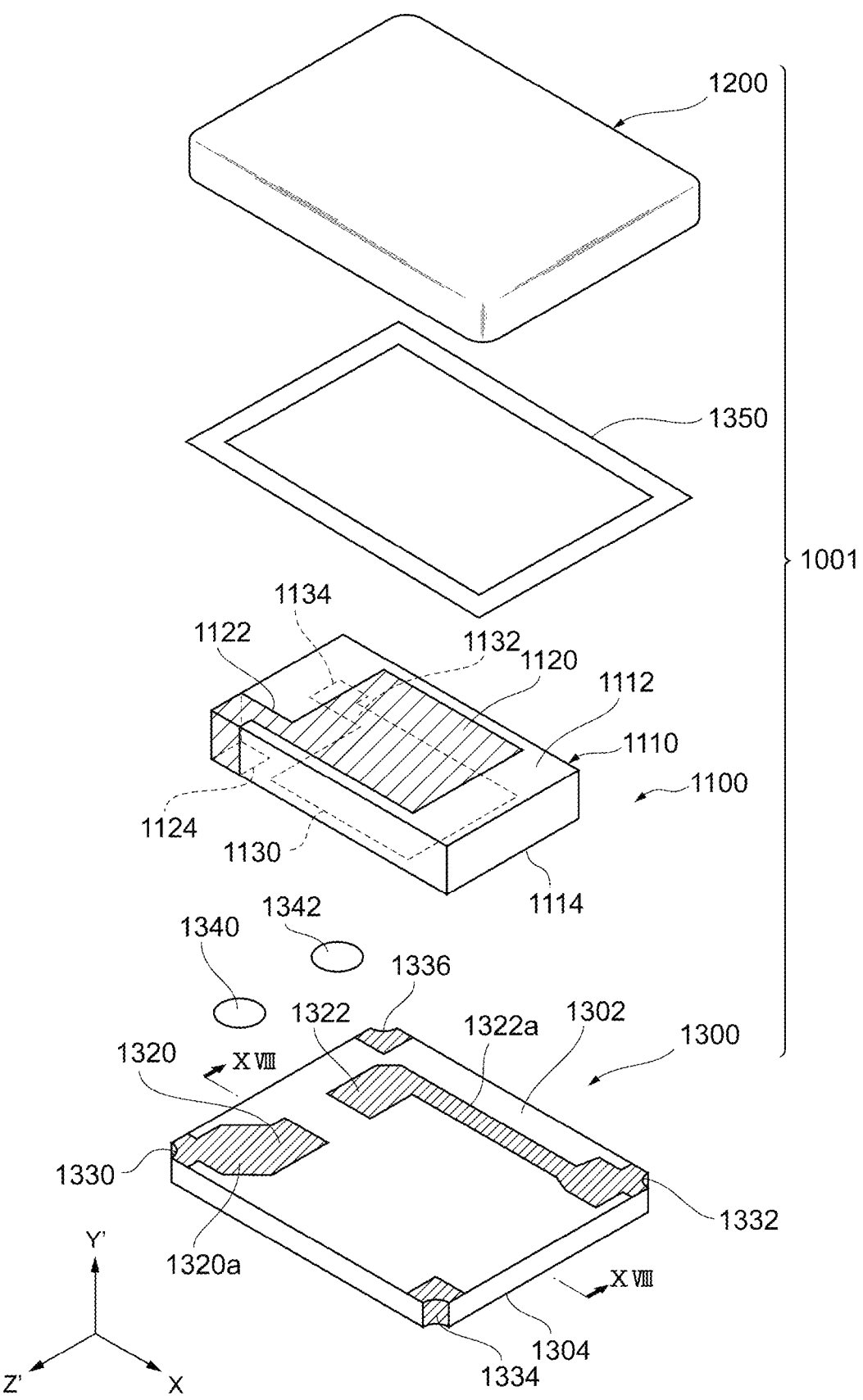
FIG. 17 is an exploded perspective view of a crystal vibrator according to a third embodiment of the present invention.
Figure 18:
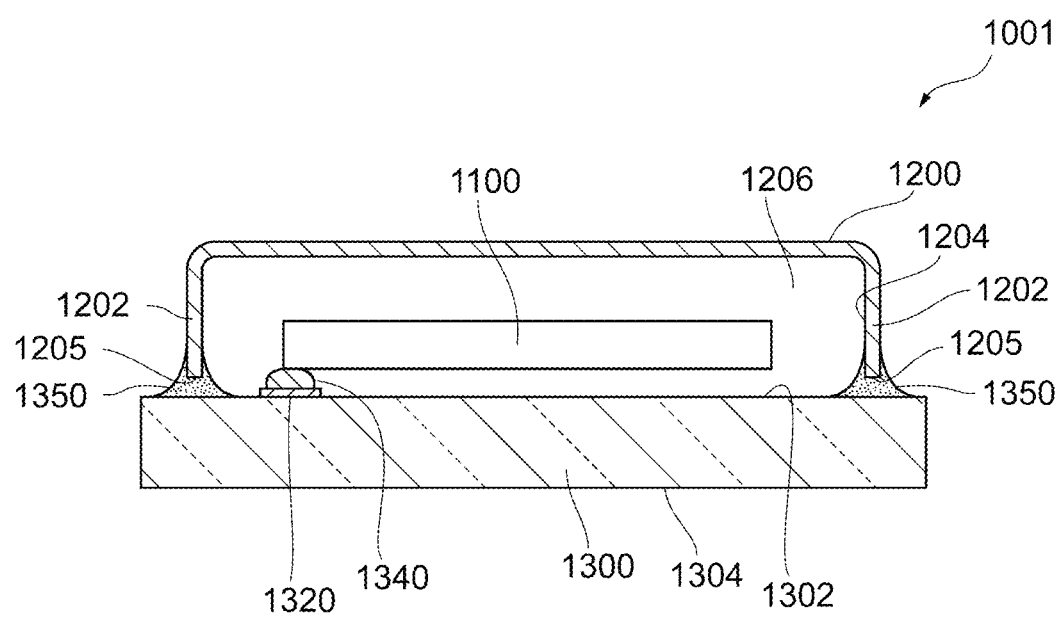
FIG. 18 is a sectional view taken along line XVIII-XVIII in FIG. 17.

A crystal vibrator according to an embodiment of the present invention will be described while referring to FIGS. 17 and 18. Here, FIG. 17 is an exploded perspective view of the crystal vibrator, and FIG. 18 is a sectional view taken along line XVIII-XVIII in FIG. 17. Illustration of various electrodes of a crystal vibration element is omitted from FIG. 18.

Hereafter, the configuration of the crystal vibrator according to this embodiment will be described. Unless whatever is described hereafter contradicts the content described in embodiments 1 and 2, the content described in embodiments 1 and 2 may be selectively applied as appropriate.

As illustrated in FIG. 17, a crystal vibrator 1001 according to this embodiment includes a crystal vibration element 1100, a cap 1200 and a substrate 1300. The cap 1200 and the substrate 1300 form a holder (case or package) that accommodates the crystal vibration element 1100.

The crystal vibration element 1100 includes a crystal piece 1110, and excitation electrodes 1120 and 1130 (hereafter, also referred to as "first and second excitation electrodes 1120 and 1130") that are respectively provided on the front and rear surfaces of the crystal piece 1110. The first excitation electrode 1120 is provided on a first surface 1112 (front surface), which is a main surface, of the crystal piece 1110. The second excitation electrode 1130 is provided on a second surface 1114 (rear surface), which is a main surface that opposes the first surface 1112, of the crystal piece 1110.

Regarding the configuration of crystal piece 1110 in terms of the crystal structure, cut angle and so on, the content described for the crystal piece 11 in the first embodiment can be applied to the crystal piece 1110. In the example illustrated in FIG. 17, the crystal piece 1110 is an AT-cut crystal piece. The AT-cut crystal piece 1110 has long sides that are parallel to the X axis, short sides that are parallel to the Z' axis and a thickness that is parallel to the Y' axis. Hereafter, the long sides may be referred to as a longitudinal direction, the short sides may be referred to as a lateral direction, and the thickness may be referred to as a thickness direction. Furthermore, the AT-cut crystal piece 1110 has a rectangular shape when the XZ' plane is viewed in plan.

The crystal piece according to this embodiment is not limited to the above-described configuration, and for example, an AT-cut crystal piece having long sides that are parallel to the Z' axis and short sides that are parallel to the X axis direction may be used instead. Alternatively, provided that the main vibration is the thickness shear mode, the crystal piece may be a crystal piece having a different kind of cut from an AT cut such as a BT cut, for example.

The first excitation electrode 1120 is formed on the first surface 1112 (XZ' surface on positive Y' axis direction side) of the crystal piece 1110, and the second excitation electrode 1130 is formed on the second surface 1114 (XZ' surface on negative Y' axis direction side), which is on the opposite side from the first surface 1112, of the crystal piece 1110. The first and second excitation electrodes 1120 and 1130 are arranged as a pair of electrodes having the crystal piece 1110 interposed therebetween so as to be substantially entirely superposed with each other when the XZ' plane is viewed in plan. The first and second excitation electrodes 1120 and 1130 have a rectangular shape in the XZ' plane. In addition, the first and second excitation electrodes are provided such that the long sides of the excitation electrodes are parallel to the long sides of the crystal piece 1110, and the short sides of the excitation electrodes are parallel to the short sides of the crystal piece 1110. The details of the configurations of the crystal piece 1110 and the excitation electrodes 1120 and 1130 will be described later.

A connection electrode 1124 that is electrically connected to the first excitation electrode 1120 via an extension electrode 1122, and a connection electrode 1134 that is electrically connected to the second excitation electrode 1130 via an extension electrode 1132 are formed on the crystal piece 1110. Specifically, the extension electrode 1122 extends from the first excitation electrode 1120 toward the short side on the negative X axis direction side on the first surface 1112, passes along a side surface of the crystal piece 1110 on the negative X axis direction side and is connected to the connection electrode 1124 formed on the second surface 1114. The extension electrode 1132 extends from the second excitation electrode 1130 toward the short side on the negative X axis direction side on the second surface 1114, and is connected to the connection electrode 1134 formed on the second surface 1114. The connection electrodes 1124 and 1134 are arranged along the short side on the negative X axis direction side, and the connection electrodes 1124 and 1134 are electrically connected to and mechanically held by the substrate 1300 via conductive holding members 1340 and 1342, which will be described later. In this embodiment, the connection electrodes 1124 and 1134 and the extension electrodes 1122 and 1132 are not limited to these arrangements and pattern shapes, and can be changed as appropriate by considering the electrical connections between these electrodes and other members.

The first and second excitation electrodes 1120 and 1130, the extension electrodes 1122 and 1132, and the connection electrodes 1124 and 1134 may for example be formed by forming a chromium (Cr) layer as a base layer and forming a gold (Au) layer on the surface of the chromium layer, but the electrodes are not limited to these materials.

As illustrated in FIG. 18, the cap 1200 has a recess 1204 that opens toward a first surface 1302 of the substrate 1300. The recess 1204 is provided with a side wall portion 1202 that is formed so as to stand upright from a bottom surface of the recess 1204 along the entire periphery of the opening of the recess 1204, and the side wall portion 1202 has an end surface 1205 that faces the first surface 1302 of the substrate 1300.

The material of the cap 1200 is not particularly limited, and may be formed of a metal, for example. Thus, a shielding function can be added by electrically connecting the cap 1200 to the ground potential. Alternatively, the cap 1200 may be formed of an insulating material or may have a composite structure made up of a metal and an insulating material.

As a modification, the cap 1200 may have a flange portion that protrudes from the side wall portion 1202 in a direction away from the opening. Thus, since the area of the bond between the cap 1200 and the substrate 1300 can be increased by bonding the flange portion and the substrate 1300 to each other, it is possible to improve the strength of the bond between the cap 1200 and the substrate 1300.

The crystal vibration element 1100 is mounted on the first surface 1302 (upper surface) of the substrate 1300. In the example illustrated in FIG. 17, the substrate 1300 has long sides that are parallel to the X axis, short sides that are parallel to the Z' axis, and a thickness that is parallel to the Y' axis, and has a rectangular shape in the XZ' plane. The substrate 1300 may be formed of an insulating ceramic for example, and may be formed by stacking a plurality of insulating ceramic sheets on top of one another and then firing the insulating ceramic sheets. Alternatively, the substrate 1300 may be formed of a glass material, a crystal material or a glass epoxy resin, for example. The substrate 1300 is preferably formed of a heat-resistant material. The substrate 1300 may be formed of a single layer or a plurality of layers, and in the case where the substrate 1300 is formed of a plurality of layers, an insulating layer may be formed as the uppermost layer that forms the first surface 1302. Furthermore, the substrate 1300 may have a flat-plate shape, or may have a concave shape that opens in a direction so to face the cap 1200. As illustrated in FIG. 15, the cap 1200 and the substrate 1300 are bonded to each other via a bonding material 1350, and as a result, the crystal vibration element 1100 is hermetically sealed in an internal space (cavity) 1206 enclosed by the recess 1204 of the cap 1200 and the substrate 1300.

The bonding material 1350 is provided along the entire peripheries of the cap 1200 and the substrate 1300, and is interposed between the end surface 1205 of the side wall portion 1202 of the cap 1200 and the first surface 1302 of the substrate 1300. The bonding material 1350 is composed of an insulating material. The insulating material may be a glass material (for example, a low-melting-point glass), or may be a resin material (for example, an epoxy resin), for example. Theses insulating materials have a low melting point and low cost compared with a metal material. Therefore, the heating temperature used in the step of bonding the cap 1200 and the substrate 1300 to each other by can be suppressed by using such an insulating material for the bonding material 1350, and a reduction in the cost of the crystal vibrator can be achieved.

In the example illustrated in FIG. 18, one end of the crystal vibration element 1100 (end portion on conductive holding members 1340 and 1342 side) is a fixed end, and the other end of the crystal vibration element 1100 is a free end. As a modification, the crystal vibration element 1100 may be fixed to the substrate 1300 at both ends thereof in the longitudinal direction.

As illustrated in FIG. 17, the substrate 1300 includes connection electrodes 1320 and 1322 that are formed on the first surface 1302, and extension electrodes 1320a and 1322a that extend from the connection electrodes 1320 and 1322 toward an outer edge of the first surface 1302. The connection electrodes 1320 and 1322 are arranged inside the outer edge of the substrate 1300 such that the crystal vibration element 1100 can be arranged substantially in the center of the first surface 1302 of the substrate 1300.

The connection electrode 1124 of the crystal vibration element 1100 is connected to the connection electrode 1320 via the conductive holding member 1340, and the connection electrode 1134 of the crystal vibration element 1100 is connected to the connection electrode 1322 via the conductive holding member 1342.

The extension electrode 1320a extends from the connection electrode 1320 to any corner of the substrate 1300, and the extension electrode 1322a extends from the connection electrode 1322 to another corner of the substrate 1300. In addition, a plurality of outer electrodes 1330, 1332, 1334 and 1336 are formed at the corners of the substrate 1300. In the example illustrated in FIG. 17, the extension electrode 1320a is connected to the outer electrode 1330 formed at the corner on the positive Z' axis direction side and negative X axis direction side, and the extension electrode 1322a is connected to the outer electrode 1332 formed at the corner on the negative Z' axis direction side and positive X axis direction side. In addition, as illustrated in FIG. 17, the outer electrodes 1334 and 1336 may be formed at the remaining corners. These outer electrodes may be used as dummy electrodes as already described above. In this case, a shielding function may be added to the cap 1200 by electrically connecting the cap 1200, which is composed of a conductive material, to the outer electrodes 1334 and 1336 serving as dummy electrodes.

In the example illustrated in FIG. 17, the corners of the substrate 1300 each have a notched side surface that is formed by cutting away part of the corner to form a cylindrical curved surface shape, and the outer electrodes 1330, 1332, 1334 and 1336 are each formed so as to extend across the first surface 1302, the notched side surface and a second surface 1304 in a continuous manner. The corners of the substrate 1300 are not limited to having this shape, and the notched shape may be a planar shape, or the four corners may have a right-angle rectangular shape in plan view without having a notch.

The configurations of the connection electrodes, the extension electrodes and the outer electrodes of the substrate 1300 are not limited to the above-described examples and may be modified and used in various ways. For example, the connection electrodes 1320 and 1322 may be arranged on different sides of the first surface 1302 of the substrate 1300 such as one being formed on the positive X axis direction side and the other being formed on the negative X axis direction side. In this configuration, the crystal vibration element 1100 would be supported by the substrate 1300 at both one end and the other end thereof in the longitudinal direction. In addition, the content already described above can be applied to the number and arrangement of the outer electrodes, the presence/absence of dummy electrodes, and the form of the electrical connections between the outer electrodes and the connection electrodes.

In the crystal vibrator 1001 illustrated in FIG. 17, an alternating-current voltage is applied between the pair of first and second excitation electrodes 1120 and 1130 of the crystal vibration element 1100 via the outer electrodes 1330 and 1332, and as a result, the crystal piece 1110 undergoes vibration with the main vibration thereof being a thickness shear vibration, and resonance characteristics are obtained along with the vibration.

Figure 19:
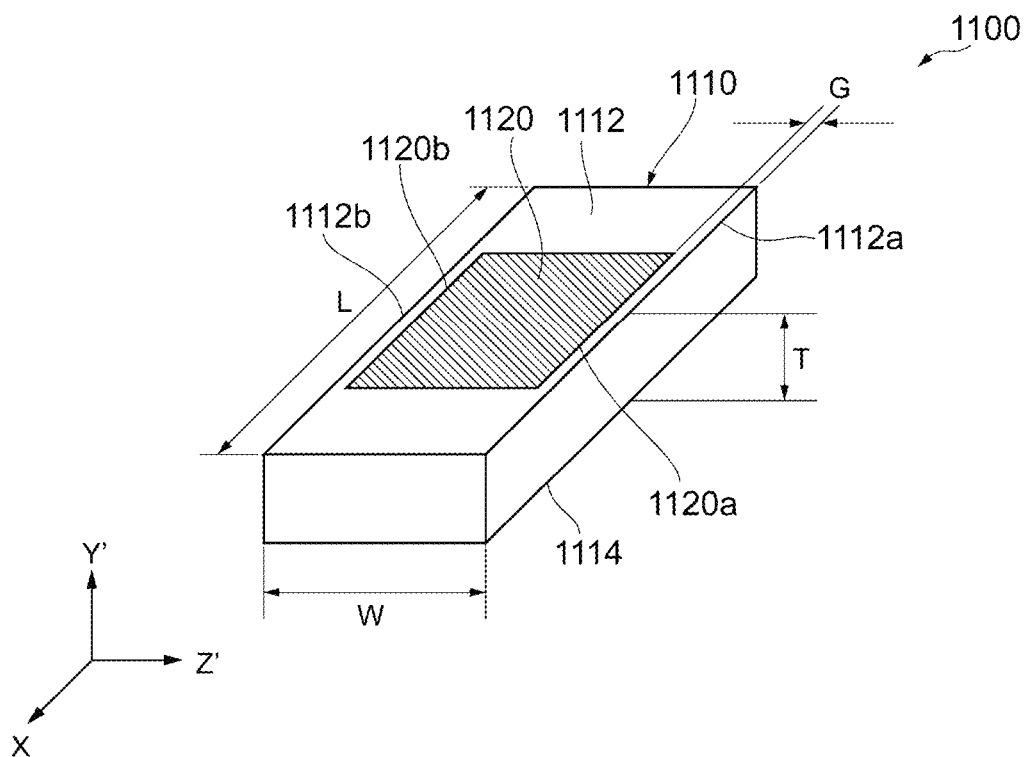
FIG. 19 is a perspective view of the crystal vibration element illustrated in FIG. 14.
Figure 20A:
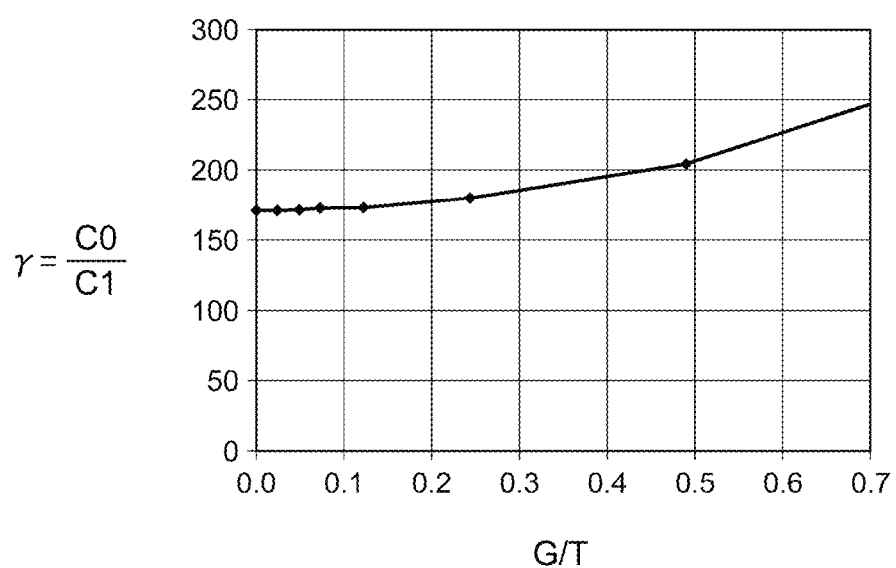
FIG. 20A is a graph for explaining the characteristics of a crystal vibration element according to the third embodiment of the present invention.
Figure 20B:
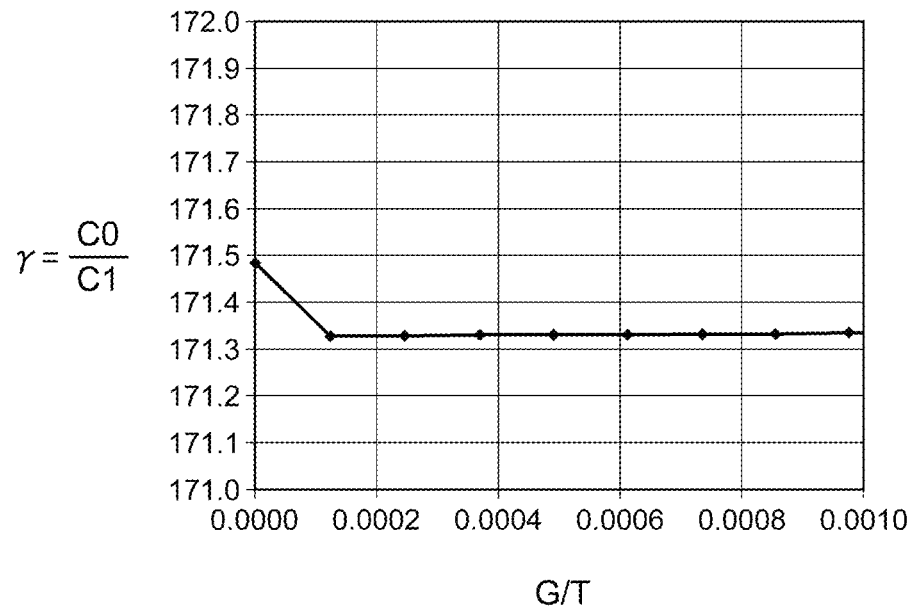
FIG. 20B is a graph for explaining the characteristics of the crystal vibration element according to the third embodiment of the present invention.
Figure 21:
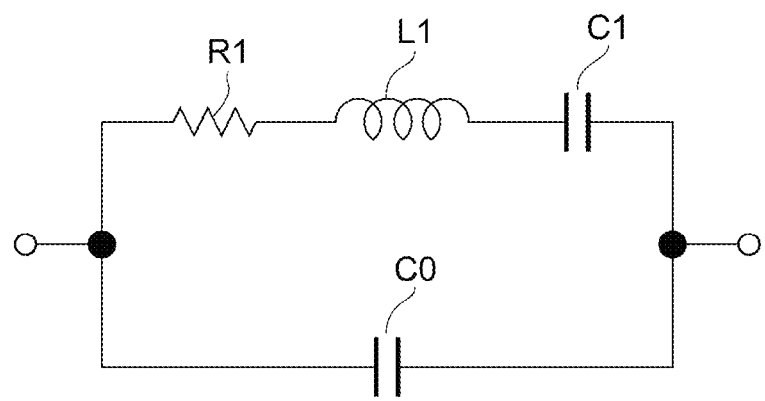
FIG. 21 is an equivalent circuit diagram of a crystal vibration element.

Next, the crystal vibration element illustrated in FIG. 17 will be described in more detail while referring to FIGS. 19 to 21. FIG. 19 illustrates the crystal piece and the excitation electrode on the first surface thereof of the crystal vibration element illustrated in FIG. 17 (illustration of the extension electrodes and the connection electrodes is omitted for ease of description). FIGS. 20A and 20B are graphs for describing the characteristics of the crystal vibration element. FIG. 21 is an equivalent circuit diagram of the crystal vibration element.

As illustrated in FIG. 19, a long side 1120a of the excitation electrode 1120 on the positive Z' axis direction side is parallel to a long side 1112a of the crystal piece 1110 on the positive Z' axis direction side, and the crystal vibration element has a relation of $0.0002 \leq G/T \leq 0.5$, where G is the distance between the long side 1120a of the excitation electrode 1120 and the long side 1112a of the crystal piece 1110, and T is the thickness of the crystal piece 1110 between the excitation electrodes 1120 and 1130. In other words, the long side 1120a of the excitation electrode 1120 is spaced apart from the long side 1112a of the crystal piece 1110 toward the inside by the distance and this distance G has a relational formula with respect to the thickness T of the crystal piece 1110.

Thus, since there is a risk of the quality of the material changing due to the sides of the main surfaces of the crystal piece 1110 being likely to be damaged during the manufacturing process, degradation of the vibration characteristics caused by such damage can be suppressed by setting a lower limit for the above relational formula. On the other hand, if the distance G is made too large, a wasted area that does not contribute to vibration increases, and therefore an effective area is secured for the excitation electrodes while facilitating size reduction of the crystal vibration element by setting an upper limit for the above relational formula.

In addition, it is clear that the crystal vibration element has excellent vibration characteristics when the capacitance ratio of an equivalent circuit of the crystal vibration element is small. In other words, as illustrated in FIG. 21, it is known that the frequency sensitivity of the crystal vibration element can be made high if the capacitance ratio $C0/C1=\gamma$ is small in an equivalent circuit of the crystal vibration element in which an equivalent series resistance R1, an equivalent series capacitance C1 and an equivalent series inductance L1 are connected in series with each other, and an equivalent parallel capacitance C0 is connected in parallel with the series circuit.

Regarding this point, if we look at the relationship between G/T and the capacitance ratio γ using FIGS. 20A and 20B, it is clear that there is a critical point where the rate of increase of the capacitance ratio γ becomes high at around G/T=0.5 as illustrated in FIG. 20A, and that the capacitance ratio γ varies and becomes large when G/T is less than 0.0002 and in the vicinity of 0.0001 as illustrated in FIG. 20B (range of FIG. 20A illustrated where G/T is close to zero). In other words, it is clear that the capacitance ratio γ can be made small as a result of G/T having the above relational formula. The frequency sensitivity of the crystal vibration element can be made high by making the capacitance ratio γ small, and excellent vibration characteristics can be obtained by improving frequency controllability of the crystal vibration element in this way. In addition, if the excitation electrode is provided with respect to the end surface of the crystal piece such that G/T is less than 0.0002, there is an effect that the shape of the end surface of the crystal piece becomes unstable in addition to the effect of variations in the capacitance ratio γ. Therefore, it preferable that the excitation electrode be provided on the crystal piece such that G/T is 0.0002 or higher.

Furthermore, as illustrated in FIG. 20A, from the fact that there is a critical point at which the rate of increase of the capacitance ratio γ increases at around G/T=0.2 (between 0.2 and 0.3), it is further preferable that the crystal vibration element have a relation of G/T 0.2.

In order to set the capacitance ratio γ to be small and stable, it is even more preferable that the crystal vibration element have a relation of $0.0002 \leq G/T \leq 0.2$.

The relational formula for G/T described above similarly applies to the relationship between a long side 1120b of the excitation electrode 1120 on the negative Z' axis direction side and a long side 1112b of the crystal piece 1110 on the negative Z' axis direction side. Furthermore, although the excitation electrode 1120 on the first surface 1112 of the crystal piece 1110 is described above, the description similarly applies to the long sides on the second surface 1114 side of the crystal piece 1110. The above relational formula is applied to the long sides of the crystal piece 1110 rather than the short sides of the crystal piece 1110 because there is a greater effect on the vibration characteristics of the crystal piece in the case where the distance to the long sides is relatively large.

In addition, the crystal piece 1110 may have a relation of W/T≤10.2, where W is the width of the short sides of the crystal piece 1110. Hereafter, the technical significance of this relational formula will be explained.

Figure 22A:
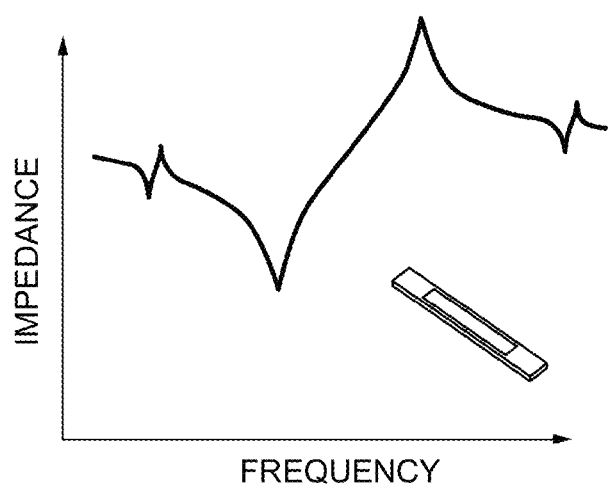
FIG. 22A is a graph for explaining the characteristics of the crystal vibration element according to the third embodiment of the present invention, and illustrates a case in which the width W of short sides of the crystal vibration element is small.
Figure 22B:
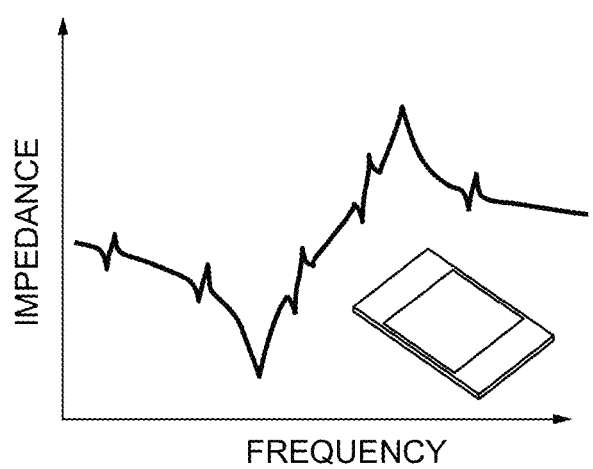
FIG. 22B is a graph for explaining the characteristics of the crystal vibration element according to the third embodiment of the present invention, and illustrates a case in which the width W of short sides of the crystal vibration element is large.

In the crystal vibration element, in addition to the main vibration, resonance is generated due to spurious (unwanted vibration) caused by the shape, dimensions and so on of the crystal vibration element. This resonance due to spurious appears as dips (troughs), which may be large or small, in the impedance curve. If such a dip is close to the main vibration, it is possible that the crystal vibration element will be adversely affected such as the oscillation frequency being shifted and the oscillation margin being reduced due to an increase in resonant resistance. Here, in a rectangular crystal vibration element such as the crystal vibration element of this embodiment, the spurious is a width vibration related to W/T where W is the width of the short sides and T is the thickness of the crystal piece, and a plurality of such vibrations exist as a plurality of modes of different orders. Such spurious is called width spurious. Looking at a case where the width spurious is close to the main vibration, when W is small, the frequency interval between the width spurious components is large as illustrated in FIG. 22A, and conversely, when W is large, the frequency interval between the width spurious components is small as illustrated in FIG. 22B. In addition, looking at variations that occur as the temperature changes, in an AT-cut crystal piece, the main vibration varies in the form of a cubic function as the temperature changes from 0° C. to 50° C. for example, and more specifically varies in a range of around 10 ppm, whereas the width spurious varies in the form of a linear function such that the value thereof becomes smaller and more specifically varies by around 1.0%. Variations in the main vibration can be relatively ignored when compared with the variations that occur in the width spurious with changes in temperature.

Figure 23:
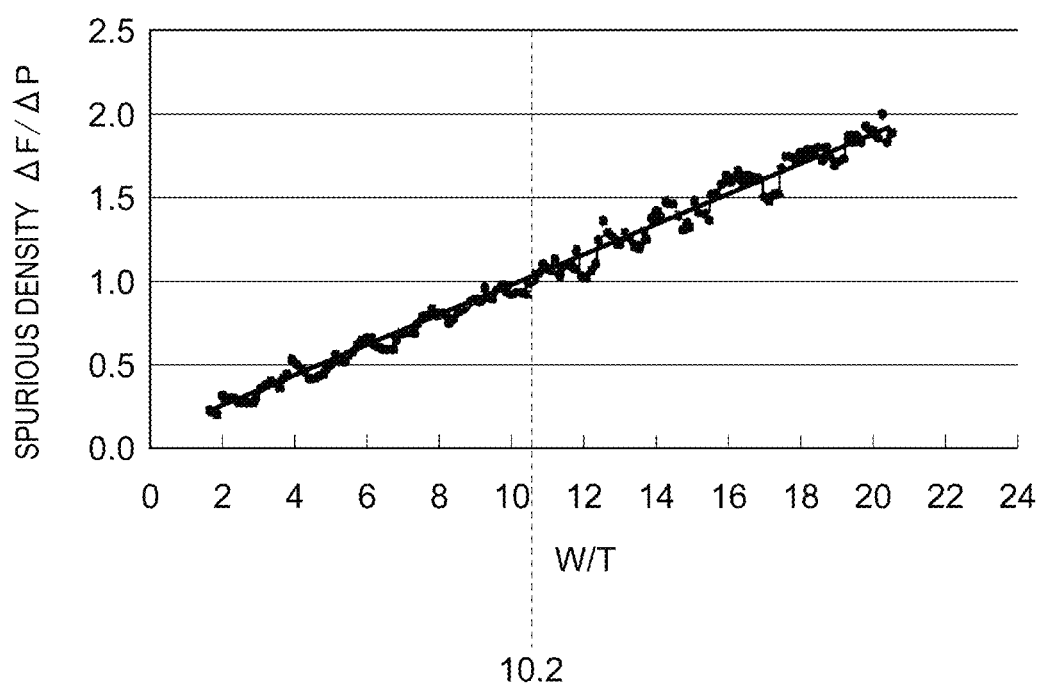
FIG. 23 is a graph for explaining the characteristics of the crystal vibration element according to the third embodiment of the present invention.

Referring to FIG. 23, values of W/T at which there is little effect on spurious vibration with changes in temperature will be described. Here, FIG. 23 is a graph in which the horizontal axis represents W/T and the vertical axis represents ΔF/ΔP (spurious density). The temperature is changed from 0° C. to 50° C., which is the main use temperature range of electronic devices.

FIG. 23 will be specifically described. First, using finite element analysis, the generation frequencies and number of width spurious components at frequencies around the main vibration was investigated by varying W/T at a normal temperature, and the average frequency interval ΔP (MHz) between adjacent spurious components was calculated. In addition, an analysis was performed by extracting W=430 (W/T=10.35) and a frequency of 37.4 MHz as one set of conditions, and varying the temperature from 0° C. to 50° C. From the results of the analysis, the amount of variation of a spurious component when the temperature was varied from 0° C. to 50° C. was calculated for ten width spurious components around the main vibration, and the average value ΔF (MHz) thereof was calculated. In other words, the frequency of a spurious component has a variation width ΔF for each value of W/T that depends on changes in temperature. If the frequency interval ΔP between two width spurious components between which the frequency of the main vibration is interposed is smaller than ΔF, it is possible that at least one of the adjacent width spurious components will cross over the main vibration with a change in temperature.

Thus, at each value of W/T, there is a high possibility that a width spurious component will unavoidably cross over the main vibration when the frequency interval ΔP between adjacent width spurious components is small with respect to ΔF, and depending on the case, there is also a possibility of a plurality of width spurious components crossing over the main vibration and of the characteristics being markedly degraded. Accordingly, as illustrated in FIG. 23, at ΔF/ΔP≤1, that is, the region of values of W/T smaller than the W/T at which the interval between two width spurious components that are adjacent to the main vibration matches the width of variation that occurs when the temperature is varied from 0° C. to 50° C. (that is, W/T≤10.2 as illustrated in FIG. 23), it is highly possible to design the crystal vibration element such that a width spurious component does not cross over the main vibration, and more specifically, such that the excitation frequency of the main vibration and the frequency of a width spurious component do not coincide with each other, and the smaller the value of W/T, the lower the risk of a spurious component crossing over the main vibration. The position of a spurious component can be varied somewhat by subjecting the crystal piece to beveling or convex machining. Consequently, in the range of W/T≤10.2, it is possible to further reduce the risk of a width spurious component crossing over the main vibration by making the width dimension smaller in a pseudo manner by subjecting the crystal piece to beveling or convex machining.

It is sufficient for the length L of the long sides of the crystal piece 1110 to be appropriately chosen in accordance with the desired vibration characteristics and so forth.

According to this embodiment, the above-described relationship between the distance G between the long side 1112a of the crystal piece 1110 and the long side 1120a of the excitation electrode 1120, and the thickness T of the crystal piece 1110 between the excitation electrodes 1120 and 1130 is satisfied, and therefore excellent vibration characteristics can be obtained as described above.

The present invention is not limited to the above-described embodiment and can be modified and used in various ways. In the following description, points that are different from the above-described content are described, and parts of the configuration that are the same as in the above-described content are denoted by the same symbols in the drawings.

Crystal vibration elements according to modifications of this embodiment will be described while referring to FIGS. 24 to 26. In each of the following modifications, the configuration of the crystal piece is different from the above-described content.

Figure 24:
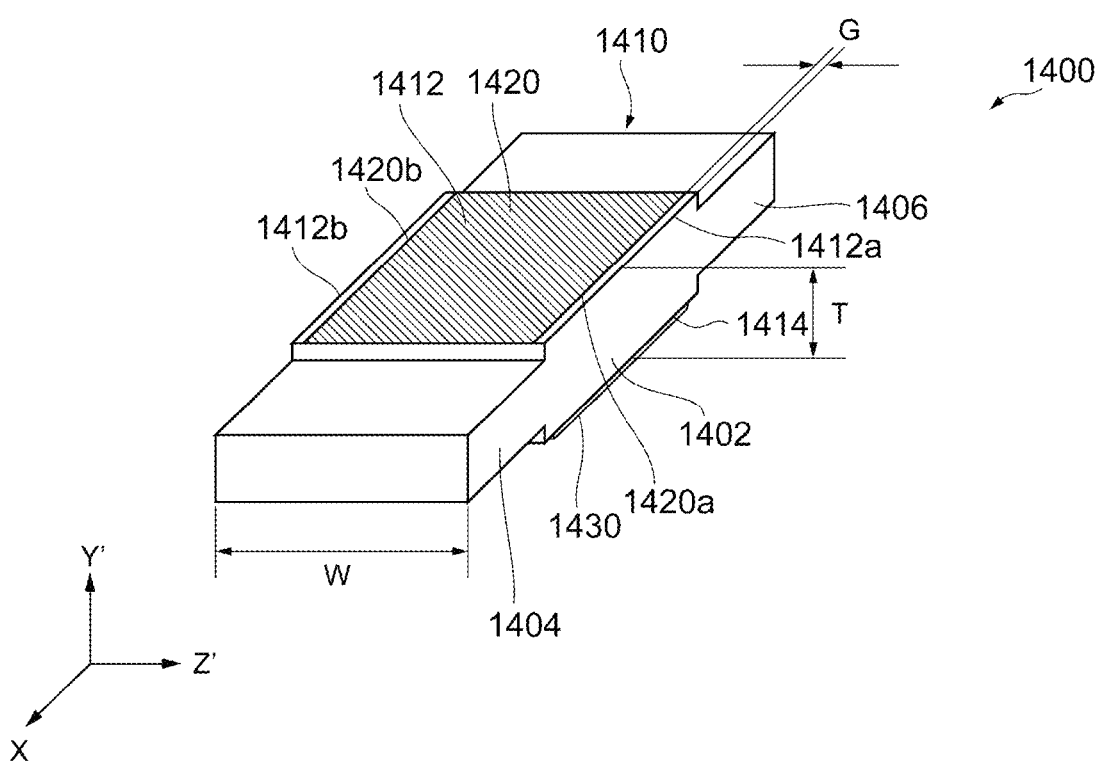
FIG. 24 is a perspective view of a crystal vibration element according to a first modification of the third embodiment of the present invention.

FIG. 24 is a drawing for describing a crystal vibration element according to a first modification, and this example includes a crystal piece having a so-called mesa structure in the longitudinal direction.

A crystal piece 1410 of a crystal vibration element 1400 according to this modification includes a vibration portion 1402 across which excitation electrodes 1420 and 1430 are superposed with each other, and thin end portions 1404 and 1406 that are connected to the vibration portion 1402 and are formed so as to be thinner than the vibration portion 1402. Similarly to as illustrated in FIG. 17, the crystal piece 1410 has long sides that are parallel to the X axis and short sides that are parallel to the Z' axis, and the thin end portions 1404 and 1406 are provided at the two ends of the crystal piece 1410 in the direction in which the long sides of the crystal piece 1410 extend. Furthermore, the excitation electrode 1420 is formed on a first surface 1412, which is one main surface, of the vibration portion 1402, and the excitation electrode 1430 is formed on a second surface 1414, which is another main surface, of the vibration portion 1402. The first and second surfaces 1412 and 1414 of the vibration portion 1402 are each formed in a rectangular shape that extends in a direction parallel to the X axis direction.

In this modification as well, a long side 1420*a* of the excitation electrode 1420 on the positive Z' axis direction side is parallel to a long side 1412*a* of the crystal piece 1410 on the positive Z' axis direction side, and the excitation electrode 1420 has the relational formula for G/T described above, where G is the distance between the long side 1420*a* of the excitation electrode 1420 and the long side 1412*a* of the crystal piece 1410, and T is the thickness of the crystal piece 1410 between the excitation electrodes 1420 and 1430. The relational formula for G/T similarly applies to the relationship between a long side 1420*b* of the excitation electrode 1420 on the negative Z' axis direction side and a long side 1412*b* of the crystal piece 1410 on the negative X axis direction side. In addition, the relational formula for G/T similarly applies to the long sides of the crystal piece 1410 on the excitation electrode 1430 side of the crystal piece 1410.

According to this modification, the crystal piece 1410 has the thin end portions 1404 and 1406 that are formed at the two ends of the crystal piece 1410 in the longitudinal direction so as to have a smaller thickness than the vibration portion 1402, and therefore, in addition to being able to obtain excellent vibration characteristics as described above, this modification also has operational effects that are characteristic of a mesa structure such as being excellent in terms of confinement of vibration energy.

Figure 25:
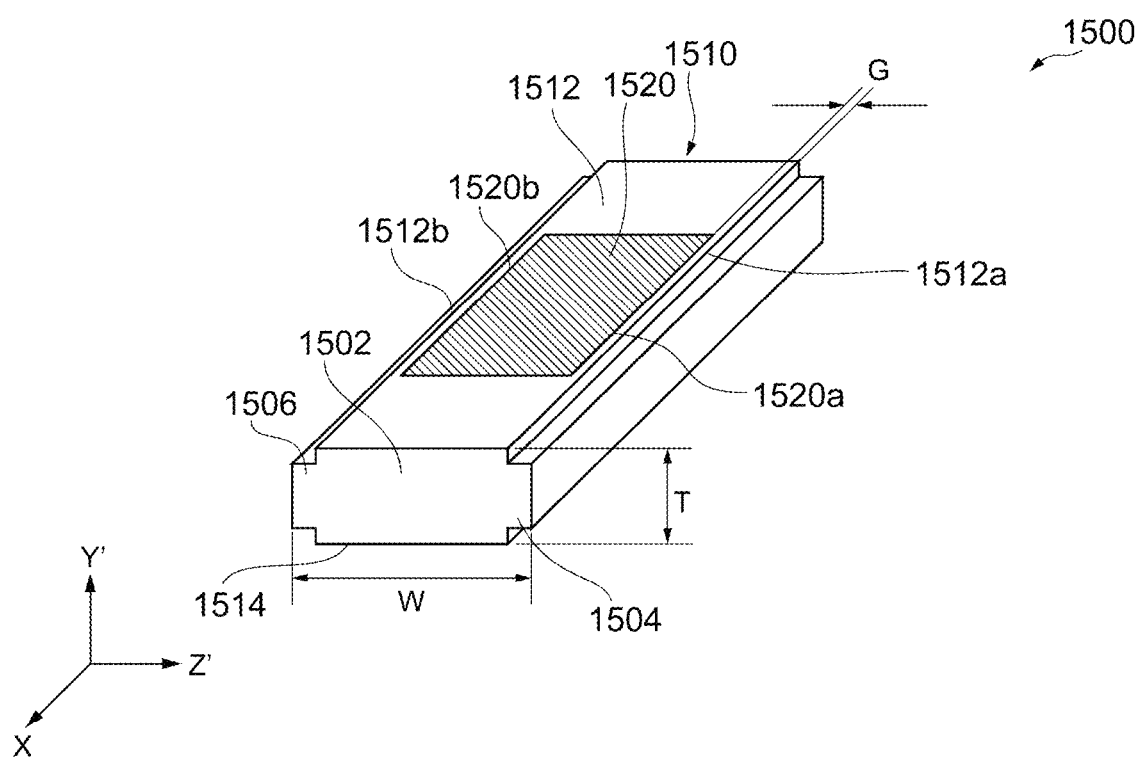
FIG. 25 is a perspective view of a crystal vibration element according to a second modification of the third embodiment of the present invention.

FIG. 25 is a drawing for describing a crystal vibration element according to a second modification, and this example includes a crystal piece having a so-called mesa structure in the lateral direction.

A crystal piece 1510 of a crystal vibration element 1500 according to this modification includes a vibration portion 1502 across which an excitation electrode 1520 and an excitation electrode on the negative Y' axis direction side, which is not illustrated, are superposed with each other, and thin end portions 1504 and 1506 that are connected to the vibration portion 1502 and are formed so as to thinner than the vibration portion 1502. Similarly to as illustrated in FIG. 17, the crystal piece 1510 has long sides that are parallel to the X axis and short sides that are parallel to the Z' axis, and the thin end portions 1504 and 1506 are provided at the two ends of the crystal piece 1510 in the direction in which the short sides of the crystal piece 1510 extend. In addition, the excitation electrode 1520 is formed on a first surface 1512, which is one main surface, of the vibration portion 1502, and an excitation electrode on the negative Y' axis direction side, which is not illustrated, is formed on a second surface 1514, which is another main surface, of the vibration portion 1502. The first and second surfaces 1512 and 1514 of the vibration portion 1502 are each formed in a rectangular shape that extends in a direction parallel to the X axis direction.

In this modification as well, a long side 1520*a* of the excitation electrode 1520 on the positive Z' axis direction side is parallel to a long side 1512*a* of the crystal piece 1510 on the positive Z' axis direction side, and the excitation electrode 1520 has the relational formula for G/T described above, where G is the distance between the long side 1520*a* of the excitation electrode 1520 and the long side 1512*a* of the crystal piece 1510, and T is the thickness of the crystal piece 1510 between the excitation electrodes. The relational formula for G/T similarly applies to the relationship between a long side 1520*b* of the excitation electrode 1520 on the negative Z' axis direction side and a long side 1512*b* of the crystal piece 1510 on the negative Z' axis direction side. In addition, the relational formula for G/T similarly applies to the long sides of the crystal piece 1510 on an excitation electrode 1530 side of the crystal piece 1510.

According to this modification, the crystal piece 1510 has the thin end portions 1504 and 1506 that are formed at the two ends of the crystal piece 1510 in the lateral direction so as to have a smaller thickness than the vibration portion 1502, and therefore, in addition to being able to obtain excellent vibration characteristics as described above, this modification also has operational effects that are characteristic of a mesa structure such as being excellent in terms of confinement of vibration energy.

A mesa structure is not limited to the forms illustrated in FIGS. 24 and 25, and a mesa structure obtained by combining the configurations illustrated in FIGS. 24 and 25 may be adopted, for example. Thus, the crystal piece can have thin end portions at both sides in the longitudinal direction and the lateral direction and can have the operational effects described for the forms illustrated in FIGS. 24 and 25.

Figure 26:
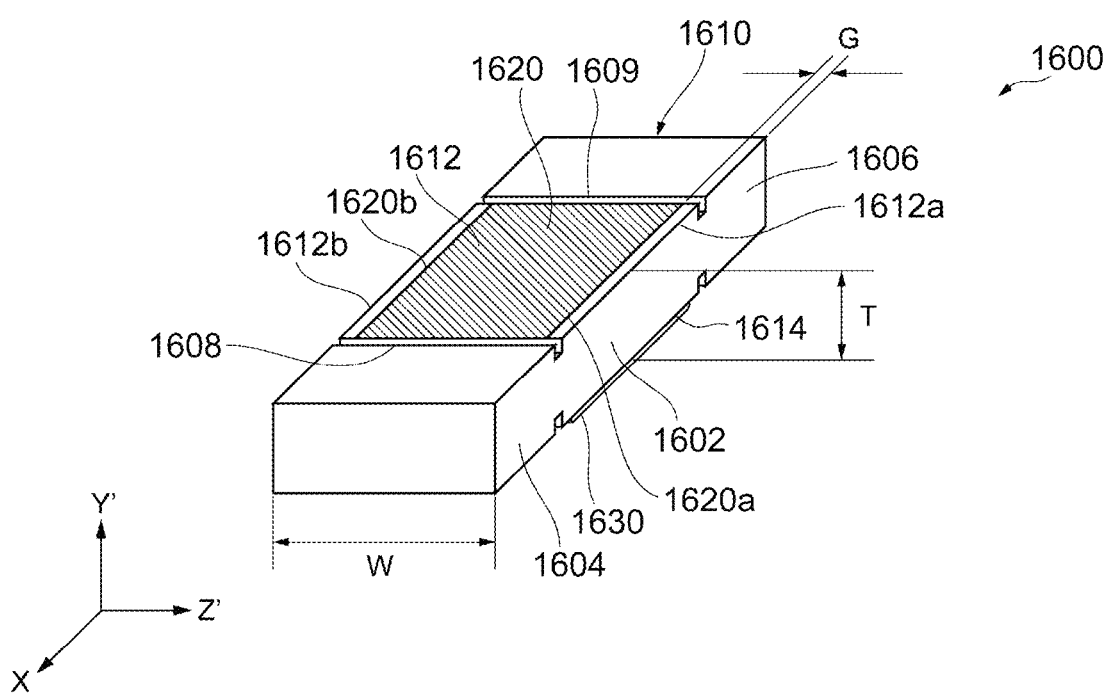
FIG. 26 is a perspective view of a crystal vibration element according to a third modification of the third embodiment of the present invention.

FIG. 26 is a drawing for describing a crystal vibration element according to a third modification, and in this example, grooves are formed between end portions and a vibration portion of the crystal piece.

A crystal piece 1610 of a crystal vibration element 1600 according to this modification is provided with an excitation electrode 1620 on a first surface 1612 thereof and an excitation electrode 1630 on a second surface 1614 thereof. The first and second excitation electrodes 1620 and 1630 are provided so as to be superposed with each other with the crystal piece 1610 interposed therebetween. The crystal piece 1610 has a vibration portion 1602 across which the first and second excitation electrodes 1620 and 1630 are superposed with each other. The crystal piece 1610 has long sides that are parallel to the X axis and short sides that are parallel to the Z' axis, similarly to the example illustrated in FIG. 17. A first end portion 1604 is provided on the positive X axis direction side in the direction in which the long sides of the crystal piece 1610 extend, and a second end portion 1606 on the negative X axis direction side, which the opposite side from the first end portion 1604. That is, the vibration portion 1602 is provided between the first end portion 1604 and the second end portion 1606.

In the example illustrated in FIG. 26, grooves 1608 and 1609 are respectively formed between the first end portion 1604 and the vibration portion 1602 and between the second end portion 1606 and the vibration portion 1602. These grooves 1608 and 1609 extend from one long side 1612*a* of the crystal piece 1610 to another long side 1612*b* of the crystal piece 1610. The grooves 1608 and 1609 are formed on the positive Y' direction side of the crystal piece 1610. As illustrated in FIG. 26, grooves may be similarly formed on the negative Y' direction side of the crystal piece 1610. The depth of the grooves 1608 and 1609 is not particularly limited and should be appropriately set in order to obtain the desired vibration characteristics. The cross sectional shapes of the grooves 1608 and 1609 in a direction perpendicular to the direction in which the grooves 1608 and 1609 extend are not particularly limited, and may be a recessed shape having a bottom surface as illustrated in FIG. 26, or may be a V shape formed of two inclined side surfaces. In addition, the grooves 1608 and 1609 may have cross sectional shapes that are uniform in the direction in which the grooves 1608 and 1609 extend as illustrated in FIG. 26, or the grooves 1608 and 1609 may have cross sectional shapes that vary, for example, have different groove widths.

The excitation electrode 1620 is formed on the first surface 1612, which is one main surface, of the vibration portion 1602, and the excitation electrode 1630 is formed on a second surface 1614, which is another main surface, of the vibration portion 1602. The first and second surfaces 1612 and 1614 of the vibration portion 1602 are each formed in a rectangular shape having long sides that are parallel to the X axis and short sides that are parallel to the Z' axis.

In this modification as well, a long side 1620*a* of the excitation electrode 1620 on the positive Z' axis direction side is parallel to the long side 1612*a* of the crystal piece 1610 on the positive Z' axis direction side, and the excitation electrode 1620 has the relational formula for G/T described above, where G is the distance between the long side 1620*a* of the excitation electrode 1620 and the long side 1612*a* of the crystal piece 1610, and T is the thickness of the crystal piece 1610 between the excitation electrodes 1620 and 1630. The relational formula for G/T similarly applies to the relationship between a long side 1620*b* of the excitation electrode 1620 on the negative Z' axis direction side and the long side 1612*b* of the crystal piece 1610 on the negative Z' axis direction side. In addition, the relational formula for G/T similarly applies to the long sides of the crystal piece 1610 on the excitation electrode 1630 side of the crystal piece 1610.

According to this modification, the grooves 1608 and 1609 are respectively formed between the first end portion 1604 and the vibration portion 1602 and between the second end portion 1606 and the vibration portion 1602, and therefore this modification exhibits the operational effects of a so-called mesa structure. In other words, in addition to being able to obtain excellent vibration characteristics as described above, this modification also has operational effects that are characteristic of a mesa structure such as being excellent in terms of vibration energy confinement.

In the example illustrated in FIG. 26, a configuration is described in which two grooves are formed on the positive Y' axis direction side, for example. However, the grooves are not limited to this configuration, and there may be one groove that extends in the direction of the short sides of the crystal piece. Alternatively, three or more grooves that extend in the direction of the short sides of the crystal piece may be arranged in the direction of the long sides of the crystal piece. As yet another configuration, for example, one wide groove may be formed between a first end portion and a second end portion of the crystal piece, and an excitation electrode may be formed on a bottom surface of the groove. In this case, the bottom surface of the groove on which the excitation electrode is formed is a main surface of a vibration portion.

The configuration according to this embodiment may have vibration characteristics generated by a full-width thickness shear mode as described in the first embodiment. In this case, in addition to the operational effects described in this embodiment, a uniform vibration can be obtained due to generation of a full-width thickness shear vibration as described in the first embodiment. Therefore, better vibration characteristics can be obtained.

In the above description, configurations in which the entirety of the crystal piece or constituent parts of the crystal piece have a substantially rectangular parallelepiped shape have been described, but the present invention is not limited to this configuration and can be applied to a shape having a thickness that gradually becomes smaller from a central portion thereof toward end portions thereof such as a beveled structure or a convex structure, for example. In this case, the thickness T can be applied to the thickest part (for example, portion at center of excitation electrodes) between the excitation electrodes.

The vibration distribution of the full-width thickness shear mode in the crystal piece in each embodiment is generated at both the front and rear surfaces of the crystal piece.

The dimensions, shapes, directions and so forth of each of the parts described above are not strictly required and the present invention includes equivalents thereto as understood by one skilled in the art.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, the elements included in the embodiments can be combined with each other as much as technically possible and such combined elements are also included in the scope of the present invention so long as the combined elements have the characteristics of the present invention.

REFERENCE SIGNS LIST

1 crystal vibrator
2 crystal vibrator
10 crystal vibration element
11 crystal piece
14*a* excitation electrode
14*b* excitation electrode
20 lid member
23 internal space
30 substrate
36*a* conductive holding member
36*b* conductive holding member
40 vibration region
50 non-vibration region

The invention claimed is:

1. A crystal vibration element comprising:
 a crystal piece that has rectangular opposed front and rear main surfaces; and
 a first rectangular excitation electrode on the front main surface of the crystal piece; and
 a second rectangular excitation electrode on the rear main surface of the crystal piece,
 wherein long sides of the excitation electrodes are parallel to opposing long sides of the crystal piece,
 $0 < G/T \leq 0.5$, where G is a distance between the long sides of the excitation electrodes and the opposing long sides of the crystal piece, and T is a thickness of the crystal piece between the excitation electrodes, and
 the crystal vibration element has a thickness shear vibration as a main vibration thereof.

2. The crystal vibration element according to claim 1, wherein $0 \leq G/T \leq 0.2$.

3. The crystal vibration element according to claim 1, wherein $0.0002 \leq G/T \leq 0.5$.

4. The crystal vibration element according to claim 1, wherein W/T≤10.2, where W is a width of short sides of the crystal piece.

5. The crystal vibration element according to claim 1, wherein the crystal piece includes
- a vibration portion across which the excitation electrodes are superposed with each other, and
- end portions connected to the vibration portion and which are thinner than the vibration portion, and
- the long sides of the crystal piece extend in a same direction as long sides of the end portions.

6. The crystal vibration element according to claim 5, wherein the end portions are located at opposed ends of the crystal piece in a longitudinal direction of the crystal piece.

7. The crystal vibration element according to claim 5, wherein the end portions are located at opposed ends of the crystal piece in a lateral direction of the crystal piece.

8. The crystal vibration element according to claim 1, wherein the crystal piece includes
- a first end portion that is located at a first end of the crystal piece in the longitudinal direction,
- a second end portion that is located at a second end of the crystal piece in the longitudinal direction opposite the first end, and
- a vibration portion between the first end portion and the second end portion, and across which the excitation electrodes are superposed with each other, and
- a groove extending from a first long side of the crystal piece to a second long side of the crystal piece opposite the first long side and positioned between at least one of the first and second end portions and the vibration portion.

9. The crystal vibration element according to claim 1, wherein the crystal piece is an AT-cut crystal piece.

10. A crystal vibrator comprising:
- a substrate;
- a lid member that is connected to the substrate so as to form an internal space; and
- the crystal vibration element according to claim 1 accommodated in the internal space.

11. The crystal vibration element according to claim 1, wherein $0.0002 \leq G/T \leq 0.2$.

* * * * *

UNITED STATES PATENT AND TRADEMARK OFFICE
CERTIFICATE OF CORRECTION

PATENT NO. : 11,038,485 B2  
APPLICATION NO. : 15/943937  
DATED : June 15, 2021  
INVENTOR(S) : Toru Kidu et al.

Page 1 of 1

It is certified that error appears in the above-identified patent and that said Letters Patent is hereby corrected as shown below:

On the Title Page

Under item (30) Foreign Application Priority Data indicates:  
Oct. 8, 2015 (JP)................................JP2015-200232  
Apr. 27, 2016 (JP)...............................JP2016-089765

Should read as follows:  
Oct. 8, 2015 (JP)................................JP2015-200232  
Mar. 23, 2016 (JP)..............................JP2016-059077  
Apr. 27, 2016 (JP)...............................JP2016-089765

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*